United States Patent
Hong et al.

(10) Patent No.: US 12,191,205 B2
(45) Date of Patent: Jan. 7, 2025

(54) SEMICONDUCTOR DEVICE AND MANUFACTURING METHOD THEREOF

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Minghwei Hong, Hsinchu County (TW); Juei-Nai Kwo, Hsinchu County (TW); Tun-Wen Pi, Hsinchu County (TW); Hsien-Wen Wan, Kaohsiung (TW); Yi-Ting Cheng, Kaohsiung (TW); Yu-Jie Hong, New Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 485 days.

(21) Appl. No.: 17/685,845

(22) Filed: Mar. 3, 2022

(65) Prior Publication Data

US 2023/0011006 A1     Jan. 12, 2023

Related U.S. Application Data

(60) Provisional application No. 63/220,022, filed on Jul. 9, 2021.

(51) Int. Cl.
    *H01L 21/324*     (2006.01)
    *H01L 21/82*     (2006.01)
    (Continued)

(52) U.S. Cl.
    CPC .... *H01L 21/823412* (2013.01); *H01L 21/324* (2013.01); *H01L 29/0665* (2013.01);
    (Continued)

(58) Field of Classification Search
    CPC ........... H01L 21/324; H01L 21/823412; H01L 29/0665; H01L 29/1054; H01L 29/423392; H01L 29/66439; H01L 29/66545
    (Continued)

(56) References Cited

U.S. PATENT DOCUMENTS

| | | | |
|---|---|---|---|
| 6,891,226 B2 * | 5/2005 | Furukawa | ........... H01L 21/2807 257/E29.264 |
| 9,093,530 B2 | 7/2015 | Huang et al. | |

(Continued)

OTHER PUBLICATIONS

Kavrik et al., "Ultralow Defect Density at Sub-0.5 nm HfO$_2$/SiGe Interfaces via Selective Oxygen Scavenging," ACS Appl. Mater. Interfaces, vol. 10, 2018, pp. 30794-30802.

(Continued)

*Primary Examiner* — Monica D Harrison
(74) *Attorney, Agent, or Firm* — Birch, Stewart, Kolasch, & Birch, LLP

(57) ABSTRACT

A method includes forming a semiconductive channel layer on a substrate. A dummy gate is formed on the semiconductive channel layer. Gate spacers are formed on opposite sides of the dummy gate. The dummy gate is removed to form a gate trench between the gate spacers, resulting in the semiconductive channel layer exposed in the gate trench. A semiconductive protection layer is deposited in the gate trench and on the exposed semiconductive channel layer. A top portion of the semiconductive protection layer is oxidized to form an oxidation layer over a remaining portion of the semiconductive protection layer. The oxidation layer is annealed after the top portion of the semiconductive protection layer is oxidized. A gate structure is formed over the semiconductive protection layer and in the gate trench after the oxidation layer is annealed.

20 Claims, 39 Drawing Sheets

(51) Int. Cl.
*H01L 21/8234* (2006.01)
*H01L 29/06* (2006.01)
*H01L 29/10* (2006.01)
*H01L 29/423* (2006.01)
*H01L 29/66* (2006.01)
*H01L 29/786* (2006.01)

(52) U.S. Cl.
CPC .... *H01L 29/1054* (2013.01); *H01L 29/42392* (2013.01); *H01L 29/66439* (2013.01); *H01L 29/66545* (2013.01); *H01L 29/66742* (2013.01); *H01L 29/78696* (2013.01)

(58) Field of Classification Search
USPC .......................................................... 438/478
See application file for complete search history.

(56) References Cited

U.S. PATENT DOCUMENTS

| | | | |
|---|---|---|---|
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,595,449 | B1 | 3/2017 | Jagannathan et al. |
| 9,601,342 | B2 | 3/2017 | Lee et al. |
| 9,608,116 | B2 | 3/2017 | Ching et al. |
| 11,444,179 | B2 * | 9/2022 | Wu ..................... H01L 21/7624 |

OTHER PUBLICATIONS

Lee et al., "Selective $GeO_x$-Scavenging from Interfacial Layer on $Si_{1-x}Ge_x$ Channel for High Mobility $Si/Si_{1-x}Ge_x$ CMOS Application," Symposium on VLSI Technology Digest of Technical Papers, IEEE, 2016, total 2 pages.

Loo et al., "Editors' Choice-Epitaxial CVD Growth of Ultra-Thin Si Passivation Layers on Strained Ge Fin Structures," ECS Journal of Solid State Science and Technology, vol. 7, No. 2, 2018, pp. 66-72 (total 8 pages).

Vincent et al., "Influence of Si precursor on Ge segregation during ultrathin Si reduced pressure chemical vapor deposition on Ge," Applied Physics Letters, vol. 95, No. 26, 2009, total 4 pages.

* cited by examiner

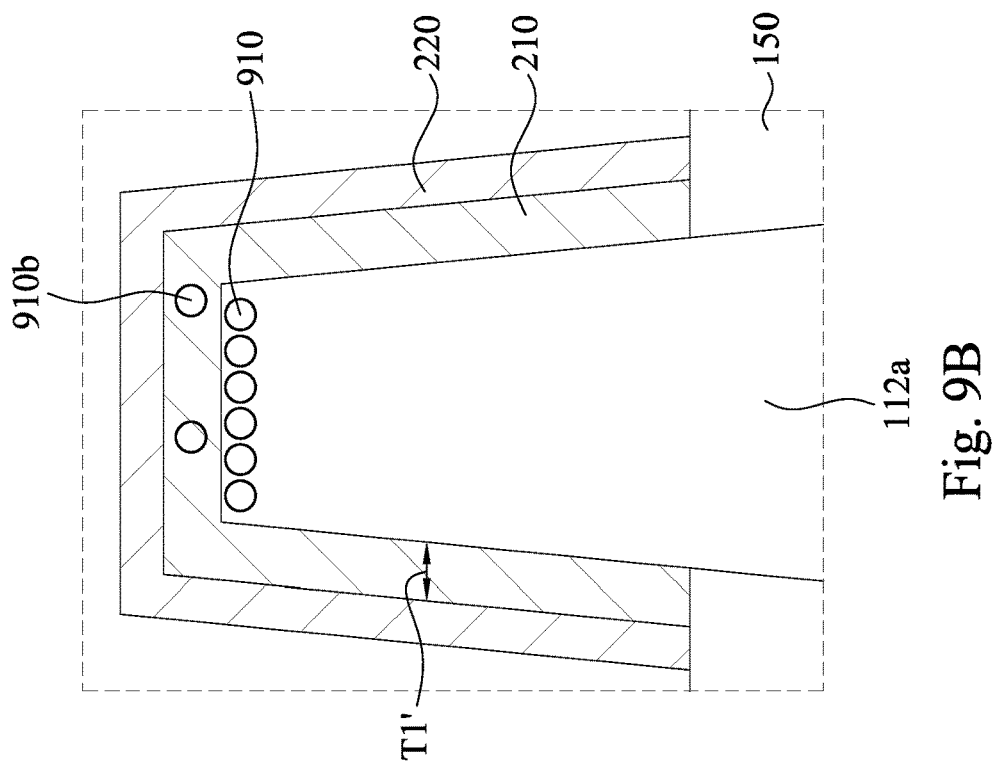
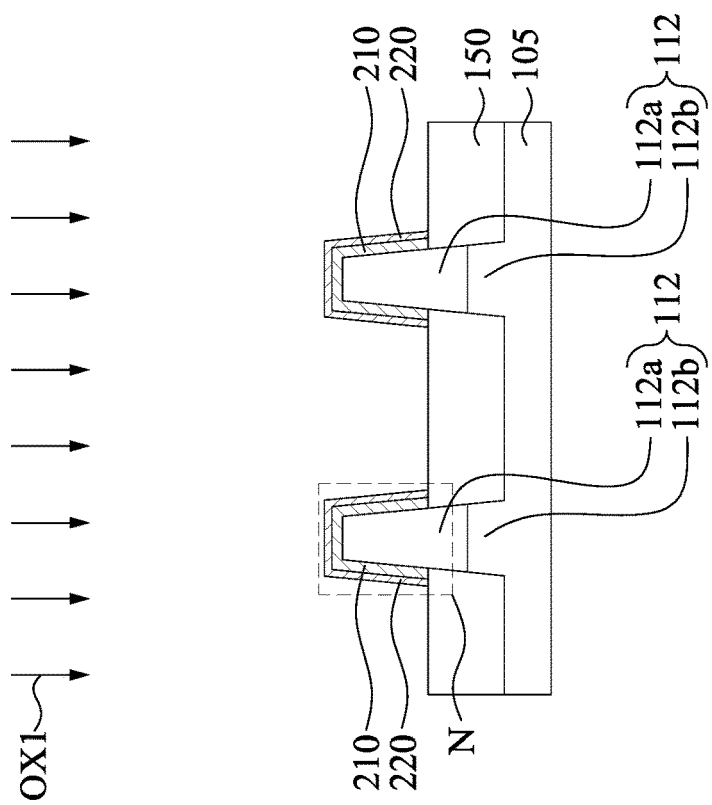
Fig. 9B
Fig. 9A

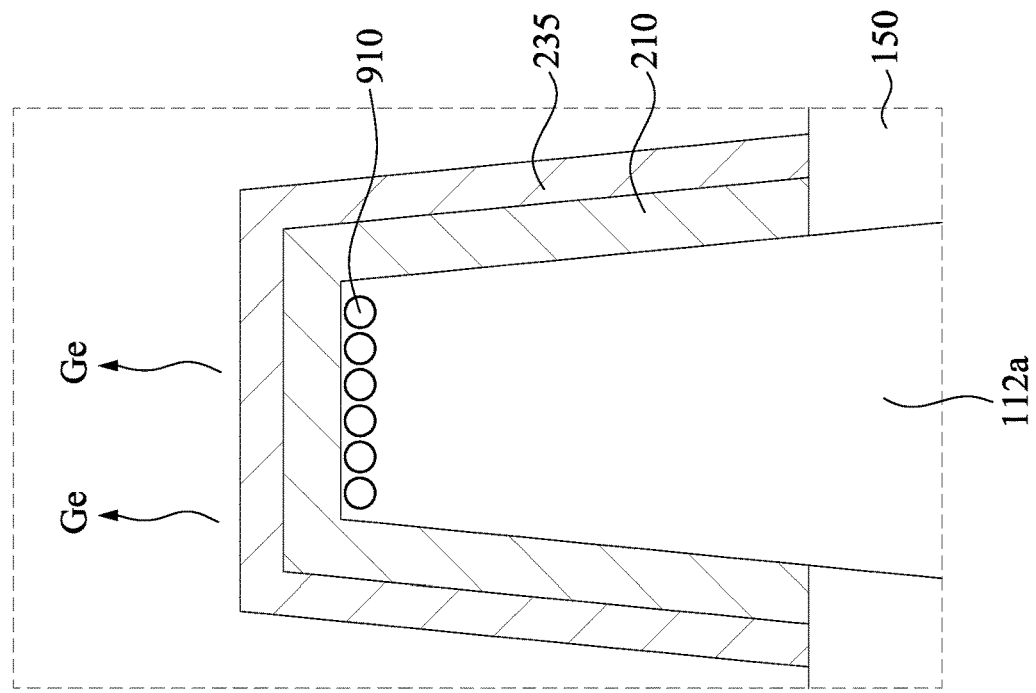
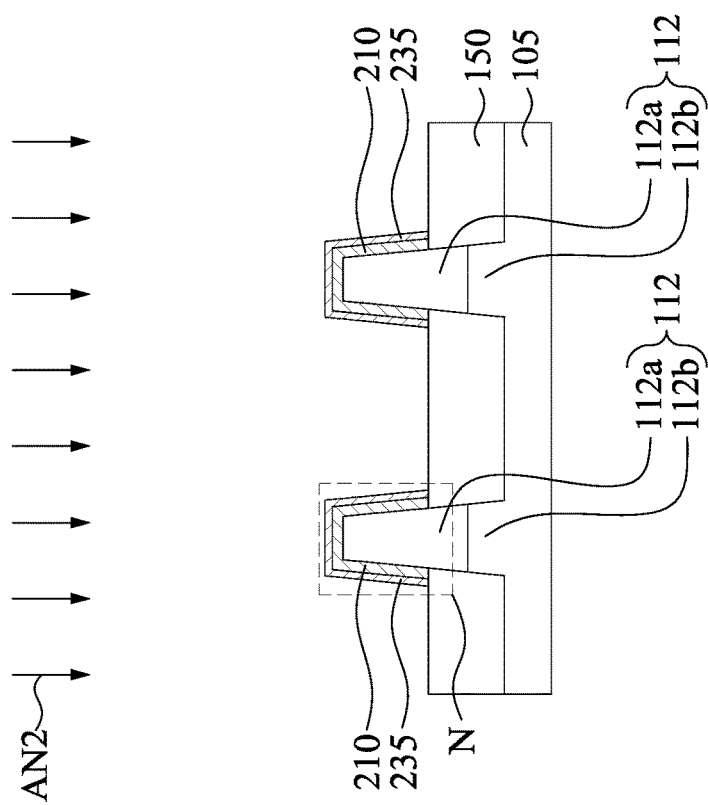
Fig. 12B
Fig. 12A

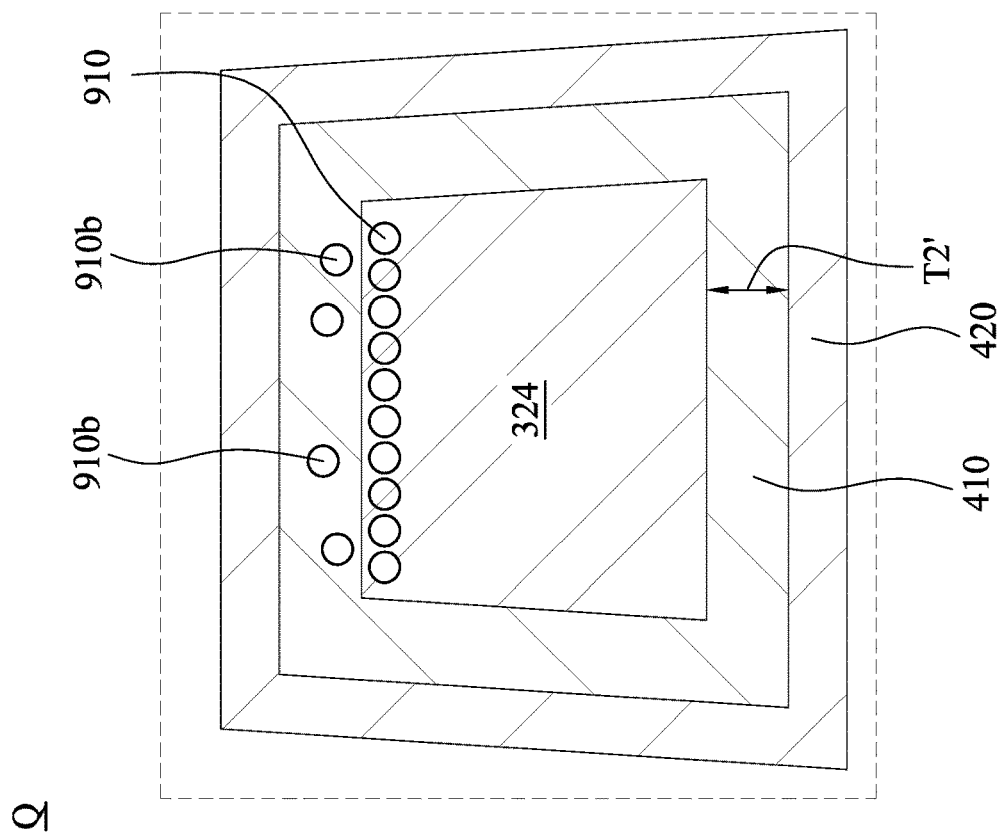
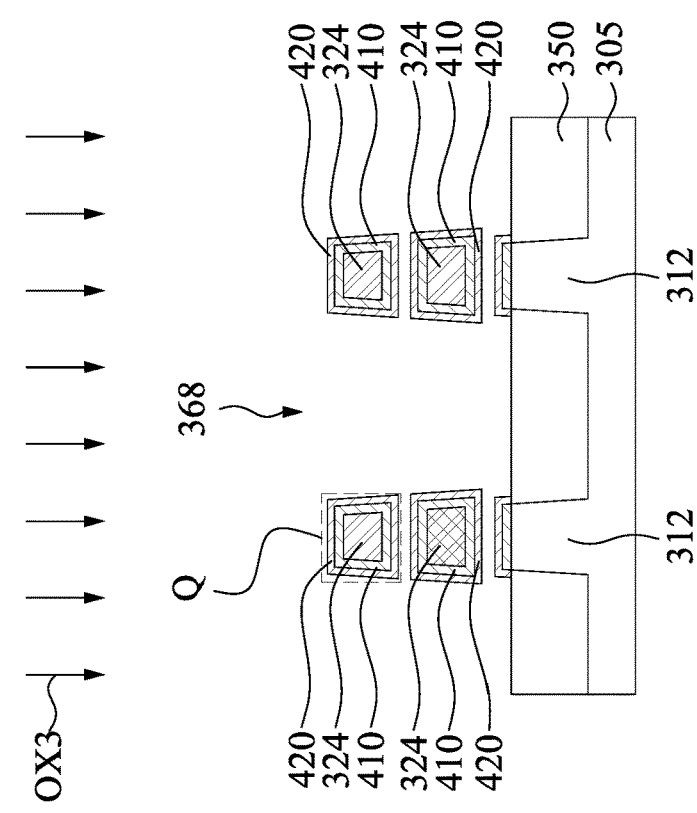
Fig. 24B
Fig. 24A

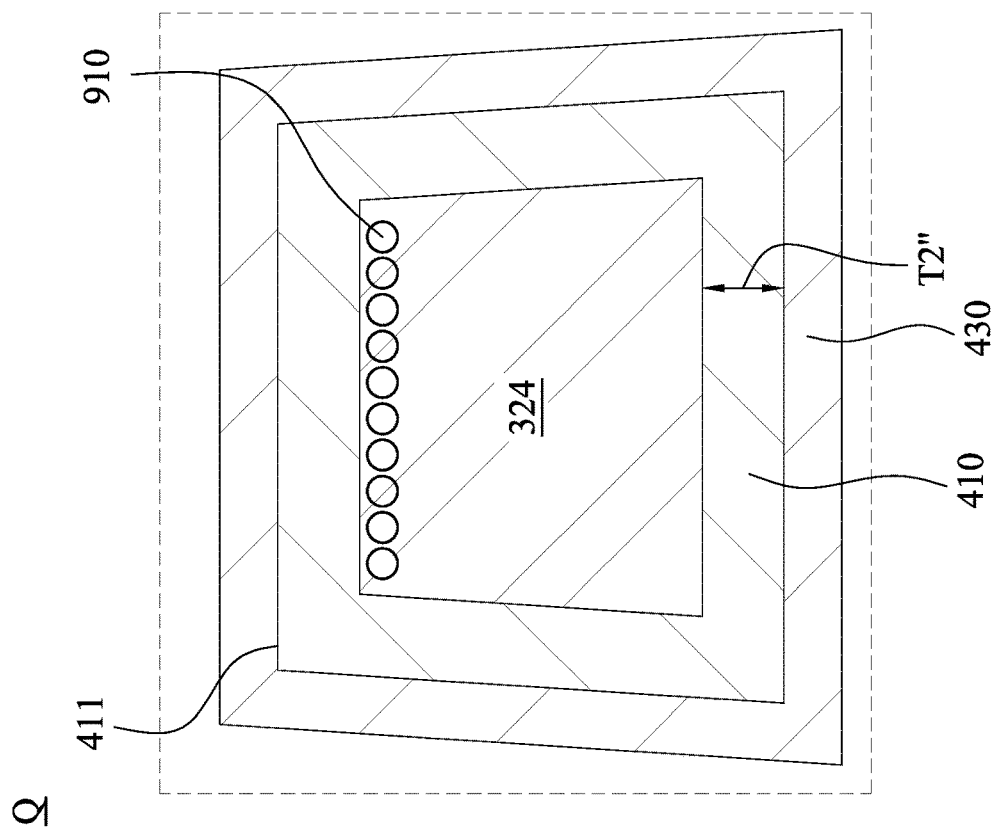
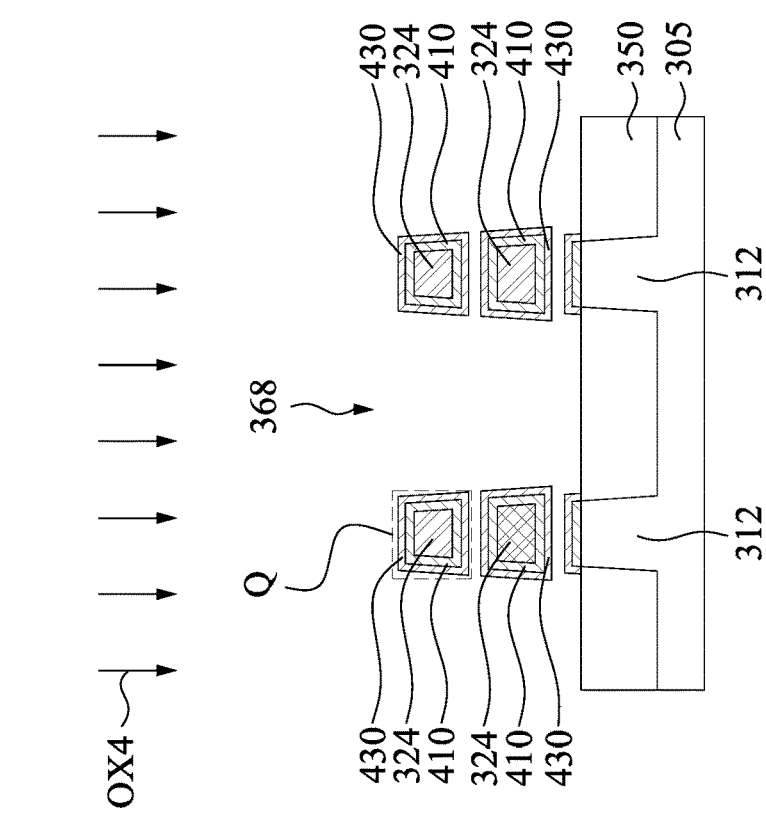
Fig. 26B
Fig. 26A

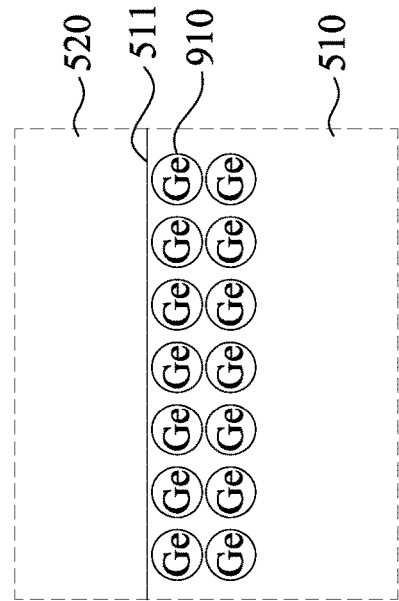
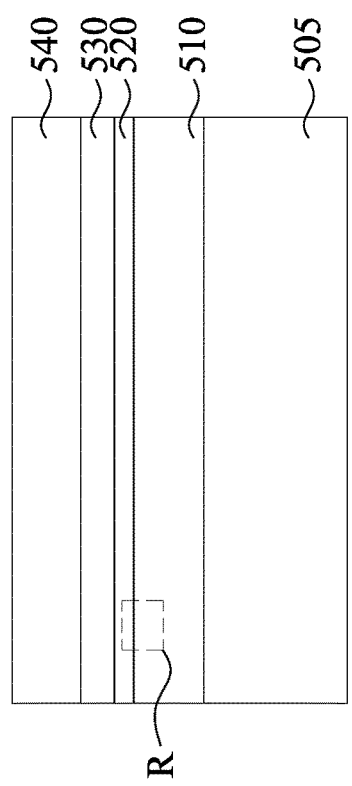
Fig. 31B
Fig. 31A

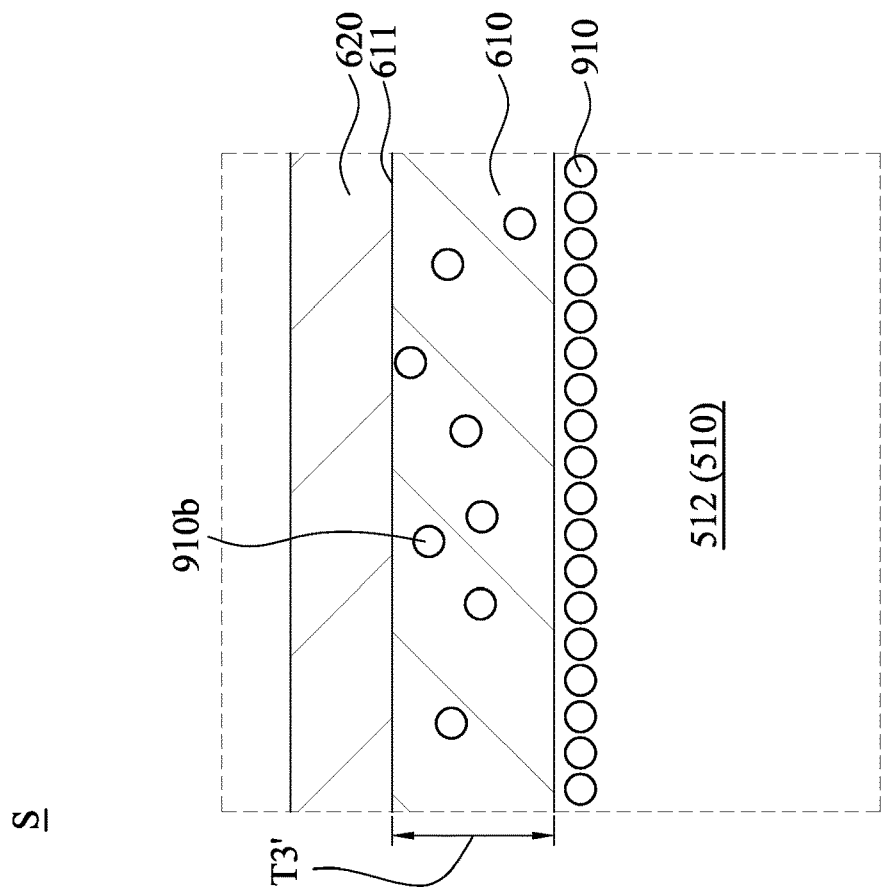
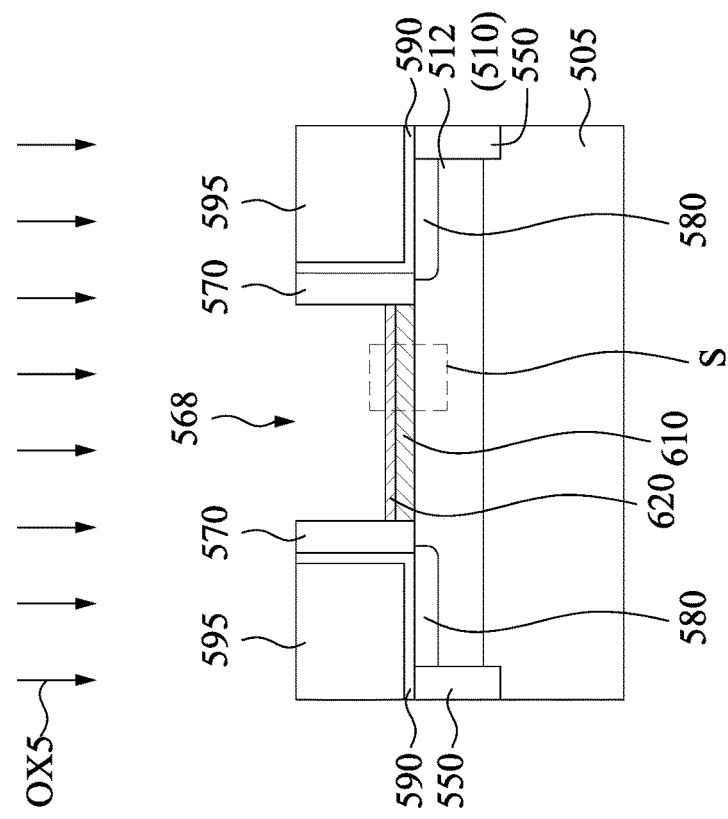
Fig. 37B
Fig. 37A

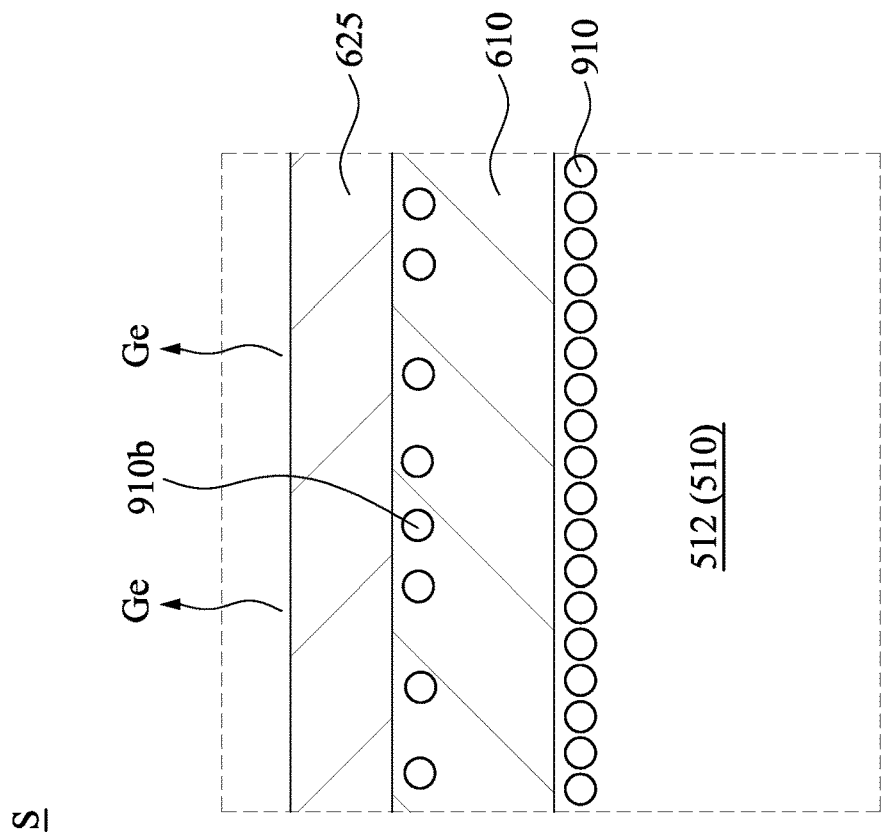
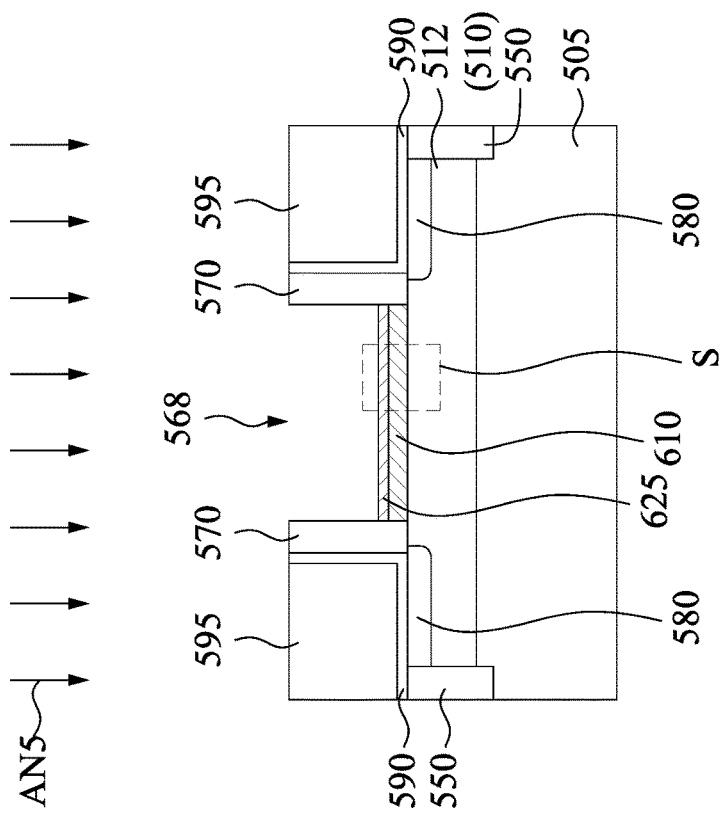
Fig. 38B
Fig. 38A

SEMICONDUCTOR DEVICE AND MANUFACTURING METHOD THEREOF

PRIORITY CLAIM AND CROSS-REFERENCE

This application claims priority to U.S. Provisional Application Ser. No. 63/220,022, filed Jul. 9, 2021, which is herein incorporated by reference.

BACKGROUND

The speed of metal-oxide-semiconductor (MOS) transistors is closely related to the drive currents of the MOS transistors, which are further closely related to the mobility of charges in the channels of the MOS transistors. For example, NMOS transistors have high drive currents when the electron mobility in their channel regions is high, while PMOS transistors have high drive currents when the hole mobility in their channel regions is high. Germanium, silicon germanium, and compound semiconductor materials (referred to as III-V compound semiconductors hereinafter) comprising group III and group V elements are thus good candidates for forming their high electron mobility and/or hole mobility.

Germanium, silicon germanium, germanium tin, and III-V compound semiconductor regions are also promising materials for forming the channel regions of Fin Field-Effect transistors (FinFETs). Methods and structures for further improving the drive currents on the FinFETs are currently being studied.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-14C illustrate a method for manufacturing a semiconductor device at various stages in accordance with some embodiments of the present disclosure.

FIGS. 16A-29C illustrate a method for manufacturing a semiconductor device at various stages in accordance with some embodiments of the present disclosure.

FIGS. 31A-42 illustrate a method for manufacturing a semiconductor device at various stages in accordance with some embodiments of the present disclosure.

DETAILED DESCRIPTION

Figure 1B:
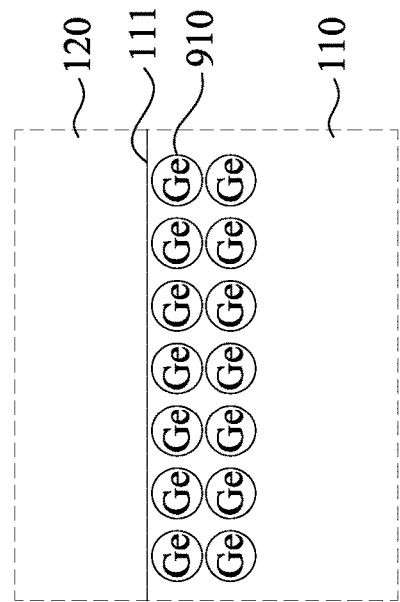

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Some embodiments of the present disclosure relate to semiconductor devices including a Ge-free semiconductive protection layer between a semiconductive channel region and a gate structure or an interfacial layer of the semiconductor devices to improve the interfacial problem between the semiconductive channel region and the gate structure or the interfacial layer. Although some implementations are illustrated below with regards to FinFETs, it will be appreciated that this concept is not limited to FinFETs, but is also applicable to other types of devices such as MOSFETs, HGAA devices, and the like.

FIGS. 1A-14C illustrate a method for manufacturing a semiconductor device at various stages in accordance with some embodiments of the present disclosure. In some embodiments, the semiconductor device shown in FIGS. 1A-14C may be intermediate devices fabricated during processing of an integrated circuit (IC), or a portion thereof, that may include static random access memory (SRAM), logic circuits, spintronic devices, passive components and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

FIGS. 1A, 2-8A, and 13-14A are perspective views of some embodiments of the semiconductor device at intermediate stages during fabrication. FIGS. 8B, 9A, 10A, 11A, 12A, and 14B are cross-sectional views of some embodiments of the semiconductor device at intermediate stages during fabrication along a first cut (e.g., cut B-B), which is along a lengthwise direction of a gate structure. FIGS. 8C and 14C are cross-sectional views of some embodiments of the semiconductor device at intermediate stages during fabrication along a second cut (e.g., cut C-C), which is along a lengthwise direction of a channel (e.g., a semiconductor fin).

Figure 1A:
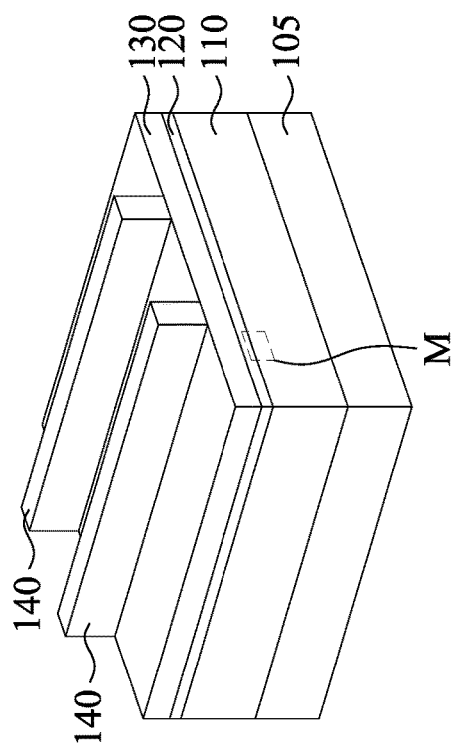

Reference is made to FIGS. 1A and 1B, where FIG. 1B is an enlarged cross-sectional view of area M in FIG. 1A. A substrate 105 is provided. In some embodiments, the substrate 105 includes silicon (Si), germanium (Ge), gallium arsenide (GaAs), Indium phosphide (InP), or other appropriate semiconductor materials. In some embodiments, the substrate 105 includes a semiconductor-on-insulator (SOI) structure such as a buried dielectric layer. Also alternatively, the substrate 105 includes a buried dielectric layer such as a buried oxide (BOX) layer, such as that formed by a method referred to as separation by implantation of oxygen (SIMOX) technology, wafer bonding, SEG, or another appropriate method. In various embodiments, the substrate 105 includes any of a variety of substrate structures and materials. In various embodiments, the substrate 105 is a high-voltage-annealed Ge(001) substrate.

An epitaxial layer 110 is deposited over the substrate 105. In some embodiments, the epitaxial layer 110 includes germanium (Ge), silicon germanium ($Si_{1-x}Ge_x$, where 0<x≤1), gallium arsenide (GaAs) or other appropriate semiconductor materials. The epitaxial layer 110 is formed above the substrate 105, through, for example, a selective epitaxial growth technique, such that the epitaxial layer 110 covers a top surface of a semiconductive material (i.e., the substrate 105 in this case). In some other embodiments, the epitaxial layer 110 is formed by using a deposition process, such as chemical vapor deposition (CVD), physical vapor deposition (PVD), atomic layer deposition (ALD), or other suitable deposition processes. The germanium percentage (atomic percentage) of the epitaxial layer 110 is higher than the germanium percentage (atomic percentage) of the substrate 105. For example, the epitaxial layer 110 is a germanium-containing layer and the substrate 105 is a germanium-free layer. While the epitaxial layer 110 is described herein as being formed by epitaxy, the epitaxial layer 110 may be formed using any suitable deposition or formation process.

As shown in FIG. 1B, in the epitaxial layer 110, some of germanium atoms 910 may diffuse to the top surface 111 of the epitaxial layer 110 to form few layers (e.g., two layers) of germanium layers. That is, a germanium concentration near the top surface 111 of the epitaxial layer 110 is higher than a germanium concentration in the epitaxial layer 110. The germanium layers near the top surface 111 of the epitaxial layer 110 may be substantially pure germanium layers.

Next, a pad layer 120 is formed on the epitaxial layer 110. The pad layer 120 can prevent the epitaxial layer 110 from being damaged by subsequent etching process. The pad layer 120 can be formed by a deposition process, such as chemical vapor deposition (CVD) and/or atomic layer deposition (ALD). Variations of CVD processes include, but are not limited to, atmospheric pressure CVD (APCVD), low pressure CVD (LPCVD), plasma enhanced CVD (PECVD), metal-organic CVD (MOCVD) and combinations thereof, and such variations may also be employed. Alternatively, the pad layer 120 may be formed using a growth process, such as thermal oxidation or thermal nitridation. In some embodiments, the pad layer 120 is made of oxide, such as $SiO_2$, that is formed by CVD.

A mask layer 130 is then formed on the pad layer 120 to be used as an etching mask. In some embodiments, the mask layer 130 is made of SiN. However, other materials, such as SiON, silicon carbide, or combinations thereof, may also be used. The mask layer 130 may be formed by a process such as CVD, plasma enhanced chemical vapor deposition (PECVD), or LPCVD. Alternatively, the mask layer 130 may be first made of a silicon oxide and then converted to SiN by nitridation.

A patterned mask layer 140 is then formed on the mask layer 130. The patterned mask layer 140 may include, but are not limited to, amorphous carbon, fluorinated amorphous carbon, or the like. In some other embodiments, the patterned mask layer 140 is a photoresist layer. The patterned mask layer 140 may be formed by a process such as CVD, plasma enhanced chemical vapor deposition (PECVD), LPCVD, or physical vapor deposition (PVD).

Figure 2:
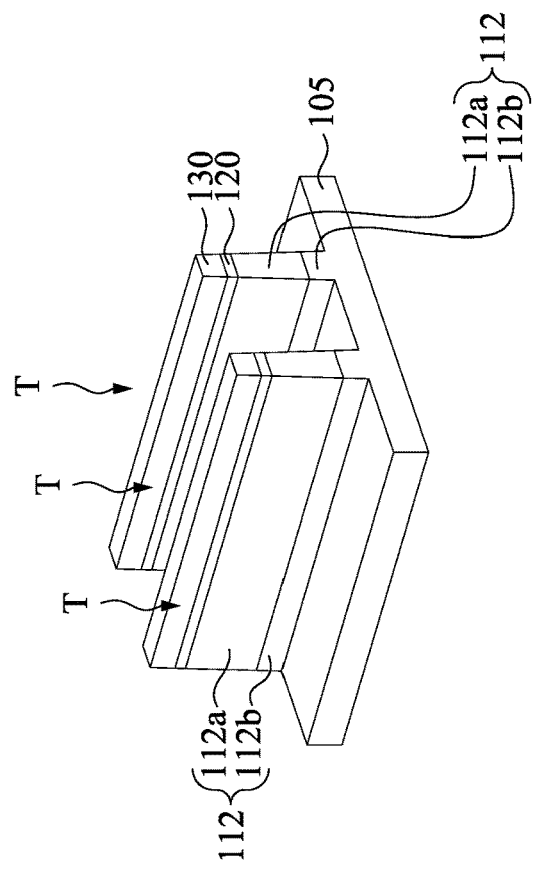

Reference is made to FIG. 2. A plurality of trenches T are formed in the epitaxial layer 110 and the substrate 105 by patterning the patterned mask layer 140 (see FIG. 1A), the mask layer 130, the pad layer 120, the epitaxial layer 110, and the substrate 105 using the patterned mask layer 140 as a mask. Adjacent two of the trenches T define a semiconductor fin 112 therebetween. The trenches T may be formed by using etching process, such as reactive ion etching (RIE). Each of the semiconductor fins 112 includes a top portion 112a and a bottom portion 112b. The top portion 112a has a material the same as the epitaxial layer 110 (see FIG. 1A), and the bottom portion 112b has a material the same as the substrate 105.

It is noted that although there are two semiconductor fins 112 in FIG. 2, the claimed scope of the present disclosure is not limited in this respect. In some other embodiments, a person having ordinary skill in the art can manufacture suitable number of the semiconductor fins 112 of the semiconductor device according to actual situations. After the formation of the trenches T and the semiconductor fins 112, the dummy mask layer 140 is removed.

Figure 3:
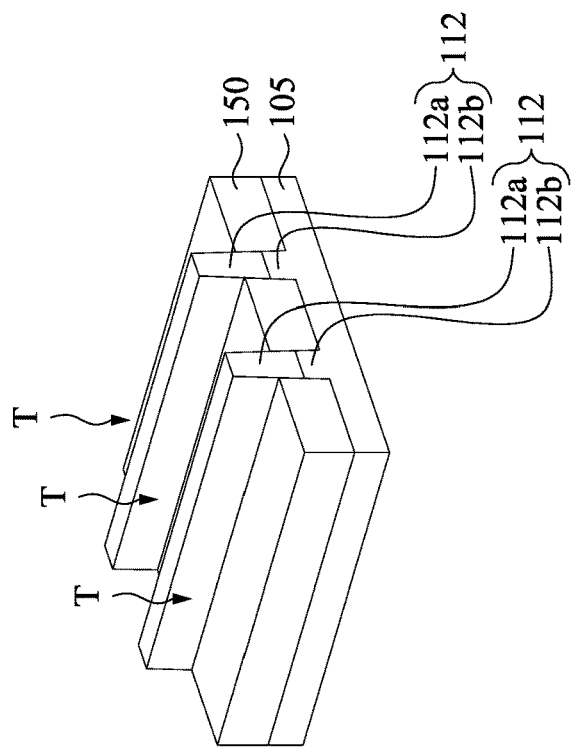

Reference is made to FIG. 3. Isolation structures 150, which may be shallow trench isolation (STI) regions, are formed in the trenches T. The formation may include filling the trenches T with a dielectric layer(s), for example, using flowable chemical vapor deposition (FCVD), and performing a chemical mechanical polish (CMP) to level the top surface of the dielectric material with the top surface of the pad layer 120 (see FIG. 2). The isolation structures 150 are then recessed, and the pad layer 120 is removed as well. The isolation structures 150 may be a dielectric material, such as silicon oxide, silicon nitride, silicon oxynitride, SiCN, $SiC_xO_yN_z$, or combinations thereof.

Figure 4:
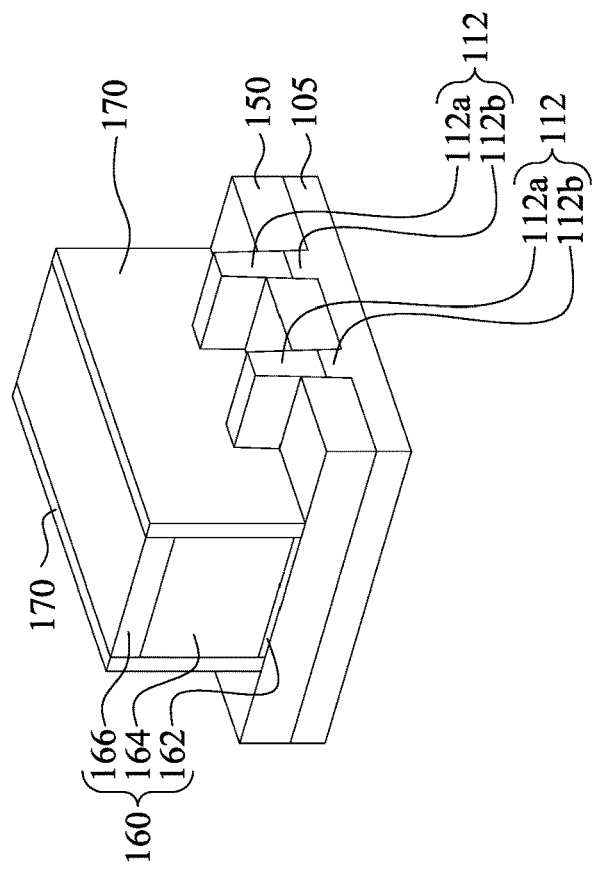

Reference is made to FIG. 4. At least one dummy gate structure 160 is formed above the semiconductor fins 112 and the isolation structures 150. The dummy gate structure 160 includes a dummy gate dielectric layer 162, a dummy gate layer 164, and a mask layer 166 formed over the dummy gate layer 164. Formation of the dummy gate structure 160 includes depositing in sequence a dielectric layer, a dummy gate layer, and a mask layer over the substrate 105, patterning the mask layer into the patterned mask layer 166 using suitable photolithography and etching techniques, followed by patterning the dummy gate layer using the mask layer 166 as masks to form the patterned dummy gate layer 164. Subsequently, the dielectric layer is patterned to form the dummy gate dielectric layer 162. As such, the dummy gate dielectric layer 162, the dummy gate layer 164, and the mask layer 166 are referred to as the dummy gate structure 160. In some embodiments, the dummy gate dielectric layer 162 may be made of silicon dioxide, silicon nitride, a high-κ dielectric material or other suitable material. The dummy gate layer 164 may be made of polycrystalline-silicon (poly-Si), polycrystalline silicon-germanium (poly-SiGe), or other suitable materials. The mask layer 166 may be made of silicon dioxide or other suitable materials.

Figure 5:
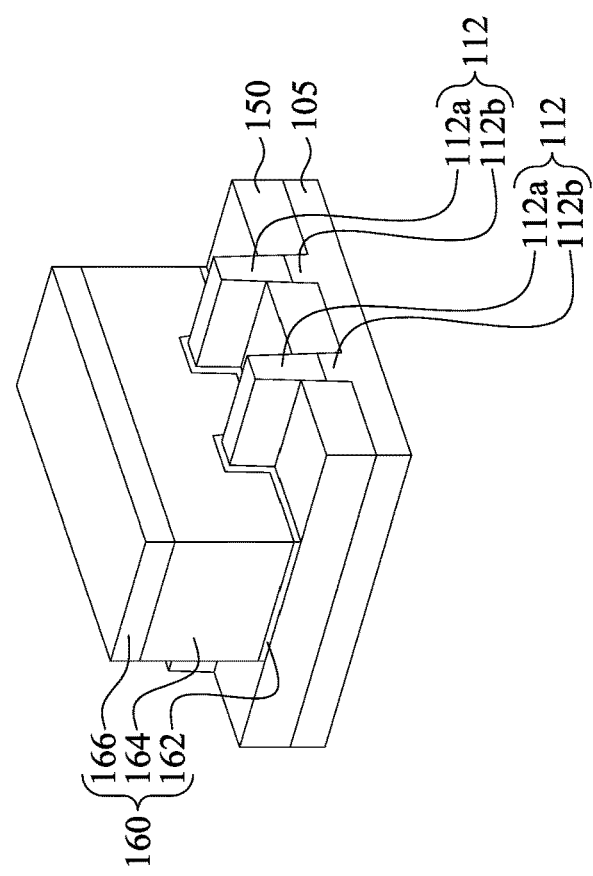

Reference is made to FIG. 5. Gate spacers 170 are respectively formed on sidewalls of the dummy gate structure 160. The gate spacers 170 may include a seal spacer and a main spacer (not shown). The gate spacers 170 include one or more dielectric materials, such as silicon oxide, silicon nitride, silicon oxynitride, SiCN, $SiC_xO_yN_z$, or combinations thereof. The seal spacers are formed on sidewalls of the dummy gate structure 170 and the main spacers are formed on the seal spacers. The gate spacers 170 can be formed using a deposition method, such as plasma enhanced chemical vapor deposition (PECVD), low-pressure chemical vapor deposition (LPCVD), sub-atmospheric chemical vapor deposition (SACVD), or the like. The formation of the gate spacers 170 may include blanket forming spacer layers, and then performing etching operations to remove the horizontal portions of the spacer layers. The remaining vertical portions of the gate spacer layers form the gate spacers 170.

Figure 6:
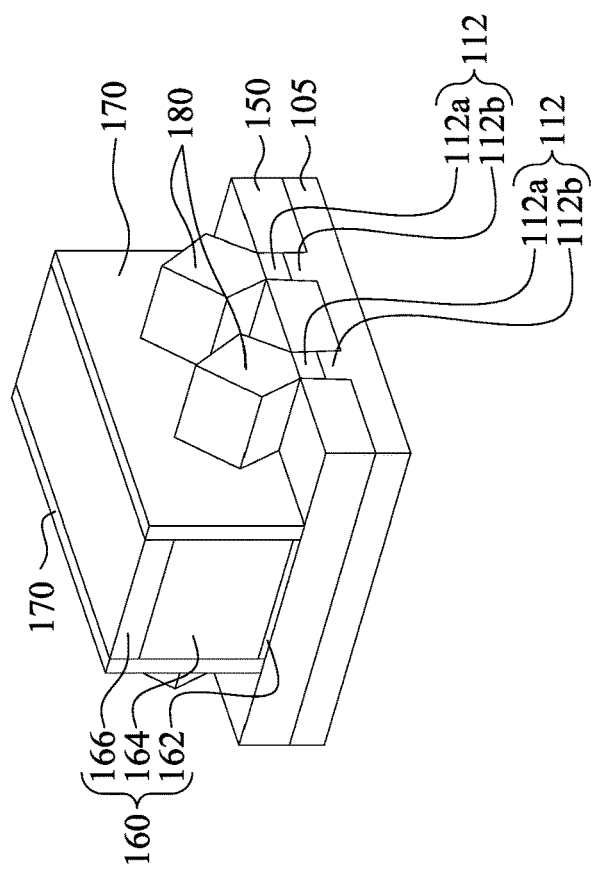

Reference is made to FIG. 6. A plurality of recesses is formed on opposite sides of the dummy gate structure 160 by etching the semiconductor fins 112. The dummy gate structure 160 and the gate spacers 170 act as etching masks in the formation of the recesses. The etching process includes a dry etching process, a wet etching process, or combinations thereof.

Semiconductor materials are then deposited in the recesses to form epitaxial structures 180 which are referred to as source/drain regions. The epitaxial structures 180 may alternatively be referred to as raised source and drain regions. The semiconductor materials include a single element semiconductor material, such as germanium (Ge) or silicon (Si), compound semiconductor materials, such as gallium arsenide (GaAs), silicon arsenide (SiAs), or aluminum gallium arsenide (AlGaAs), or a semiconductor alloy, such as silicon germanium (SiGe), silicon germanium boron (SiGeB), or gallium arsenide phosphide (GaAsP). The epitaxial structures 180 have suitable crystallographic orientations (e.g., a (100), (110), or (111) crystallographic orientation). In some embodiments, the epitaxial structures 180 include source/drain epitaxial structures. In some embodiments, where an N-type device is desired, the epitaxial structures 180 may include an epitaxially grown silicon phosphorus (SiP) or silicon carbon (SiC). In some embodiments, where a P-type device is desired, the epitaxial structures 180 may include an epitaxially grown silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes. Desired p-type or n-type impurities may be, or may not be, doped while the epitaxial process. The doping may be achieved by an ion implantation process, plasma immersion ion implantation (PIII) process, gas and/or solid source diffusion process, other suitable process, or combinations thereof.

Figure 7:
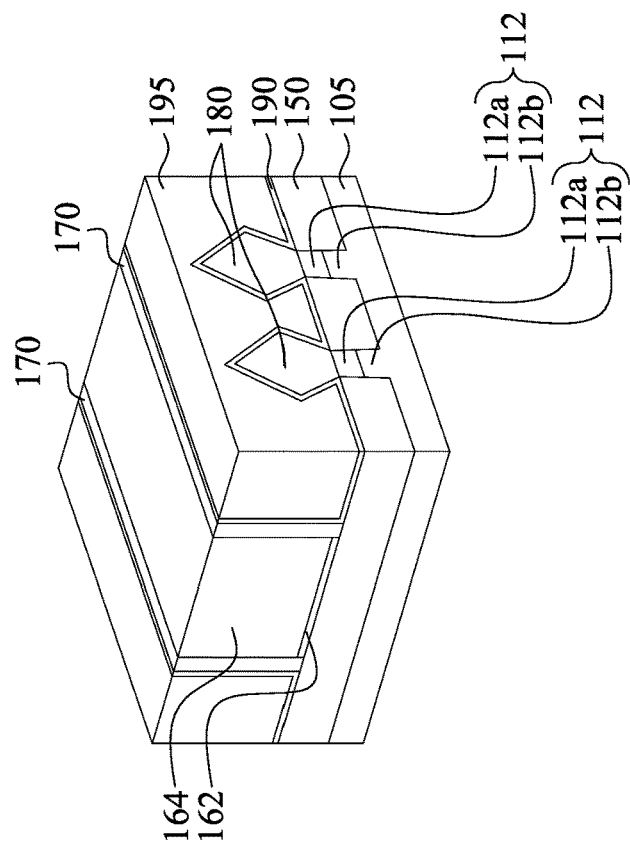

Reference is made to FIG. 7. A contact etch stop layer (CESL) 190 is conformally formed over the structure of FIG. 6. In some embodiments, the CESL 190 can be a stressed layer or layers. In some embodiments, the CESL 190 has a tensile stress and is formed of $Si_3N_4$. In some other embodiments, the CESL 190 includes materials such as oxynitrides. In yet some other embodiments, the CESL 190 may have a composite structure including a plurality of layers, such as a silicon nitride layer overlying a silicon oxide layer. The CESL 190 can be formed using plasma enhanced CVD (PECVD), however, other suitable methods, such as low-pressure CVD (LPCVD), atomic layer deposition (ALD), and the like, can also be used.

An interlayer dielectric (ILD) 195 is then formed on the CESL 190. The ILD 195 may be formed by chemical vapor deposition (CVD), high-density plasma CVD, spin-on, sputtering, or other suitable methods. In some embodiments, the ILD 195 includes silicon oxide. In some other embodiments, the ILD 195 may include silicon oxy-nitride, silicon nitride, compounds including Si, O, C and/or H (e.g., silicon oxide, SiCOH and SiOC), a low-κ material, or organic materials (e.g., polymers). After the ILD 195 is formed, a planarization operation, such as CMP, is performed, so that the mask layer 166 (see FIG. 6) is removed and the dummy gate layer 164 is exposed.

Figure 8B:
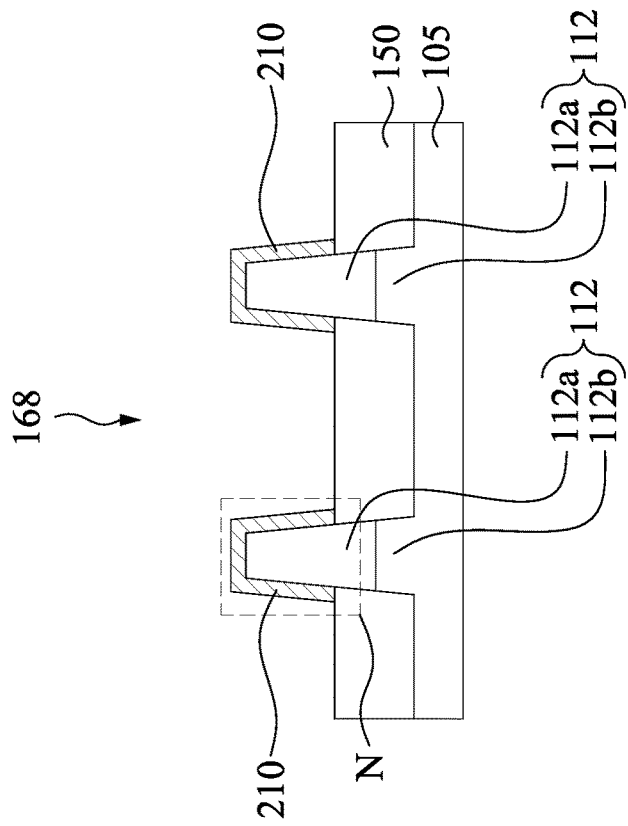
Figure 8A:
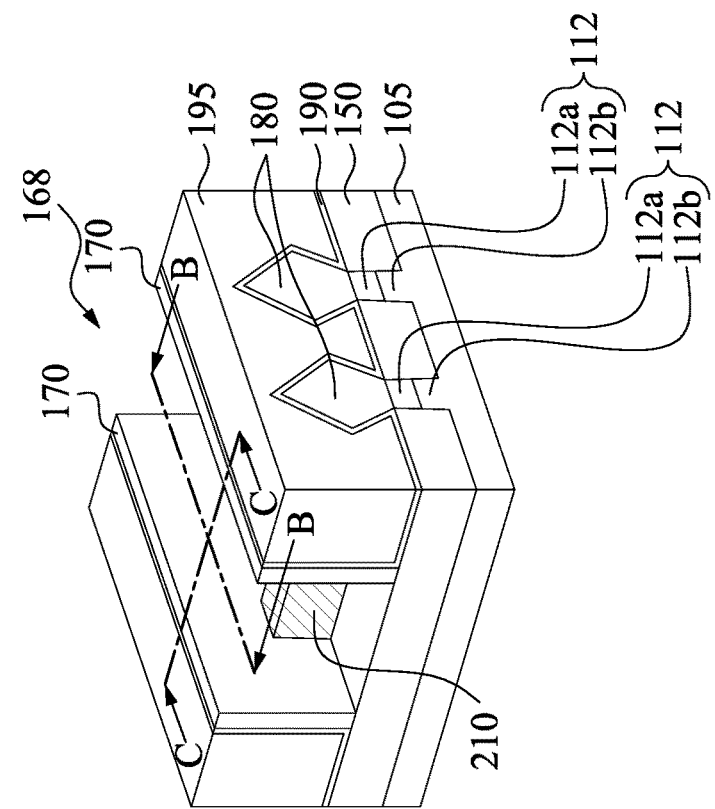
Figure 8D:
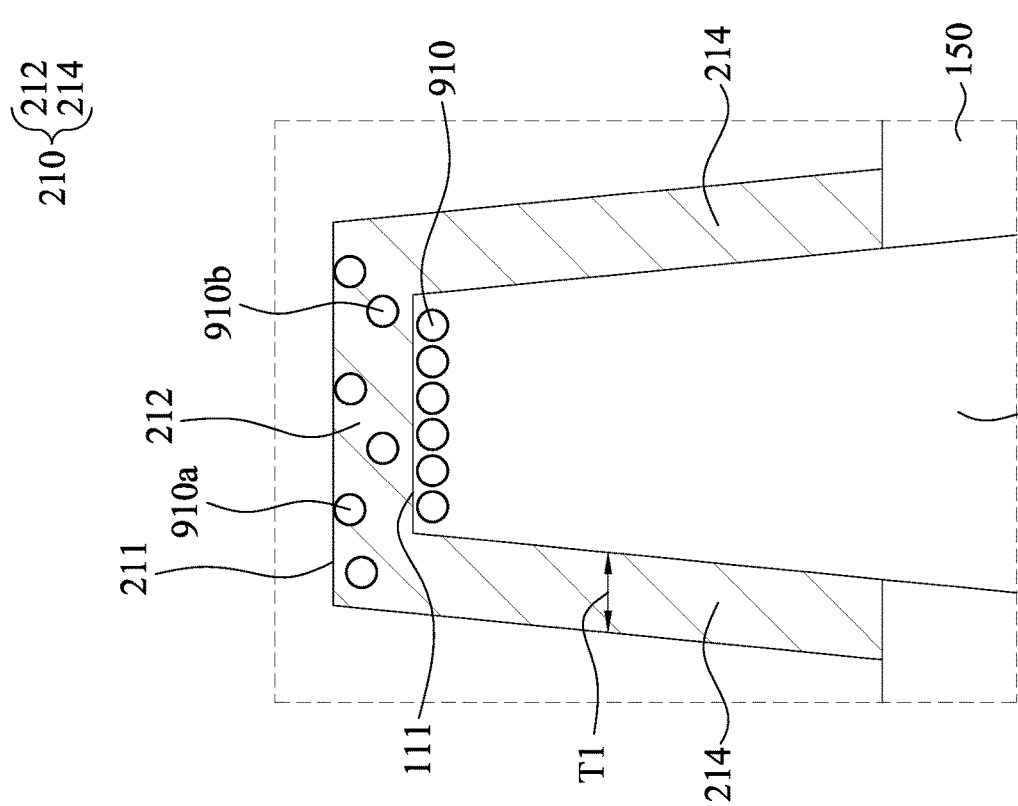
Figure 8C:
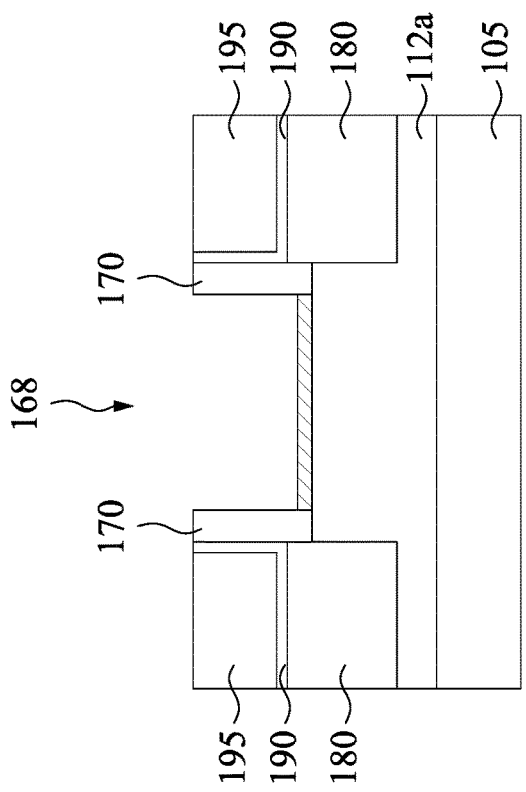

Reference is made to FIGS. 8A-8C, where FIG. 8B is a cross-sectional view taken along line B-B of FIG. 8A, and FIG. 8C is a cross-sectional view taken along line C-C of FIG. 8A. The dummy gate layer 164 and the dummy gate dielectric layer 162 (see FIG. 7) are then removed, thereby forming a gate trench 168 between the gate spacers 170 and exposing channel portions of the semiconductor fins 112 (referred to as a semiconductive channel region). The ILD 195 protects the epitaxial structures 180 during the removal of the dummy gate layer 164 and the dummy gate dielectric layer 162. The dummy gate layer 164 and the dummy gate dielectric layer 162 can be removed using plasma dry etching and/or wet etching. When the dummy gate layer 164 is polysilicon and the ILD 195 is silicon oxide, a wet etchant such as a TMAH solution can be used to selectively remove the dummy gate layer 162. The dummy gate layer 164 can be removed using plasma dry etching and/or wet etching. Subsequently, the dummy gate dielectric layer 162 is removed as well. As such, the channel portions of the semiconductor fins 112 are exposed.

Semiconductive protection layers (e.g., silicon-containing protection layers) 210 are formed above the channel portions of the semiconductor fins 112, respectively. In some embodiments, the semiconductive protection layers 210 are formed by a suitable process such as molecular beam epitaxy (MBE) processes, atomic layer deposition (ALD) processes, plasma enhanced ALD (PEALD) processes, chemical vapor deposition (CVD) processes, physical vapor deposition (PVD) processes, or other suitable processes.

The semiconductive protection layer 210 includes semiconductive materials such as silicon, e.g., monocrystalline silicon. In some embodiments, the semiconductive protection layer 210 may be a pure silicon layer. The semiconductive protection layer 210 may also be a substantially pure silicon layer, for example, with a germanium atomic percentage lower than about 20 percent, such that the semiconductive protection layer 210 is substantially free of germanium. In some embodiments, the semiconductive protection layer 210 has a thickness T1 (see FIG. 8D) in a range of about 1 angstrom to about 30 angstrom.

Figure 44:
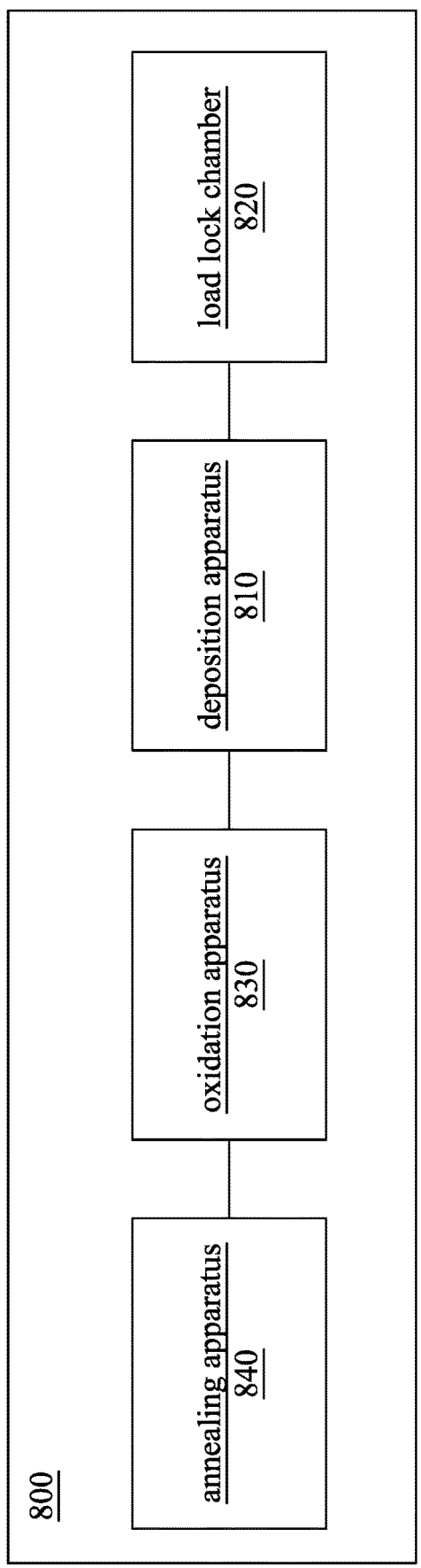
FIG. 44 is a schematic diagram of a fabrication tool, according to some embodiments of the present disclosure.

FIG. 44 is a schematic diagram of a fabrication tool 800, according to some embodiments of the present disclosure. Reference is made to FIGS. 8A and 44. In some embodiments, the structure in FIG. 7 may undergo a deposition process in a deposition apparatus 810 of the fabrication tool 800 shown in FIG. 44 to form the semiconductive protection layer 210.

In FIG. 44, the fabrication tool 800 further includes a load lock chamber 820. The load lock chamber 820 preserves the atmosphere within the deposition apparatus 810 (, the oxidation apparatus 830, and the annealing apparatus 840) by separating them from outside environment. The load lock chamber 820 includes two doors, an outer door connected to the outside environment and an inner door connected to the deposition apparatus 810. A wafer including the structure of FIG. 7 is inserted into the load lock chamber 820 and both doors of the load lock chamber 820 are sealed. The load lock chamber 820 is capable of creating an atmosphere compatible with the outside environment or the deposition apparatus 810 depending on where the loaded wafer is scheduled to be next. This may alters the gas content of the load lock chamber 820 by such mechanisms as adding purified gases or creating a vacuum, along with other suitable means for adjusting the load lock chamber atmosphere. When the correct atmosphere has been reached, the corresponding door may be opened, and the wafer can be accessed.

The wafer including the structure of FIG. 7 then enters the deposition apparatus 810 to form the semiconductive protection layers 210. In some embodiments, the deposition apparatus 810 is an MBE chamber, an ALD chamber, a CVD chamber, a PVD chamber, or other suitable deposition chamber.

FIG. 8D is an enlarged view of area N in FIG. 8B. As shown in FIG. 8D, during the deposition of the semiconductive protection layer 210, germanium atoms 910 near the top surface 111 of the top portion 112a of the semiconductor fin 112 diffuse to the semiconductive protection layer 210. Some germanium atoms 910a diffuse to the top surface 211 of a top portion 212 of the semiconductive protection layer 210 above the top portion 112a of the semiconductor fin 112, and some germanium atoms 910b diffuse inside the portion 212 of the semiconductive protection layer 210. In the meantime, the amount of the germanium atoms 910 in the top portion 112a of the semiconductor fin 112 is reduced. For example, single germanium layer or less remains in the top portion 112a of the semiconductor fin 112. In some embodiments, bottom portions 214 of the semiconductive protection layer 210 on the sidewalls of the top portion 112a of the semiconductor fin 112 are substantially free of germanium. That is, an amount of the top portion 212 of the semiconductive protection layer 210 is greater than an amount of the bottom portions 214 of the semiconductive protection layer 210.

Reference is made to FIGS. 9A-9B, where FIG. 9B is an enlarge view of the area N in FIG. 9A. An oxidation process OX1 is performed on the semiconductive protection layers 210, such that portions of the semiconductive protection layers 210 are oxidized to be oxidation layers 220. In some embodiments, the structure in FIG. 8A may undergo an oxidation process OX1 in an oxidation apparatus 830 of the fabrication tool 800 shown in FIG. 44 to form the oxidation layer 220.

Figures 45, 46:
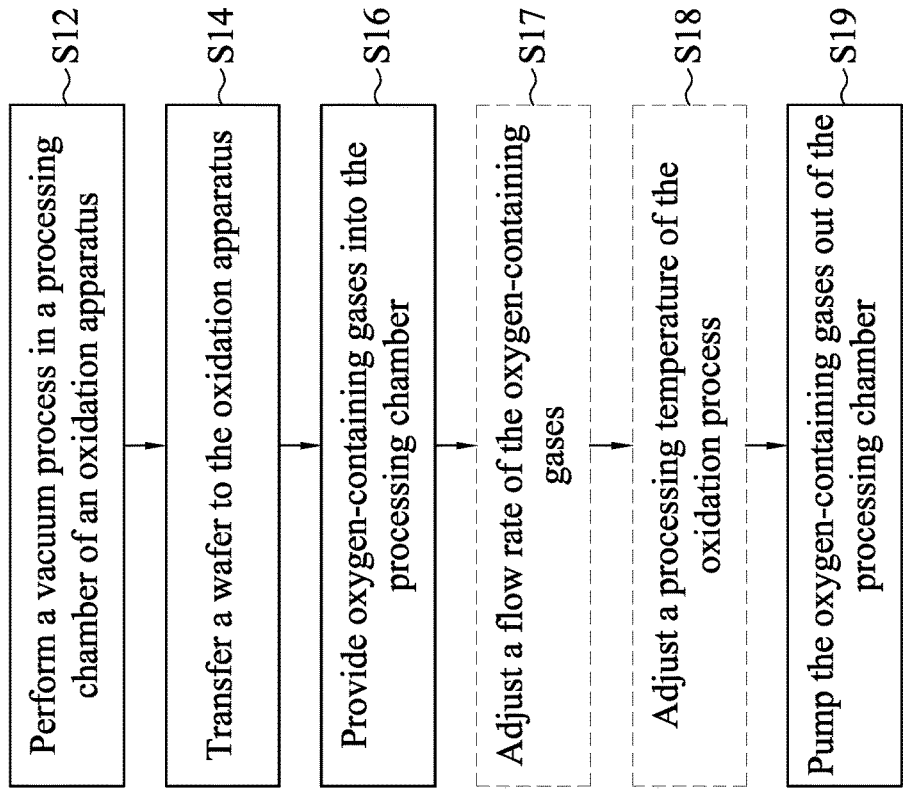
FIG. 45 is a flowchart of a method of an oxidation process according to aspects of the present disclosure in various embodiments.
FIG. 46 is a flowchart of a method of an annealing process according to aspects of the present disclosure in various embodiments.

FIG. 45 is a flowchart of a method M10 of an oxidation process OX1 according to aspects of the present disclosure in various embodiments. The method M10 is merely an example and is not intended to limit the present disclosure beyond what is explicitly recited in the claims. Additional operations can be provided before, during, and after the method M10, and some operations described can be replaced, eliminated, or moved around for additional embodiments of the process. For clarity and ease of explanation, some elements of the figures have been simplified.

In operation S12 of FIG. 45, a vacuum process is performed in a processing chamber of the oxidation apparatus 830 to remove moisture, air, or other reactive elements that may react with the semiconductive protection layer 210 out of the processing chamber. With this operation S12, the efficiency of the oxidation process OX1 of the semiconductive protection layer 210 can be improved.

In operation S14 of FIG. 45, the wafer including the structure of FIG. 8A is transferred from the deposition apparatus 810 to the oxidation apparatus 830. In some embodiments, the operations S12 and S14 are in-situ performed, that is, the operations S12 and S14 are performed with no vacuum break therebetween for minimizing contaminations during transferring the wafer.

In operation S16 of FIG. 45, after the wafer is inserted in the processing chamber of the oxidation apparatus 830, oxygen-containing gases are provided into the processing chamber to provide an oxygen-containing environment in the processing chamber such that the oxygen-containing gases are provided onto the semiconductive protection layer 210. In some embodiments, the oxygen-containing gases are pure (molecular) oxygen gases to enhance the oxidation efficiency of the semiconductive protection layer 210.

Optionally, as shown in operation S17 of FIG. 45, a flow rate of the oxygen-containing gases can be adjusted by using a flow rate controller, such as a variable leak valve, a mass flow controller, a needle valve, or other suitable valves, of the oxidation apparatus 830. In some embodiments, the flow rate of the oxygen-containing gases is in a range of about 1 langmuir to about 1000 langmuir. If the flow rate is lower than about 1 langmuir, the semiconductive protection layers 210 may not be oxidized; if the flow rate is higher than about 1000 langmuir, an efficiency of removal of GeOx in the following annealing process (see FIGS. 10A-10B) may be low.

Optionally, as shown in operation S18 of FIG. 45, a processing temperature of the oxidation process OX1 is adjusted. In some embodiments, the processing temperature is in a range of about 20° C. to about 500° C. For example, the processing temperature is at room temperature during the oxidation process OX1.

In operation S19 of FIG. 45, after the formation of the oxidation layers 220, the oxygen-containing gases are pumped out of the processing chamber of the oxidation apparatus 830.

Reference is made to FIGS. 8D and 9B. During the oxidation process OX1 shown in FIGS. 9A and 45, an oxidation layer 220 is formed on the outer surface of the semiconductive protection layer 210. Since portions of the semiconductive protection layer 210 are oxidized, the remaining semiconductive protection layer 210 has a thickness T1' smaller than the thickness T1 shown in FIG. 8D. The semiconductive protection layer 210 may also be a substantially pure silicon layer, for example, with a germanium atomic percentage lower than about 20 percent, such that the semiconductive protection layer 210 is substantially free of germanium.

As mentioned above, the semiconductive protection layer 210 may include silicon, such that the oxidation layer 220 includes SiOx, where the silicon atoms of the SiOx may form 1+ to 4+ charge states, depending on the flow rate of the oxygen-containing gases. Furthermore, as shown in FIGS. 8D and 9B, the germanium atoms 910a are oxidized to be GeOx in the oxidation layer 220. That is, the oxidization layer 220 includes SiOx and GeOx.

As mentioned above, the processing temperature of the oxidation process OX1 can be adjusted/tuned such that the oxidation reacts mainly on the surface 211 of the semiconductive protection layer 210, or on the outmost single layer of the semiconductive protection layer 210. As such, almost all of the germanium atoms 910a on the surface 211 can be oxidized. Also, the processing temperature of the oxidation process OX1 is lower than about 500° C. such that the diffusion of germanium atoms 910 and/or 910b can be suppressed.

Figure 10B:
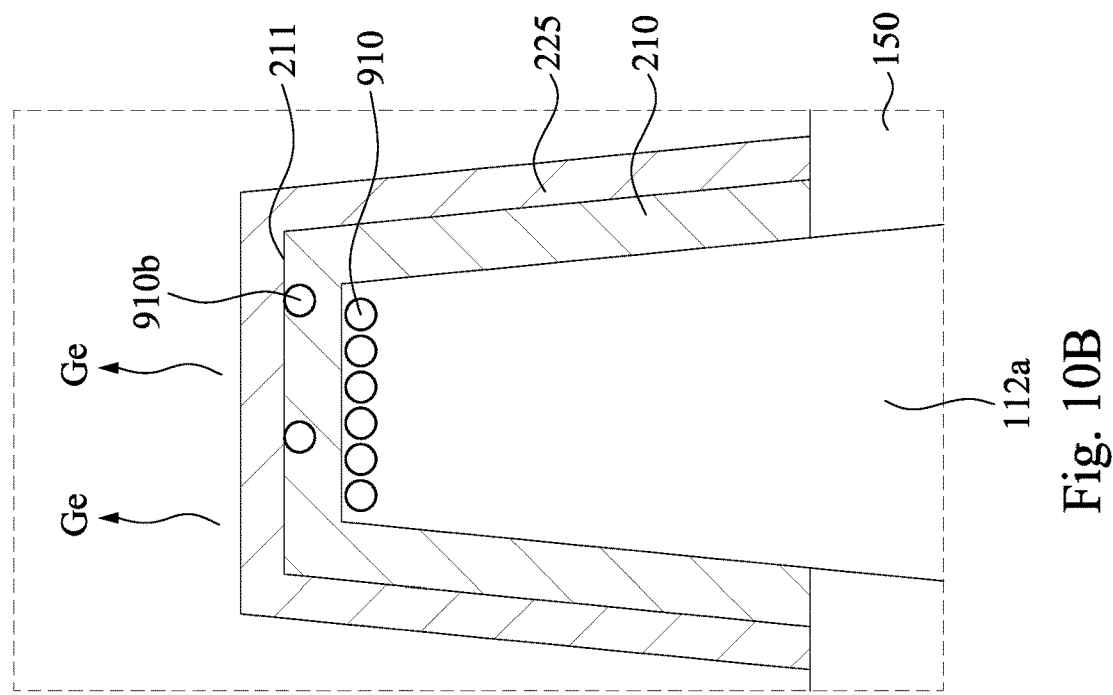
Figure 10A:
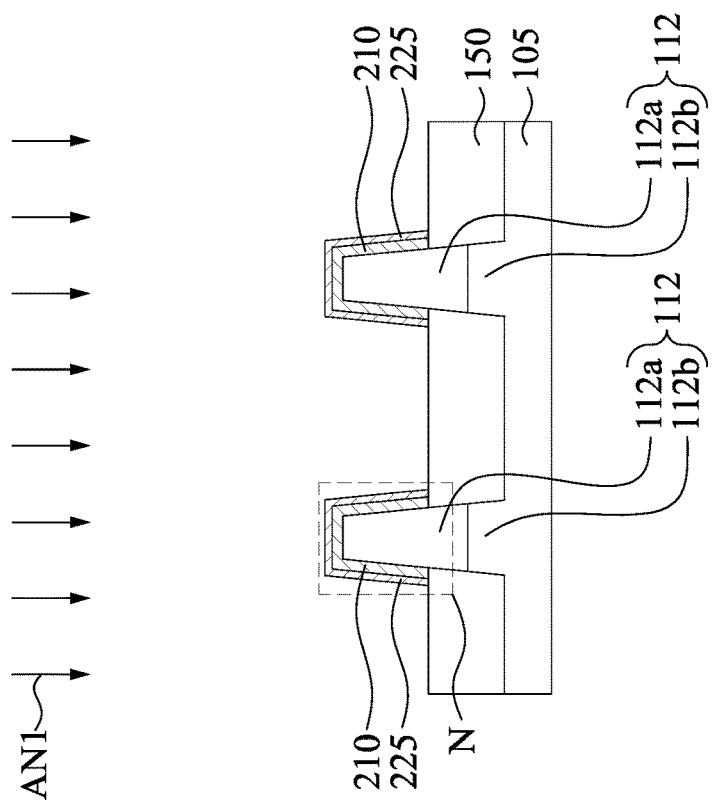

Reference is made to FIGS. 10A-10B, where FIG. 10B is an enlarge view of the area N in FIG. 10A. An annealing process AN1 is performed on the oxidation layer 220 to evaporate the germaniums in the oxidation layer 220, and the remaining oxidation layer is oxidation layer 225. In some embodiments, the structure in FIG. 9A may undergo an annealing process AN1 in an annealing apparatus 840 of the fabrication tool 800 shown in FIG. 45.

FIG. 46 is a flowchart of a method M20 of an annealing process AN1 according to aspects of the present disclosure in various embodiments. The method M20 is merely an example and is not intended to limit the present disclosure beyond what is explicitly recited in the claims. Additional operations can be provided before, during, and after the method M20, and some operations described can be replaced, eliminated, or moved around for additional embodiments of the process. For clarity and ease of explanation, some elements of the figures have been simplified.

In operation S22 of FIG. 46, a vacuum process is performed in a processing chamber of the annealing apparatus 840 to remove moisture, air, or other reactive elements that may react with the semiconductive protection layer 210/oxidation layer 220 out of the processing chamber. A vacuum pumping system used for vacuum the processing chamber of the annealing apparatus 840 (or the processing chamber of the oxidation apparatus 830 or the processing chamber of the deposition apparatus 810 or the load lock chamber 820) may include cryopumps, mechanical pumps, dry pumps, turbomolecular pumps, ion pumps, getter pumps, or other suitable pumps. In some embodiments, the pressure of the processing chamber of the annealing apparatus 840 is in a range of about 1E10-11 Torr to about 1 Torr, for example, about 1E10-11 Torr to about 1.2E10-9 Torr.

In operation S24 of FIG. 46, the wafer including the structure of FIG. 9A is transferred from the oxidation apparatus 830 to the annealing apparatus 840. In some embodiments, the operations S22 and S24 are in-situ performed, that is, the operations S22 and S24 are performed with no vacuum break therebetween for minimizing contaminations during transferring the wafer.

In operation S26 of FIG. 46, after the wafer is inserted in the processing chamber of the annealing apparatus 840, a processing temperature of the processing chamber of the annealing apparatus 840 is adjusted (e.g., raised) by using, for example, a radiation heating system or other suitable heating system. In some embodiments, the processing temperature of the processing chamber of the annealing apparatus 840 is in a range of about 100° C. to about 1000° C., for example, about 300° C. to about 900° C., for about 0.01 seconds to about 30 minutes. In some embodiments, the processing temperature in the annealing process AN1 is higher than the processing temperature in the oxidation process OX1. Further, the processing temperature in the annealing process AN1 is higher than a first temperature that breaks Ge—O bonds and lower than a second temperature that breaks Si—O bonds.

Reference is made to FIGS. 9B and 10B. As described in FIG. 46, the annealing process AN1 is performed in a vacuum environment (e.g., an oxygen-free environment). During the annealing process AN1 shown in FIGS. 10A and 46, Ge—O bonds are broken such that germanium atoms are escaped from the oxidation layer 220. The oxygens with the broken bonds may migrate to Si region and may be reconnected to Si or SiOx to form the oxidation layer 225. Therefore, an amount of GeOx in the oxidation layer 225 is reduced while an amount of SiOx in the oxidation layer 225 is increased. As mentioned above, since the processing temperature (or annealing temperature) of the annealing process AN1 is lower than a temperature that breaks Si—O bonds, none or rarely Si—O bonds is broken during the annealing process AN1. As such, the oxidation layer 225 includes mainly SiOx and is substantially free from GeOx.

Further, the annealing temperature triggers the diffusion of the germanium atoms 910b, such that the germanium atoms 910b in the semiconductive protection layer 210 diffuse to the top surface of the semiconductive protection layer 210 as shown in FIG. 10B. The semiconductive protection layer 210 may also be a substantially pure silicon layer, for example, with a germanium atomic percentage lower than about 20 percent, such that the semiconductive protection layer 210 is substantially free of germanium.

Figure 47:
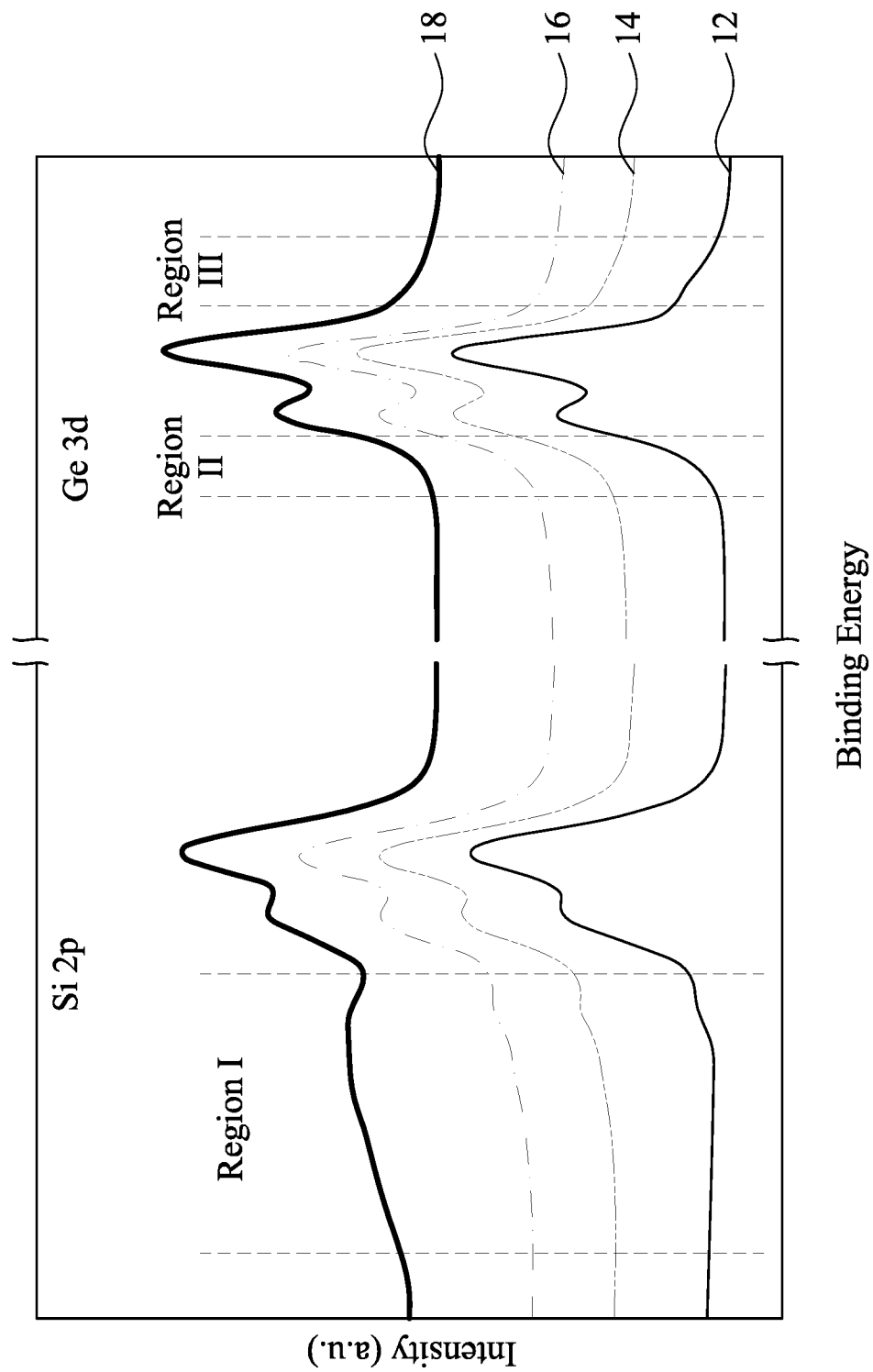
FIG. 47 is a measured synchrotron radiation photoemission spectroscopy spectra of Si 2p and Ge 3d peaks in the oxidation layer and the semiconductive protection layer.

FIG. 47 is a measured synchrotron radiation photoemission spectroscopy spectra of (a) Si 2p and (b) Ge 3d peaks in the oxidation layer and the semiconductive protection layer. Curve 12 represents a spectrum of the semiconductive protection layer prior to performing an oxidation process, curve 14 represents a spectrum of the oxidation layer and the semiconductive protection layer after performing the oxidation process with a first oxygen flow rate, curve 16 represents a spectrum of the oxidation layer and the semiconductive protection layer after performing the oxidation process with a second oxygen flow rate, and curve 18 represents a spectrum of the oxidation layer and the semiconductive protection layer after performing an annealing process. The first oxygen flow rate is lower than the second oxygen flow rate. Region I reflects the intensity of SiOx signal, region II reflects the intensity of GeOx, signal, and region III reflects the intensity of germanium atoms signal. As shown in FIG. 47, SiOx are formed during the oxidation process, and the intensity of the SiOx signal increases after performing the annealing process. Also, the intensity of the GeOx signal is reduced after performing the annealing process. Further, the germanium signal is reduced after performing the oxidation process (and the annealing process).

Figure 11B:
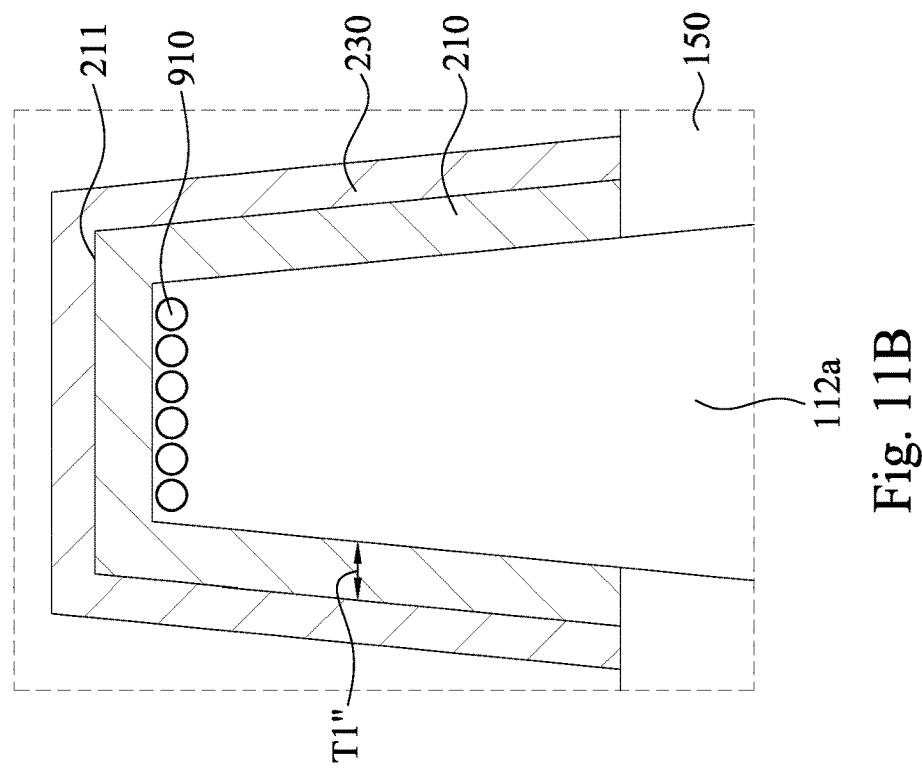
Figure 11A:
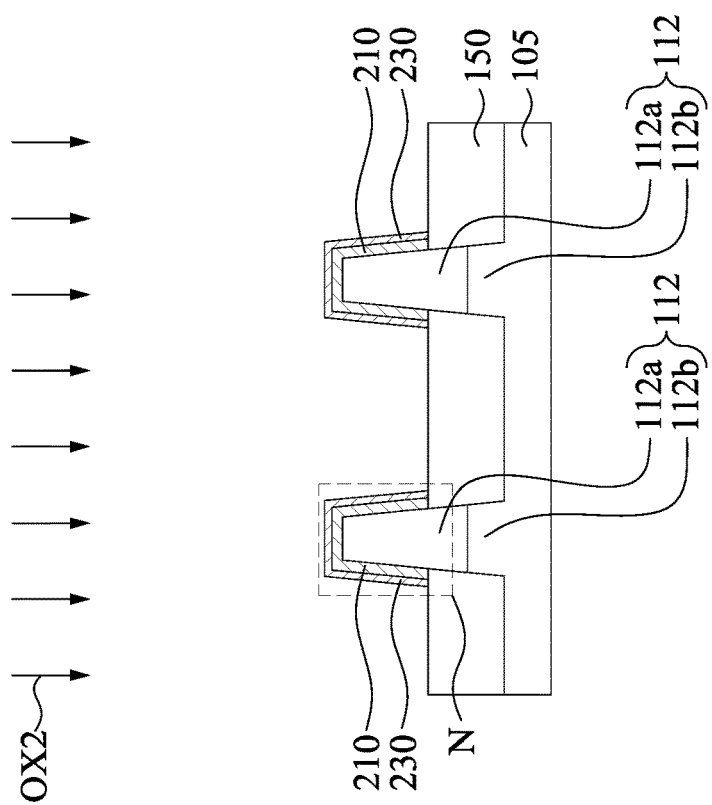

Reference is made to FIGS. 11A-11B, where FIG. 11B is an enlarge view of the area N in FIG. 11A. Another oxidation process OX2 is optionally performed on the semiconductive protection layers 210, such that the oxidation layer 225 is thicken to be an oxidation layer 230. In some embodiments, the structure in FIG. 10A may undergo an oxidation process OX2 in the oxidation apparatus 830 of the fabrication tool 800 shown in FIG. 44 to form the oxidation layer 230. The oxidation process OX2 may be similar to the oxidation process OX1 shown in FIG. 45, and, therefore, a description in this regard will not be repeated hereinafter.

Reference is made to FIGS. 10B and 11B. During the oxidation process OX2 shown in FIGS. 10A and 45, the oxidation layer 230 is formed on the outer surface of the semiconductive protection layer 210. Since portions of the semiconductive protection layer 210 are oxidized, the remaining semiconductive protection layer 210 has a thickness T1" smaller than the thickness T1' shown in FIG. 9B. The semiconductive protection layer 210 may also be a substantially pure silicon layer, for example, with a germanium atomic percentage lower than about 20 percent, such that the semiconductive protection layer 210 is substantially free of germanium.

As mentioned above, the oxidation layer 225 mainly includes SiOx. Further, the germanium atoms 910b diffuse to the top surface 211 of the semiconductive protection layer 210, such that the oxidation process OX2 oxidizes the germanium atoms 910b to be GeOx in the oxidation layer 230. That is, the oxidization layer 230 includes a large amount of SiOx and a small amount of GeOx.

The processing temperature of the oxidation process OX2 can be adjusted/tuned such that the oxidation reacts mainly on the surface 211 of the semiconductive protection layer 210, or on the outmost single layer of the semiconductive protection layer 210. As such, almost all of the germanium atoms 910b on the surface 211 can be oxidized. Also, the processing temperature of the oxidation process OX2 is lower than about 500° C. such that the diffusion of germanium atoms 910 can be suppressed.

Reference is made to FIGS. 12A-12B, where FIG. 12B is an enlarge view of the area N in FIG. 12A. Another annealing process AN2 is optionally performed on the oxidation layer 230 to evaporate the germaniums in the oxidation layer 230, and the remaining oxidation layer is oxidation layer 235. In some embodiments, the structure in FIG. 11A may undergo the annealing process AN2 in the annealing apparatus 840 of the fabrication tool 800 shown in FIG. 44. The semiconductive protection layer 210 may also be a substantially pure silicon layer, for example, with a germanium atomic percentage lower than about 20 percent, such that the semiconductive protection layer 210 is substantially free of germanium. The annealing process AN2 may be similar to the annealing process AN1 shown in FIG. 46, and, therefore, a description in this regard will not be repeated hereinafter.

Reference is made to FIGS. 11B and 12B. During the annealing process AN2 shown in FIGS. 12A and 46, Ge—O bonds are broken such that germanium atoms are escaped from the oxidation layer 230. The oxygens with the broken bonds may migrate to Si region and may be reconnected to Si or SiOx to form the oxidation layer 235. Therefore, an amount of GeOx in the oxidation layer 235 is reduced while an amount of SiOx in the oxidation layer 235 is increased. As mentioned above, since the processing temperature (or annealing temperature) of the annealing process AN2 is lower than a temperature that breaks Si—O bonds, none or rarely Si—O bonds is broken during the annealing process AN1. As such, the oxidation layer 235 includes mainly SiOx and is substantially free from GeOx.

One of the oxidation processes (such as the oxidation processes OX1 and OX2) and one of the annealing processes (such as the annealing processes AN1 and AN2) can be referred to as a Ge-removal cycle, and this Ge-removal cycle can be repeated many times to remove the germanium atoms in the semiconductive protection layer 210. For example, the wafer including the structure of FIG. 7 undergoes two Ge-removal cycles (FIGS. 8A-11B). In some other embodiments, more than two Ge-removal cycles can be perform to purify the silicon components in the semiconductive protection layer 210.

Figure 13:
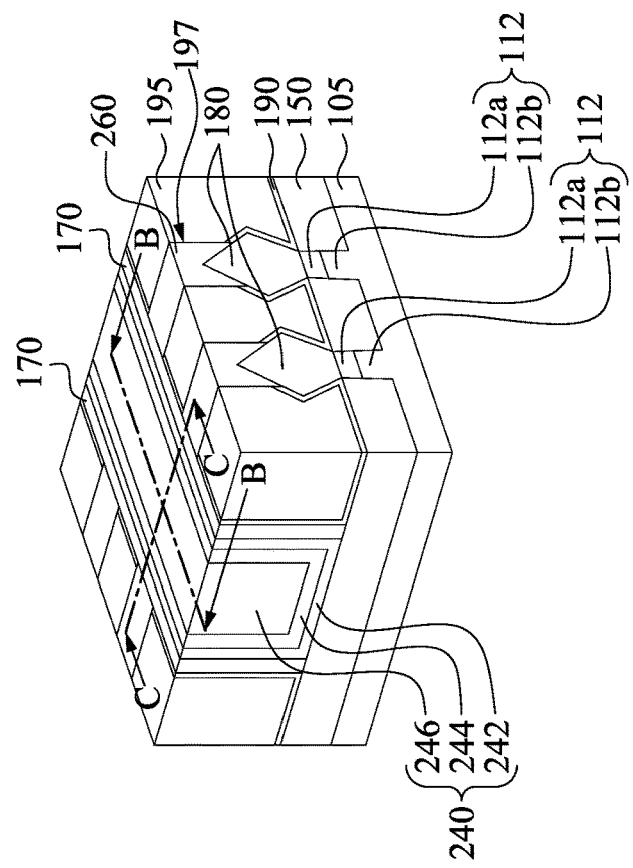

Reference is made to FIG. 13. A gate dielectric layer 242 is conformally formed in the gate trench 168 (see FIG. 8A) and above the oxidation layer 235 (see FIGS. 12A and 12B). The gate dielectric layer 242 may be a high-κ dielectric layer having a dielectric constant (κ) higher than the dielectric constant of $SiO_2$, i.e. κ>3.9. The gate dielectric layer 242 may include $LaO_x$, $AlO_x$, $ZrO_x$, TiO, $HfO_x$, $TaO_x$, $GdO_x$, $YO_x$, $ScO_x$, $MgO_x$, $SrTiO_3$ (STO), $BaTiO_3$ (BTO), BaZrO, HfZrO, $ZrSiO_x$, HfLaO, $HfSiO_x$, HfSiON, $LaSiO_x$, $AlSiO_x$, $GdSiO_x$, $YSiO_x$, HfTaO, HfTiO, $(Ba,Sr)TiO_3$ (BST), $Al_2O_3$, $Si_3N_4$, oxynitrides (SiON), or other suitable materials. In some embodiments, the gate dielectric layer 242 is a single layer. In some other embodiments, the gate dielectric layer 242 includes multiple layers, e.g., a $HfO_2$ layer and an $Al_2O_3$ layer above the $HfO_2$ layer. The gate dielectric layer 242 is deposited by suitable techniques, such as ALD, CVD, PVD, MBE, thermal oxidation, combinations thereof, or other suitable techniques.

A gate electrode GE is formed above the gate dielectric layer 242 and fills the gate trench 168. In some embodiments, the gate electrode GE include at least one work function metal layer(s) 244, a fill layer 246, and/or other suitable layers that are desirable in a metal gate stack. The work function metal layer 244 may include n-type and/or p-type work function metal. Exemplary n-type work function metals include Ti, Ta, Ag, TiAl, TaAl, TaAlC, TiAlN, TaC, TiC, TaCN, TaSiN, Mn, Zr, other suitable n-type work function materials, or combinations thereof. Exemplary p-type work function metals include TiN, TaN, Ru, Mo, Al, $ZrSi_2$, $MoSi_2$, $TaSi_2$, $NiSi_2$, WN, other suitable p-type work function materials, or combinations thereof. The work function metal layer 244 may have multiple layers. The work function metal layer(s) 244 may be deposited by CVD, PVD, electroplating and/or other suitable process. In some embodiments, the fill layer 246 in the metal gate electrodes GE may include tungsten (W), Ni, Mo, Ru, or other suitable conductive materials. The fill layer 246 may be deposited by ALD, PVD, CVD, or other suitable process. The gate dielectric layer 242, the work function metal layer 244, and the fill layer 246 are together referred to as a gate structure 240.

Figure 14A:
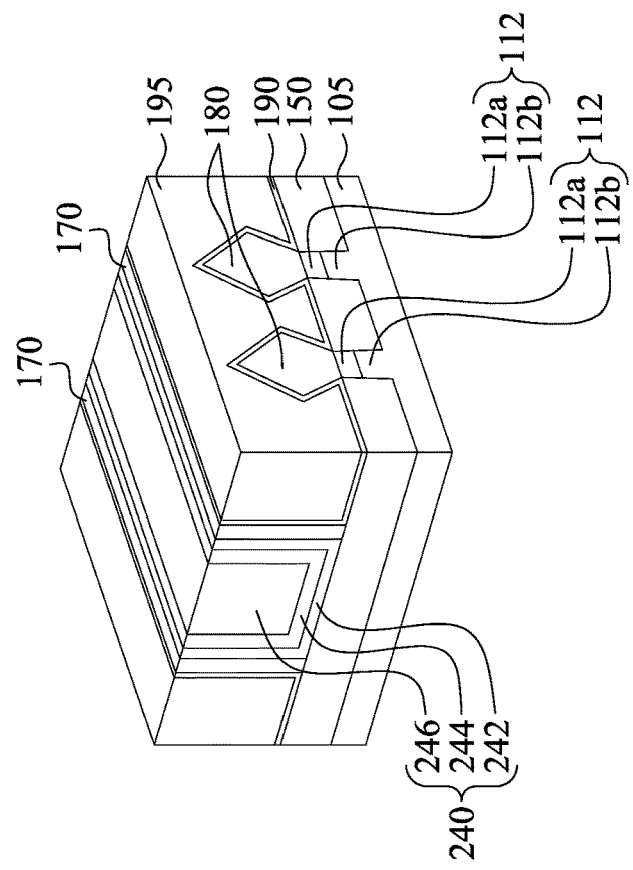
Figure 14C:
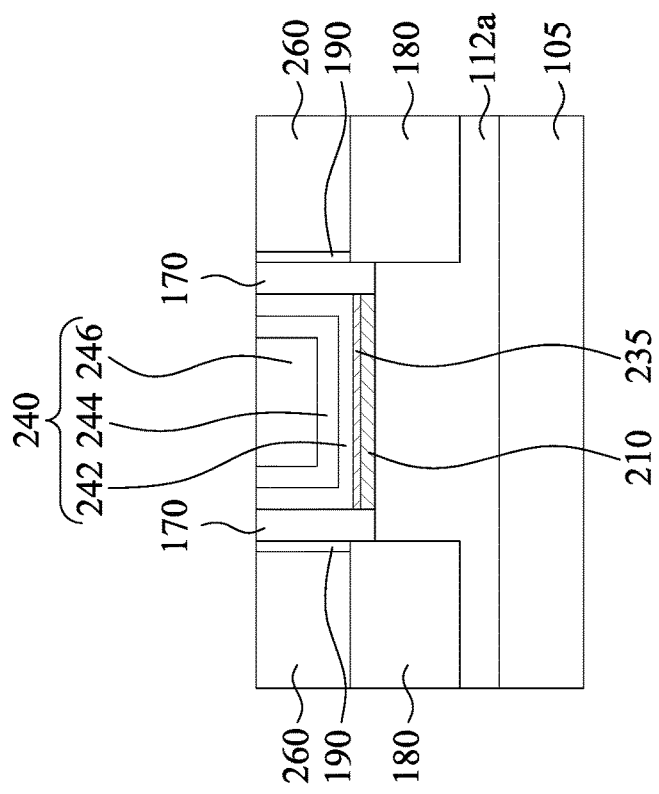
Figure 14B:
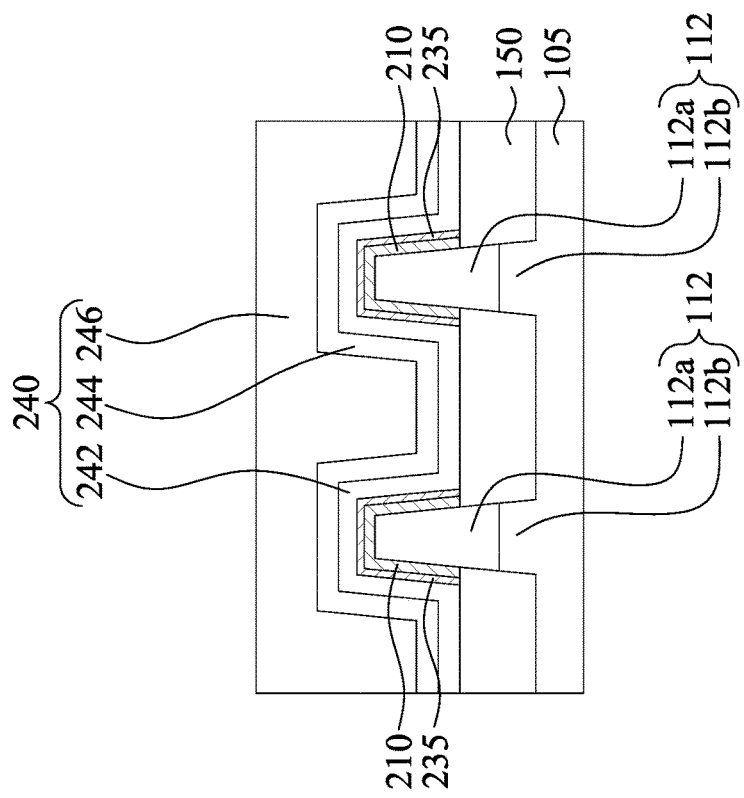

Reference is made to FIGS. 14A-14C, where FIG. 14B is a cross-sectional view taken along line B-B of FIG. 14A, and FIG. 14C is a cross-sectional view taken along line C-C of FIG. 14A. The ILD 195 is patterned to form trenches 197 on opposite sides of the gate structure 240, and then the CESL 190 is patterned to expose the epitaxial structures 180. In some embodiments, multiple etching processes are performed to pattern the ILD 195 and the CESL 190. The etching processes include dry etching process, wet etching process, or combinations thereof.

Contacts 260 are then formed in the trenches 197. As such, the contacts 260 are respectively electrically connected to the epitaxial structures 180. In some embodiments, the contacts 260 may be made of metal, such as W, Co, Ru, Al, Cu, or other suitable materials. After the deposition of the contacts 260, a planarization process, such as a chemical mechanical planarization (CMP) process, may be then performed. As such, top surfaces of the contacts 260 and the top surface of the ILD 195 are substantially coplanar. In some embodiments, metal alloy layers (such as silicide) may be formed between the contacts 260 and the epitaxial structures 180. Further, barrier layers may be formed in the trenches 197 before the formation of the contacts 260. The barrier layers may be made of TiN, TaN, or combinations thereof.

In FIGS. 14A-14C, the semiconductor device includes the semiconductor fins 112, the semiconductive protection layers 210, the oxidation layers 220, the gate structure 240, and the source/drain epitaxial structures 180. Each of the semiconductor fins 112 includes the top portion 112a and the bottom portion 112b. At least the top portion 112a includes germanium, and may be referred to as a Ge-containing channel layer. That is, the top portion 112a of the semiconductor fins 112 is a germanium-containing layer. In some other embodiments, a germanium concentration of the top portion 112a is higher than a germanium concentration of the bottom portion 112b. In some embodiments, single germanium layer (more or less) is formed near the top surface of the top portion 112a of the semiconductor fins 112. That is, the top surface of the top portion 112a has the highest germanium concentration among the top portion 112a.

The semiconductive protection layers 210 is over a channel portion of the top portion 112a of the semiconductor fin 112. The top portion 112a of the semiconductor fin 112 is thicker than the semiconductive protection layers 210. The semiconductive protection layers 210 may be a germanium-free layer, such as a silicon layer. That is, a germanium concentration in the semiconductive protection layers 210 is lower than a germanium concentration in the top portion 112a of the semiconductor fin 112. As mentioned above, the oxidation process is performed to remove germanium atoms in the semiconductive protection layers 210, such that the silicon components of the semiconductive protection layers 210 can be purified. Further, the annealing process is performed to remove germanium atoms in the oxidation layer 235, such that the oxidation layer 235 includes (mainly) SiOx, and may be germanium-free. In some embodiments, the semiconductive (Si) protection layer 210 has the thickness T1" (see FIG. 11B) in a range of about 1 angstrom to about 27 angstroms, such that the effective conduction band of Si moves to higher energy level due to the quantization effect. The small conduction band offset between the Si protection layer 210 and the SiGe channel (i.e., the top portion 112a in this case) allows larger amount of electrons distribute in the SiGe channel with higher electron mobility.

Figure 15B:
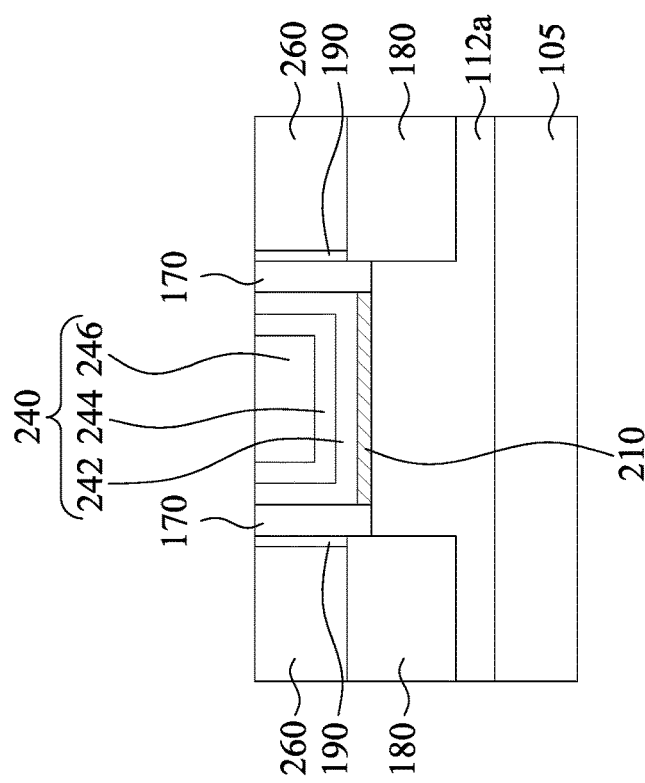
FIG. 15B is a cross-sectional view taken along a lengthwise direction of a channel of the semiconductor device in accordance with some embodiments of the present disclosure.
Figure 15A:
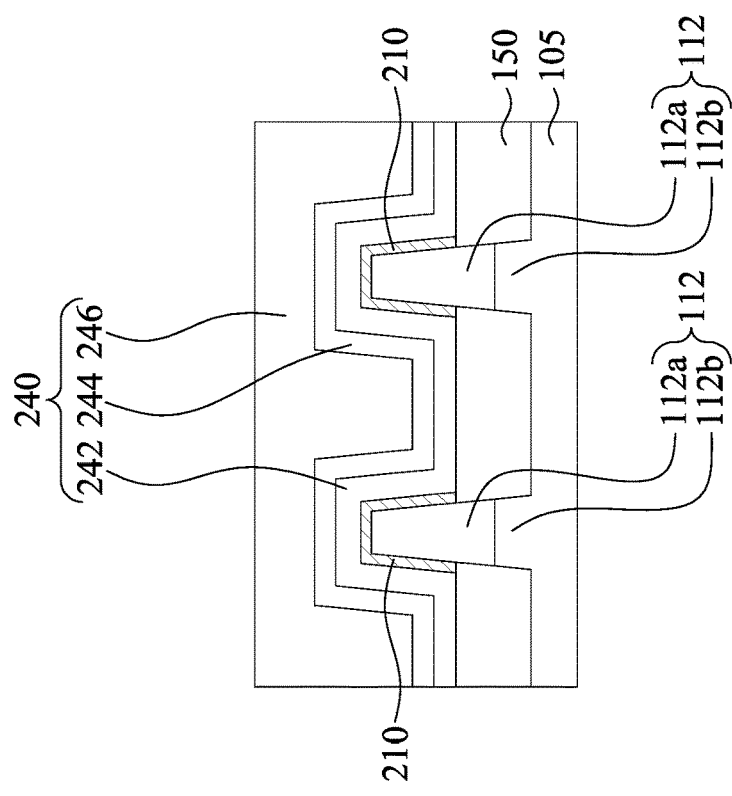
FIG. 15A is a cross-sectional view taken along a lengthwise direction of a gate structure of a semiconductor device in accordance with some embodiments of the present disclosure.

FIG. 15A is a cross-sectional view taken along a lengthwise direction of a gate structure of a semiconductor device in accordance with some embodiments of the present disclosure, and FIG. 15B is a cross-sectional view taken along a lengthwise direction of a channel (e.g., a semiconductor fin) of the semiconductor device in accordance with some embodiments of the present disclosure. The difference between the semiconductor device of FIGS. 15A-15B and the semiconductor device of FIGS. 14A-14C pertains to the oxidation layer 235. In FIGS. 15A and 15B, the oxidation layer 235 (see FIGS. 14B and 14C) is removed prior to the formation of the gate structure 240. As such, the gate dielectric layer 242 of the gate structure 240 is in contact with the semiconductive protection layer 210. Other relevant structural/fabrication details of the semiconductor device of FIGS. 15A-15B are all the same as or similar to the semiconductor device of FIGS. 14A-14C, and, therefore, a description in this regard will not be repeated hereinafter.

FIGS. 16A-29C illustrate a method for manufacturing a semiconductor device at various stages in accordance with some embodiments of the present disclosure. In some embodiments, the semiconductor device shown in FIGS. 16A-29C may be intermediate devices fabricated during processing of an integrated circuit (IC), or a portion thereof, that may include static random access memory (SRAM), logic circuits, spintronic devices, passive components and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

FIGS. 16A, 17-23A, and 28-29A are perspective views of some embodiments of the semiconductor device at intermediate stages during fabrication. FIGS. 23B, 24A, 25A, 26A, 27A, and 29B are cross-sectional views of some embodiments of the semiconductor device at intermediate stages during fabrication along a first cut (e.g., cut B-B), which is along a lengthwise direction of a gate structure. FIGS. 23C and 29C are cross-sectional views of some embodiments of the semiconductor device at intermediate stages during fabrication along a second cut (e.g., cut C-C), which is along a lengthwise direction of a channel (e.g., a nanowire).

Figure 16B:
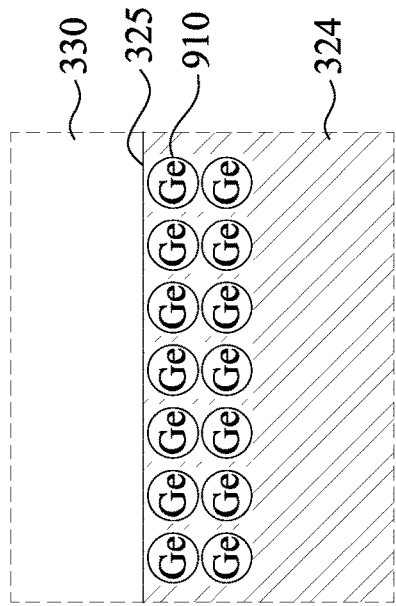
Figure 16A:
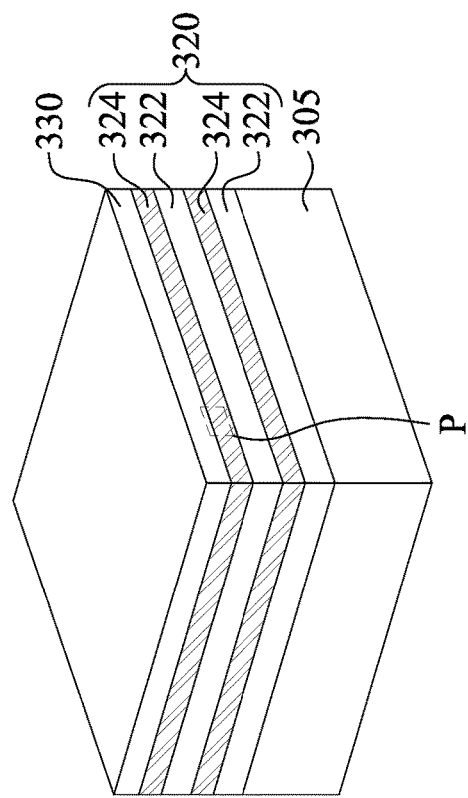

Reference is made to FIGS. 16A and 16B, where FIG. 16B is an enlarged cross-sectional view of area P in FIG. 16A. A substrate 305 is provided. In some embodiments, the substrate 305 includes silicon (Si), germanium (Ge), gallium arsenide (GaAs), Indium phosphide (InP), or other appropriate semiconductor materials. In some embodiments, the substrate 305 may include a semiconductor-on-insulator (SOI) structure such as a buried dielectric layer. Also alternatively, the substrate 305 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 305 may include any of a variety of substrate structures and materials.

A stacked structure 320 is formed on the substrate 305 through epitaxy, such that the stacked structure 320 forms crystalline layers. The stacked structure 320 includes first semiconductor layers 322 of a first composition interposed by second semiconductor layers 324 a second composition. The first semiconductor layers 322 and the second semiconductor layers 324 are made of materials having different lattice constants, and may include one or more layers of Si, Ge, SiGe, GeSn, GaAs, InAs, InSb, GaP, GaSb, InAlAs, InGaAs, GaSbP, GaAsSb or InP. In some embodiments, the first semiconductor layers 322 and the second semiconductor layers 324 are made of Si, a Si compound, SiGe, Ge or a Ge compound. The first and second compositions can be different. In some other embodiments, the first semiconductor layers 322 and the second semiconductor layers 324 are formed by using a deposition process, such as molecular beam epitaxy (MBE), chemical vapor deposition (CVD), physical vapor deposition (PVD), atomic layer deposition (ALD), or other suitable deposition processes.

In some embodiments, the first semiconductor layers 322 are Si and the second semiconductor layers 324 are SiGe. However, other embodiments are possible including those that provide for a first composition and a second composition having different oxidation rates and/or etch selectivity. For example, the first semiconductor layers 322 and the second semiconductor layers 324 are both SiGe layers but with different germanium concentrations. In FIG. 16A, two layers of the first semiconductor layers 322 and two layers of the second semiconductor layers 324 are disposed. However, the numbers of the layers are not limited to one, and may be one or 3-10 layers of each of the first and second semiconductor layers are formed. By adjusting the numbers of the stacked layers, a driving current of the GAA FET device can be adjusted.

The second semiconductor layers 324 or portions thereof may form nanostructure channel(s) of nanostructure transistors. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are nanosheets, nanowires, nanoslabs, or nanorings, depending on their geometry. The use of the second semiconductor layers 324 to define a channel or channels of a device is further discussed below.

As shown in FIG. 16B, in the second semiconductor layers 324, some of the germanium atoms 910 may diffuse to the top surfaces 325 of the second semiconductor layers 324 to form few layers (e.g., two layers) of germanium layers. That is, a germanium concentration near the top surface 325 of the second semiconductor layer 324 is higher than a germanium concentration in the second semiconductor layer 324. The germanium layers near the top surfaces 325 of the second semiconductor layers 324 may be substantially pure germanium layers.

Next, a mask layer 330 is formed on the stacked structure 320. The manufacturing processes and/or materials of the mask layer 330 are similar to or the same as the mask layer 130 shown in FIG. 1A. Therefore, a description in this regard will not be repeated hereinafter.

Figure 17:
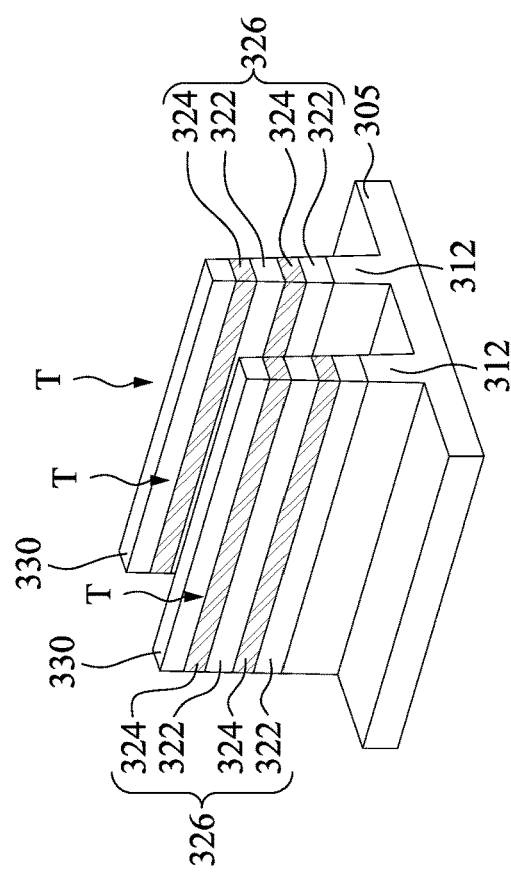

Reference is made to FIG. 17. The stacked structure 320 (see FIG. 16A) is patterned into fin structures 326 and trenches T. The fin structures 326 may serve as active regions (e.g., channels and source/drain features) of transistors. The number of the fin structures 326 is not limited to, and may be as small as one and three or more. In some embodiments, one or more dummy fin structures are formed on both sides of the fin structures 326 to improve pattern fidelity in the patterning operations.

The trenches T extend into the substrate 305, and have lengthwise directions substantially parallel to each other. The trenches T form base portions 312 in the substrate 305, where the base portions 312 protrude from the substrate 305, and the fin structures 326 are respectively formed above the base portions 312 of the substrate 305.

Figure 18:
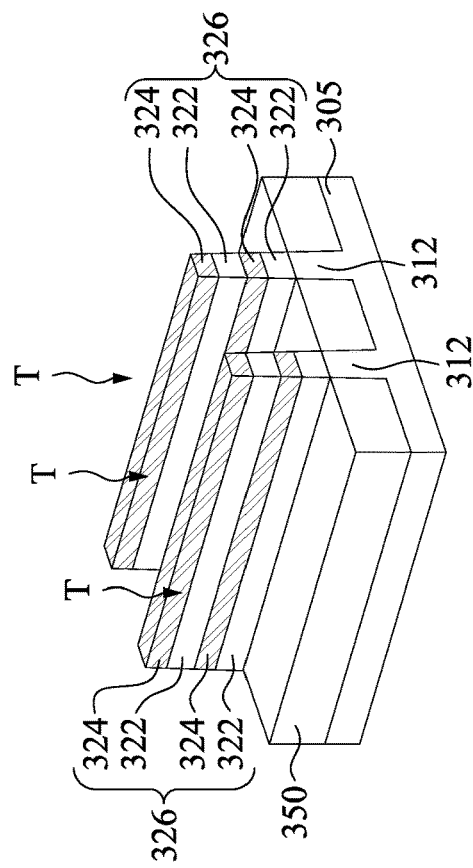

Reference is made to FIG. 18. Isolation structures 350, which may be shallow trench isolation (STI) regions, are formed in the trenches T. The formation may include filling the trenches T with a dielectric layer(s), for example, using flowable chemical vapor deposition (FCVD), and performing a chemical mechanical polish (CMP) to level the top surface of the dielectric material with the top surface of the topmost second semiconductor layer 324. The isolation structures 350 are then recessed. The top surface of the resulting isolation structures 350 may be leveled with the bottom surface of the first semiconductor layer 322, or may be lower than the bottom surface of the first semiconductor layer 322. The isolation structures 350 may be a dielectric material, such as silicon oxide, silicon nitride, silicon oxynitride, SiCN, $SiC_xO_yN_z$, or combinations thereof.

Figure 19:
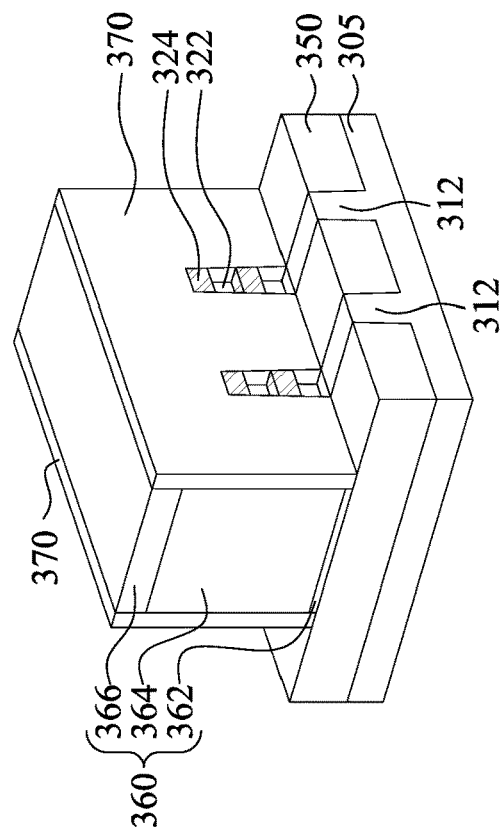

Reference is made to FIG. 19. At least one dummy gate structure 360 is formed above the fin structures 326 and the isolation structures 350. The dummy gate structure 360 includes a dummy gate dielectric layer 362, a dummy gate layer 364, and a mask layer 366 formed over the dummy gate layer 364. Subsequently, gate spacers 370 are respectively formed on sidewalls of the dummy gate structure 360. The manufacturing processes and/or materials of the dummy gate structure 360 and the gate spacers 370 are similar to or the same as the dummy gate structure 160 and the gate spacers 170 shown in FIGS. 4 and 5, respectively. Therefore, a description in this regard will not be repeated hereinafter.

Figure 20:
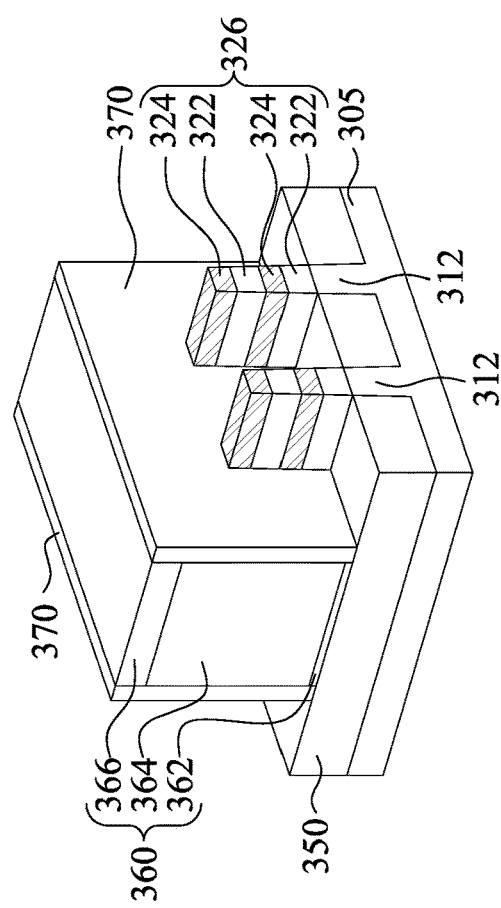

Reference is made to FIG. 20. The exposed portions of the fin structures 326 are removed by using a strained source/drain (SSD) etching process. The SSD etching process may be performed in a variety of ways. In some embodiments, the SSD etching process may be performed by a dry chemical etch with a plasma source and a reaction gas. In some other embodiments, the SSD etching process may be performed by a wet chemical etch. In yet some other embodiments, the SSD etch step may be performed by a combination of a dry chemical etch and a wet chemical etch.

Subsequently, the first semiconductor layers 322 are horizontally recessed (etched) so that the second semiconductor layers 324 laterally extend past opposite end surfaces of the first semiconductor layers 322. In some embodiments, end surfaces of the first semiconductor layers 322 may be substantially vertically aligned with the side surfaces of the gate spacer 370.

Figure 21:
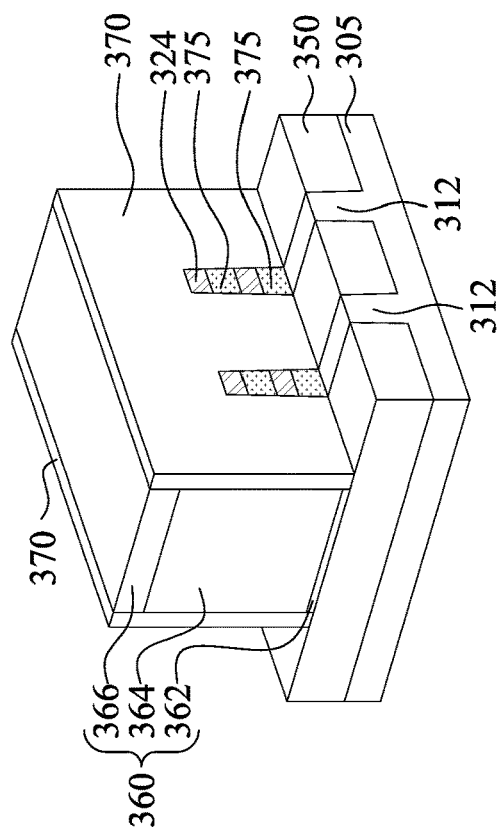

Reference is made to FIG. 21. After the first semiconductor layers 322 (see FIG. 20) are horizontally recessed, inner spacers 375 are formed on the recessed surfaces of the first semiconductor layers 322. Formation of the inner spacer 375 includes depositing an inner spacer material layer (e.g., silicon nitride), followed by etching back the inner spacer material layer by an anisotropic etching process, to remove the inner spacer material layer from the substrate 310. In some embodiments, the inner spacers 375 include insulating material such as silicon nitride or the like.

Figure 22:
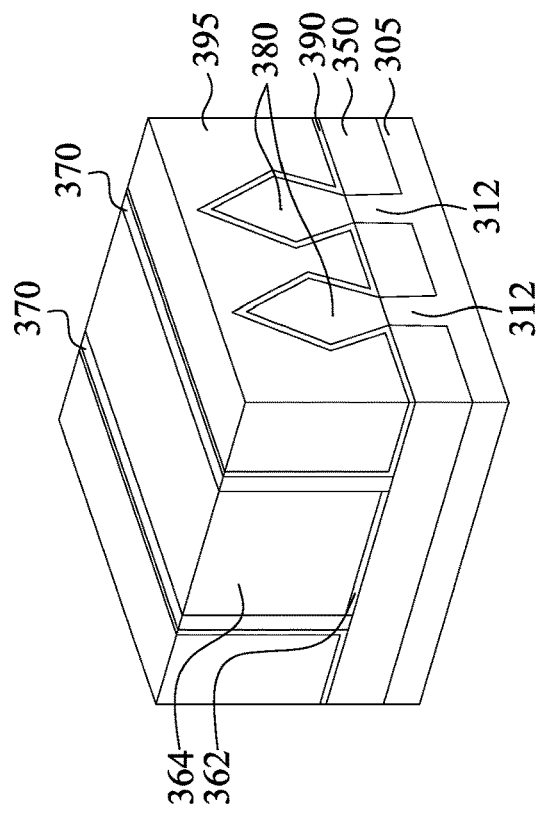

Reference is made to FIG. 22. Epitaxial structures 380, which are referred to as source/drain regions, are epitaxially grown from the exposed base portions 312. The manufacturing processes and/or materials of the epitaxial structures 380 are similar to or the same as the epitaxial structures 180 shown in FIG. 6, and, therefore, a description in this regard will not be repeated hereinafter.

A contact etch stop layer (CESL) 390 is conformally formed over the epitaxial structures 380, and an interlayer dielectric (ILD) 395 is then formed on the CESL 390. After a CMP process, the mask layer 366 (see FIG. 21) is removed, and the dummy gate layer 364 is exposed. The manufacturing processes and/or materials of the CESL 390 and the ILD 395 are similar to or the same as the CESL 190 and the ILD 195 shown in FIG. 7, and, therefore, a description in this regard will not be repeated hereinafter.

Figure 23B:
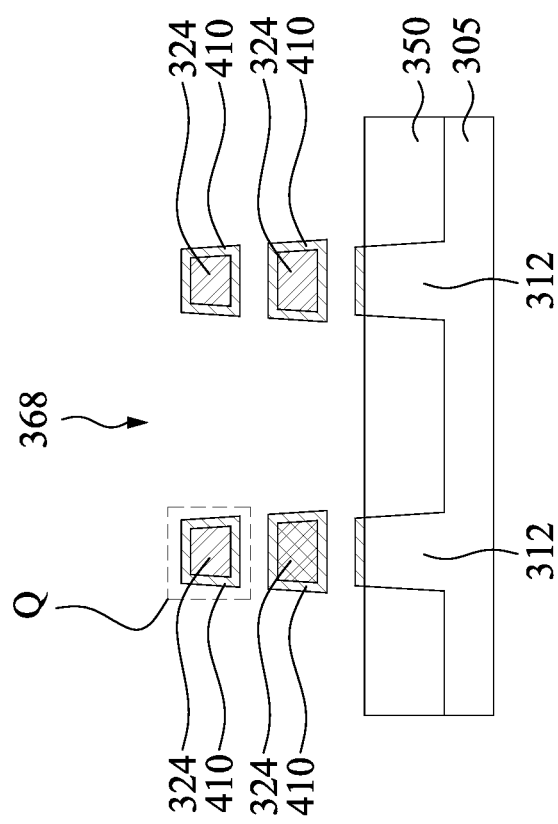
Figure 23A:
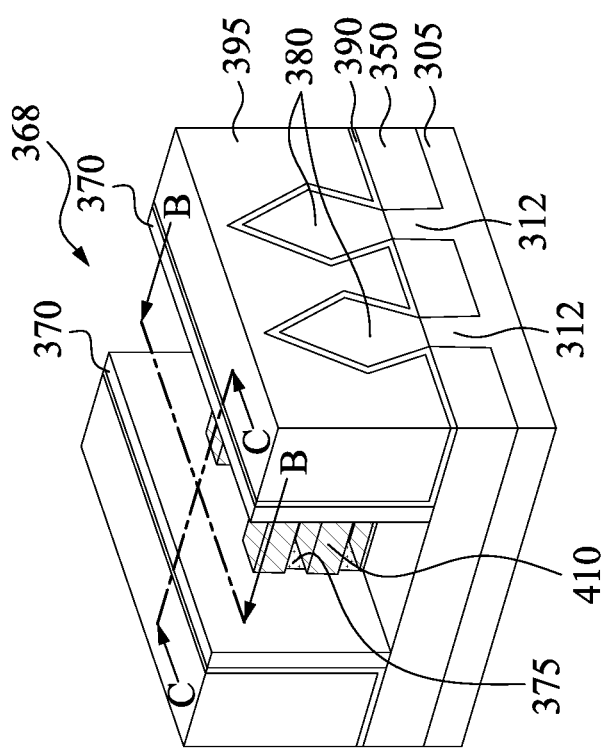
Figure 23D:
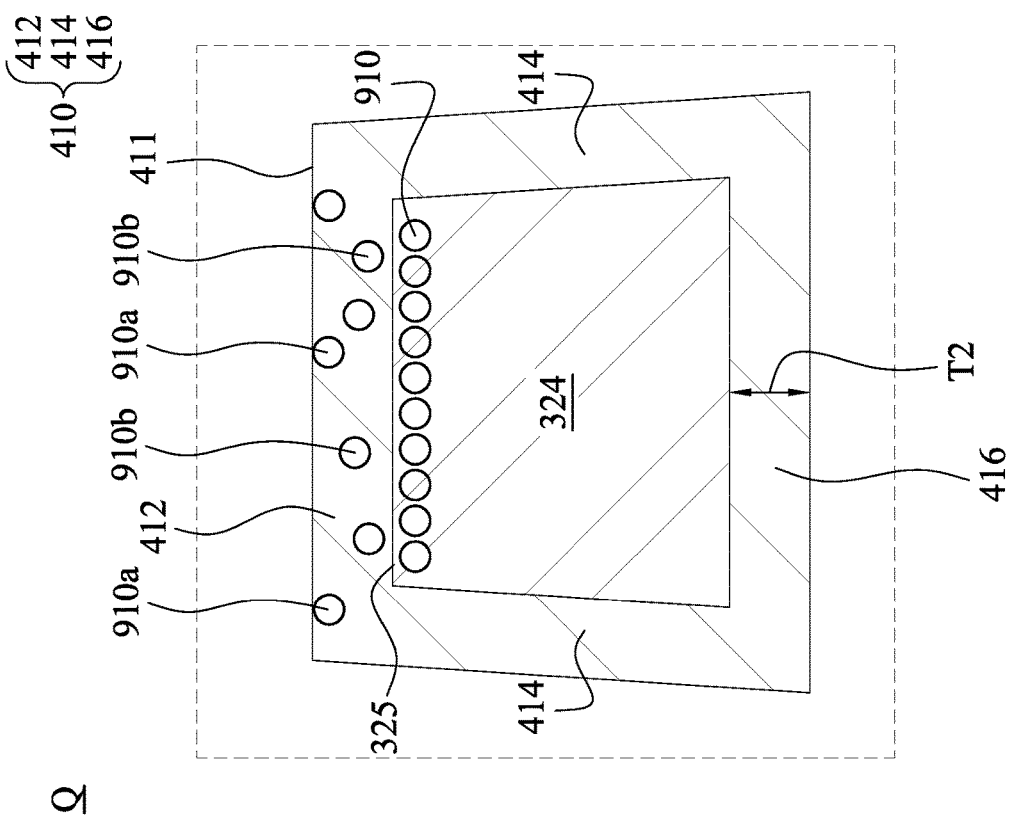
Figure 23C:
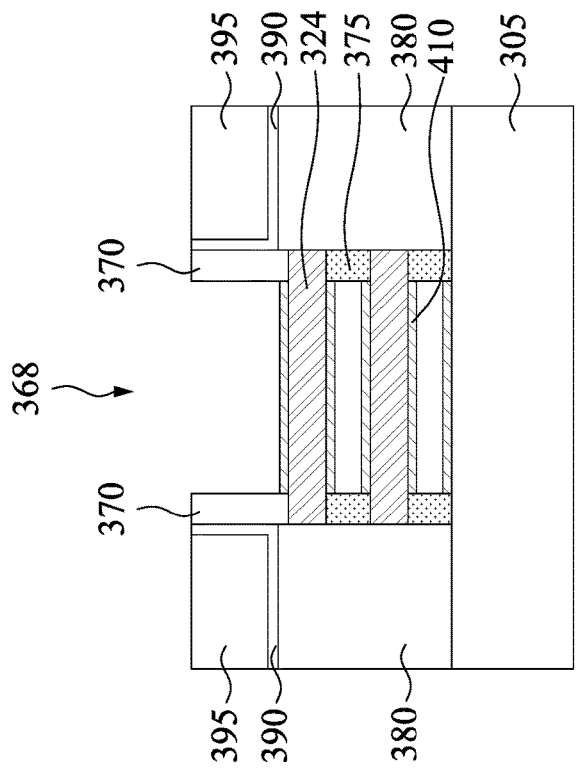

Reference is made to FIGS. 23A-23C, where FIG. 23B is a cross-sectional view taken along line B-B of FIG. 23A, and FIG. 23C is a cross-sectional view taken along line C-C of FIG. 23A. The dummy gate layer 364 and the dummy gate dielectric layer 362 (see FIG. 22) are then removed. Further, the first semiconductor layers 322 (see FIG. 20) are also removed, thereby forming a gate trench 368 between the gate spacers 370 (or between the inner spacers 375) and exposing the second semiconductor layers 324. The ILD 395 protects the epitaxial structures 380 during the removal of the dummy gate layer 364, the dummy gate dielectric layer 362, and the first semiconductor layers 322. The dummy gate layer 364, the dummy gate dielectric layer 362, and the first semiconductor layers 322 can be removed using plasma dry etching and/or wet etching.

Semiconductive protection layers (e.g., silicon-containing protection layer) 410 are formed to wrap around the second semiconductor layers 324, respectively. In some embodiments, the semiconductive protection layers 410 are formed by a suitable process such as molecular beam epitaxy (MBE) processes, atomic layer deposition (ALD) processes, plasma enhanced ALD (PEALD) processes, chemical vapor deposition (CVD) processes, physical vapor deposition (PVD) processes, or other suitable processes.

The semiconductive protection layer 410 includes semiconductive materials such as silicon, e.g., monocrystalline silicon. In some embodiments, the semiconductive protection layer 410 may be a pure silicon layer. The semiconductive protection layer 410 may also be a substantially pure silicon layer, for example, with a germanium atomic percentage lower than about 20 percent, such that the semiconductive protection layer 410 is substantially free of germanium. In some embodiments, the semiconductive protection layer 410 has a thickness T2 (see FIG. 23D) in a range of about 1 angstrom to about 30 angstrom.

In some embodiments, the structure in FIG. 22 may undergo a deposition process in the deposition apparatus 810 of the fabrication tool 800 shown in FIG. 44 to form the semiconductive protection layer 410. For example, a wafer including the structure of FIG. 22 is inserted into the load lock chamber 820. After a vacuum process is performed in the load lock chamber 820, the wafer including the structure of FIG. 22 is transferred from the load lock chamber 820 to the deposition apparatus 810 to form the semiconductive protection layer 410.

FIG. 23D is an enlarged view of area Q in FIG. 23B. As shown in FIG. 23D, during the deposition of the semiconductive protection layer 410, germanium atoms 910 near the top surface 325 of the second semiconductor layer 324 diffuse to the semiconductive protection layer 410. Some germanium atoms 910a diffuse to the top surface 411 of a top portion 412 of the semiconductive protection layer 410 above the second semiconductor layers 324, and some germanium atoms 910b diffuse inside the portion 412 of the semiconductive protection layer 410. In the meantime, the amount of the germanium atoms 910 in the second semiconductor layer 324 is reduced. For example, single germanium layer or less remains in the second semiconductor layer 324.

In some embodiments, side portions 214 and a bottom portion 216 of the semiconductive protection layer 410 on the sidewalls and the bottom surface of the top second semiconductor layer 324 are free of germanium. That is, an amount of the top portion 412 of the semiconductive protection layer 410 is greater than an amount of the side portions 214 and the bottom portion 216 of the semiconductive protection layer 410.

Reference is made to FIGS. 24A-24B, where FIG. 24B is an enlarge view of the area Q in FIG. 24A. An oxidation process OX3 is performed on the semiconductive protection layer 410, such that a portion of the semiconductive protection layer 410 is oxidized to be an oxidation layer 420. In some embodiments, the structure in FIG. 23A may undergo an oxidation process OX3 in the oxidation apparatus 830 of the fabrication tool 800 shown in FIG. 44 to form the oxidation layer 420. The oxidation process OX3 may be similar to the oxidation process OX1 shown in FIG. 45, and, therefore, a description in this regard will not be repeated hereinafter.

Reference is made to FIGS. 23D and 24B. During the oxidation process OX3 shown in FIGS. 24A and 45, an oxidation layer 420 is formed on the outer surface of the semiconductive protection layer 410. Since portions of the semiconductive protection layer 410 are oxidized, the remaining semiconductive protection layer 410 has a thickness T2' smaller than the thickness T2 shown in FIG. 23D. The semiconductive protection layer 410 may also be a substantially pure silicon layer, for example, with a germanium atomic percentage lower than about 20 percent, such that the semiconductive protection layer 410 is substantially free of germanium.

As mentioned above, the semiconductive protection layer 410 may include silicon, such that the oxidation layer 420 includes SiOx, where the silicon atoms of the SiOx may form 1+ to 4+ charge states, depending on the flow rate of the oxygen-containing gases. Furthermore, as shown in FIGS. 23D and 24B, the germanium atoms 910a are oxidized to be GeOx in the oxidation layer 420. That is, the oxidization layer 420 includes SiOx and GeOx.

As mentioned above, the processing temperature of the oxidation process OX3 can be adjusted/tuned such that the oxidation reacts mainly on the surface 411 of the semiconductive protection layer 410, or on the outmost single layer of the semiconductive protection layer 410. As such, almost all of the germanium atoms 910a on the surface 411 can be oxidized.

Figure 25B:
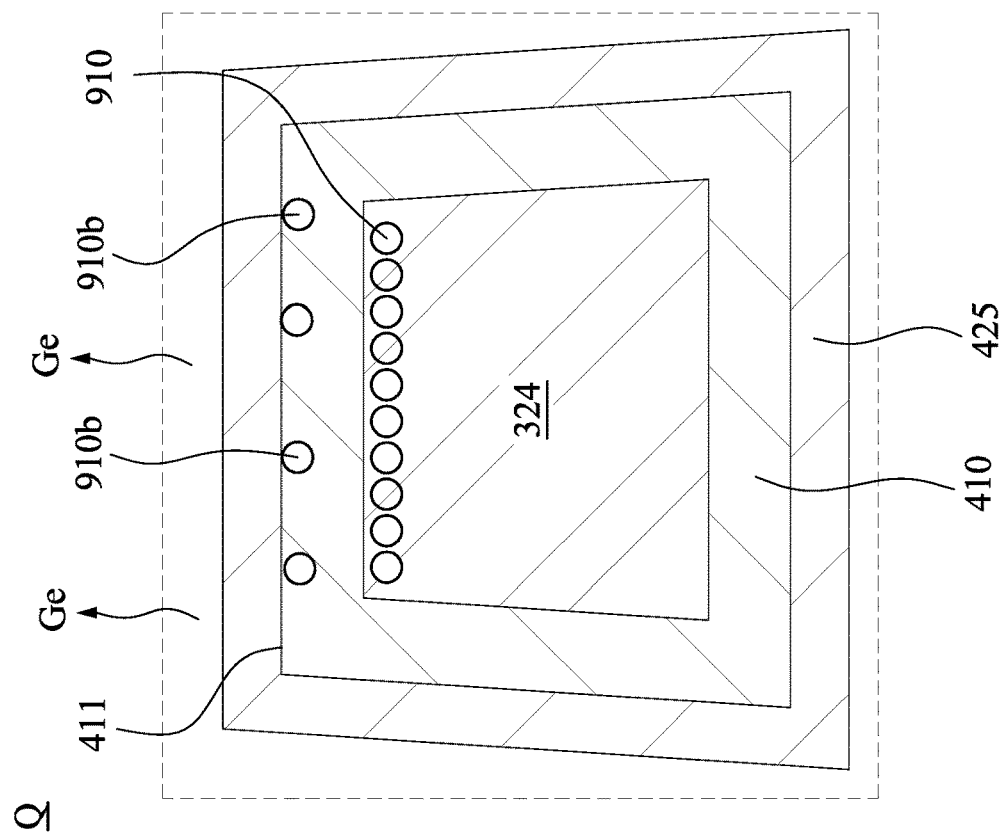
Figure 25A:
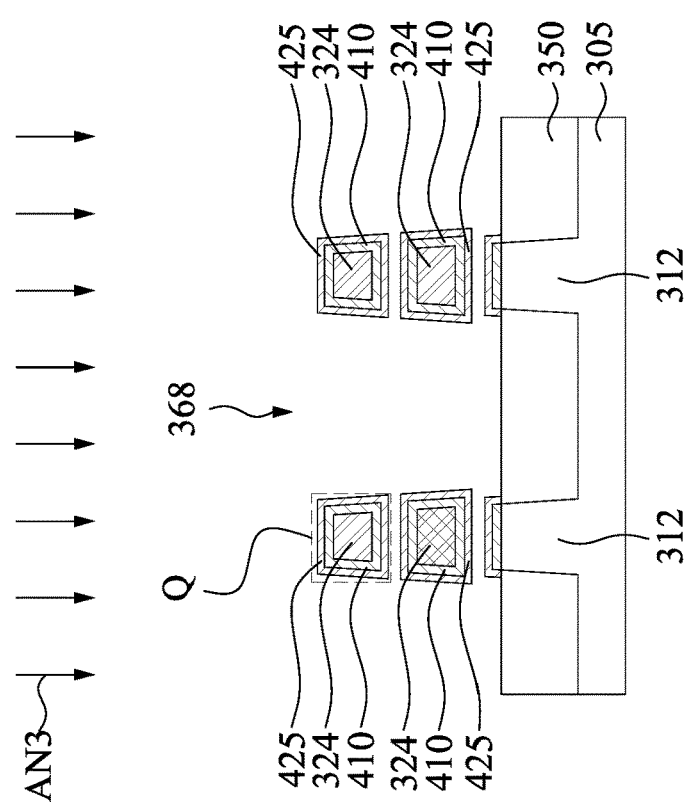

Reference is made to FIGS. 25A-25B, where FIG. 25B is an enlarge view of the area Q in FIG. 25A. An annealing process AN3 is performed on the oxidation layer 420 to evaporate the germaniums in the oxidation layer 420, and the remaining oxidation layer is oxidation layer 425. In some embodiments, the structure in FIG. 24A may undergo an annealing process AN3 in the annealing apparatus 840 of the fabrication tool 800 shown in FIG. 44. The annealing process AN3 may be similar to the annealing process AN1 shown in FIG. 46, and, therefore, a description in this regard will not be repeated hereinafter.

Reference is made to FIGS. 24B and 25B. During the annealing process AN3 shown in FIGS. 25A and 46, Ge—O bonds are broken such that germanium atoms are escaped from the oxidation layer 420. The oxygens with the broken bonds may migrate to Si region and may be reconnected to Si or SiOx to form the oxidation layer 425. Therefore, an amount of GeOx in the oxidation layer 425 is reduced while an amount of SiOx in the oxidation layer 425 is increased. As mentioned above, since the processing temperature (or annealing temperature) of the annealing process AN3 is lower than a temperature that breaks Si—O bonds, none or rarely Si—O bonds is broken during the annealing process AN3. As such, the oxidation layer 425 includes mainly SiOx and is substantially free from GeOx.

Further, the annealing temperature triggers the diffusion of the germanium atoms 910b, such that the germanium atoms 910b in the semiconductive protection layer 410 diffuse to the top surface of the semiconductive protection layer 410 as shown in FIG. 25B.

Reference is made to FIGS. 26A-26B, where FIG. 26B is an enlarge view of the area Q in FIG. 26A. Another oxidation process OX4 is optionally performed on the semiconductive protection layers 410, such that the oxidation layer 425 is thicken to be an oxidation layer 430. In some embodiments, the structure in FIG. 25A may undergo an oxidation process OX4 in the oxidation apparatus 830 of the fabrication tool 800 shown in FIG. 44 to form the oxidation layer 430. The oxidation process OX4 may be similar to the oxidation process OX1 shown in FIG. 45, and, therefore, a description in this regard will not be repeated hereinafter.

Reference is made to FIGS. 25B and 26B. During the oxidation process OX4 shown in FIGS. 26A and 45, the oxidation layer 430 is formed on the outer surface of the semiconductive protection layer 410. Since portions of the semiconductive protection layer 410 are oxidized, the remaining semiconductive protection layer 410 has a thickness TV smaller than the thickness T2' shown in FIG. 24B. The semiconductive protection layer 410 may also be a substantially pure silicon layer, for example, with a germanium atomic percentage lower than about 20 percent, such that the semiconductive protection layer 410 is substantially free of germanium.

As mentioned above, the oxidation layer 425 mainly includes SiOx. Further, the germanium atoms 910b diffuse to the top surface 411 of the semiconductive protection layer 410, such that the oxidation process OX4 oxidizes the germanium atoms 910b to be GeOx in the oxidation layer 430. That is, the oxidization layer 430 includes a large amount of SiOx and a small amount of GeOx.

The processing temperature of the oxidation process OX4 can be adjusted/tuned such that the oxidation reacts mainly on the surface 411 of the semiconductive protection layer 410, or on the outmost single layer of the semiconductive protection layer 410. As such, almost all of the germanium atoms 910b on the surface 411 can be oxidized. Also, the processing temperature of the oxidation process OX4 is lower than about 500° C. such that the diffusion of germanium atoms 910 can be suppressed.

Figure 27B:
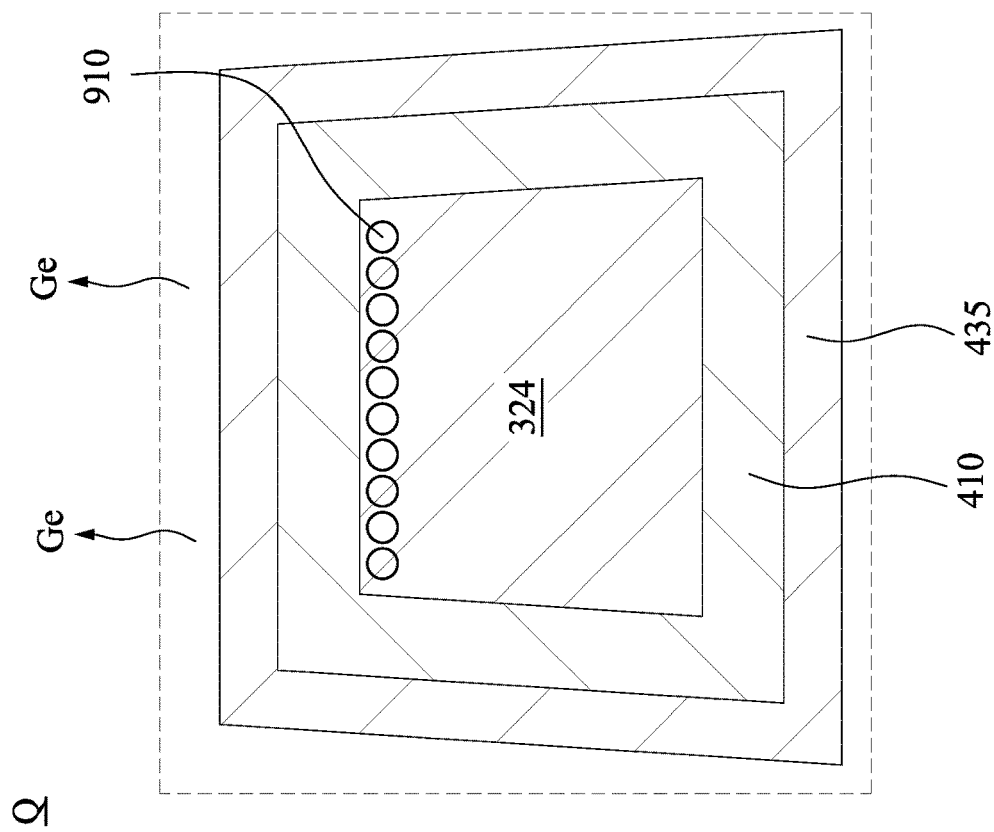
Figure 27A:
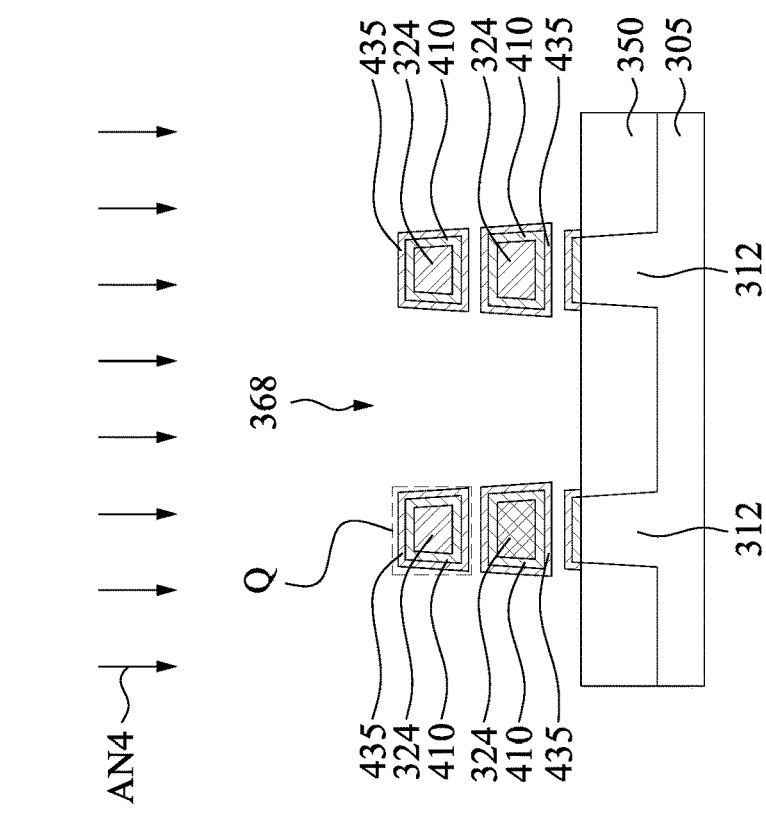

Reference is made to FIGS. 27A-27B, where FIG. 27B is an enlarge view of the area Q in FIG. 27A. Another annealing process AN4 is optionally performed on the oxidation layer 430 to evaporate the germaniums in the oxidation layer 430, and the remaining oxidation layer is oxidation layer 435. In some embodiments, the structure in FIG. 26A may undergo the annealing process AN4 in the annealing apparatus 840 of the fabrication tool 800 shown in FIG. 44. The annealing process AN4 may be similar to the annealing process AN1 shown in FIG. 46, and, therefore, a description in this regard will not be repeated hereinafter.

During the annealing process AN4 shown in FIGS. 27A and 46, Ge—O bonds are broken such that germanium atoms are escaped from the oxidation layer 430. The oxygens with the broken bonds may migrate to Si region and may be reconnected to Si or SiOx to form the oxidation layer 435. Therefore, an amount of GeOx in the oxidation layer 435 is reduced while an amount of SiOx in the oxidation layer 435 is increased. As mentioned above, since the processing temperature (or annealing temperature) of the annealing process AN4 is lower than a temperature that breaks Si—O bonds, none or rarely Si—O bonds is broken during the annealing process AN4. As such, the oxidation layer 235 includes mainly SiOx and is substantially free from GeOx.

One of the oxidation processes (such as the oxidation processes OX3 and OX4) and one of the annealing processes (such as the annealing processes AN3 and AN4) can be referred to as a Ge-removal cycle, and this Go-removal cycle can be repeated many times to remove the germanium atoms in the semiconductive protection layer 410. For example, the wafer including the structure of FIG. 23A undergoes two Ge-removal cycles (FIGS. 24A-27B). In some other embodiments, more than two Ge-removal cycles can be perform to purify the silicon components in the semiconductive protection layer 410.

Figure 28:
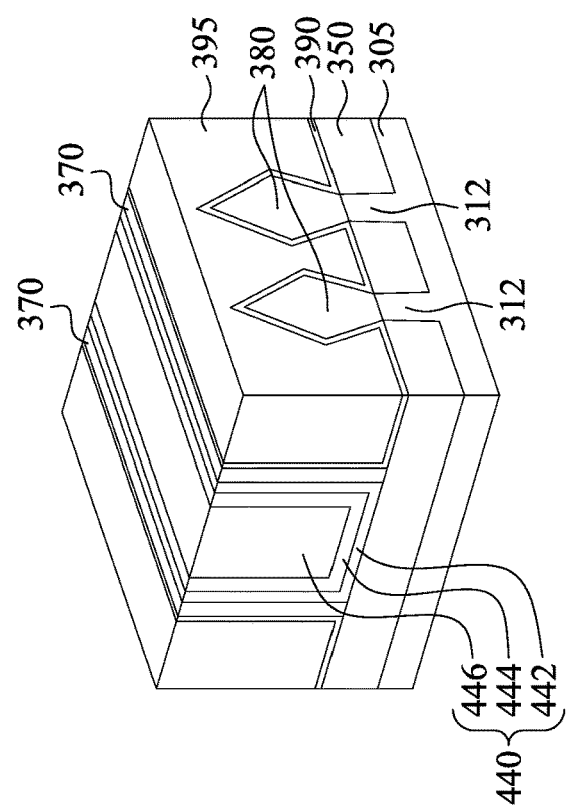

Reference is made to FIG. 28. A gate dielectric layer 442 is conformally formed in the gate trench 368 and surrounds the semiconductive protection layers 420 and the oxidation layers 435 (see FIG. 27A). The gate dielectric layer 442 may be a high-κ dielectric layer having a dielectric constant (κ) higher than the dielectric constant of $SiO_2$, i.e. κ>3.9. The gate dielectric layer 442 may include $LaO_x$, $AlO_x$, $ZrO_x$, TiO, $HfO_x$, $TaO_x$, $GdO_x$, $YO_x$, $ScO_x$, $MgO_x$, $SrTiO_3$ (STO), $BaTiO_3$ (BTO), BaZrO, HfZrO, $ZrSiO_x$, HfLaO, $HfSiO_x$, HfSiON, $LaSiO_x$, $AlSiO_x$, $GdSiO_x$, $YSiO_x$, HfTaO, HfTiO, $(Ba,Sr)TiO_3$ (BST), $Al_2O_3$, $Si_3N_4$, oxynitrides (SiON), or other suitable materials. In some embodiments, the gate dielectric layer 442 is a single layer. In some other embodiments, the gate dielectric layer 442 includes multiple layers, e.g., a $HfO_2$ layer and an $Al_2O_3$ layer above the $HfO_2$ layer. The gate dielectric layer 442 is deposited by suitable techniques, such as ALD, CVD, PVD, MBE, thermal oxidation, combinations thereof, or other suitable techniques.

A gate electrode GE is formed above the gate dielectric layer 442 and fills the gate trench 368. In some embodiments, the gate electrode GE include at least one work function metal layer(s) 444, a fill layer 446, and/or other suitable layers that are desirable in a metal gate stack. The work function metal layer 444 may include n-type and/or p-type work function metal. Exemplary n-type work function metals include Ti, Ta, Ag, TiAl, TaAl, TaAlC, TiAlN, TaC, TiC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer 444 may have multiple layers. The work function metal layer(s) 444 may be deposited by CVD, PVD, electroplating and/or other suitable process. In some embodiments, the fill layer 446 in the metal gate electrodes GE may include tungsten (W), Ni, Mo, Ru, or other suitable conductive materials. The fill layer 446 may be deposited by ALD, PVD, CVD, or other suitable process. The gate dielectric layer 442, the work function metal layer 444, and the fill layer 446 are together referred to as a gate structure 440.

Figure 29A:
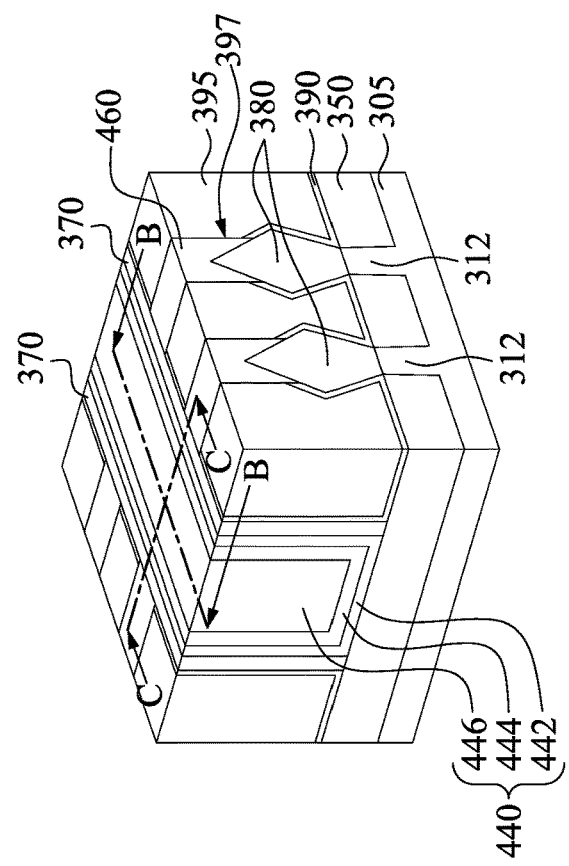
Figures 29B, 29C:
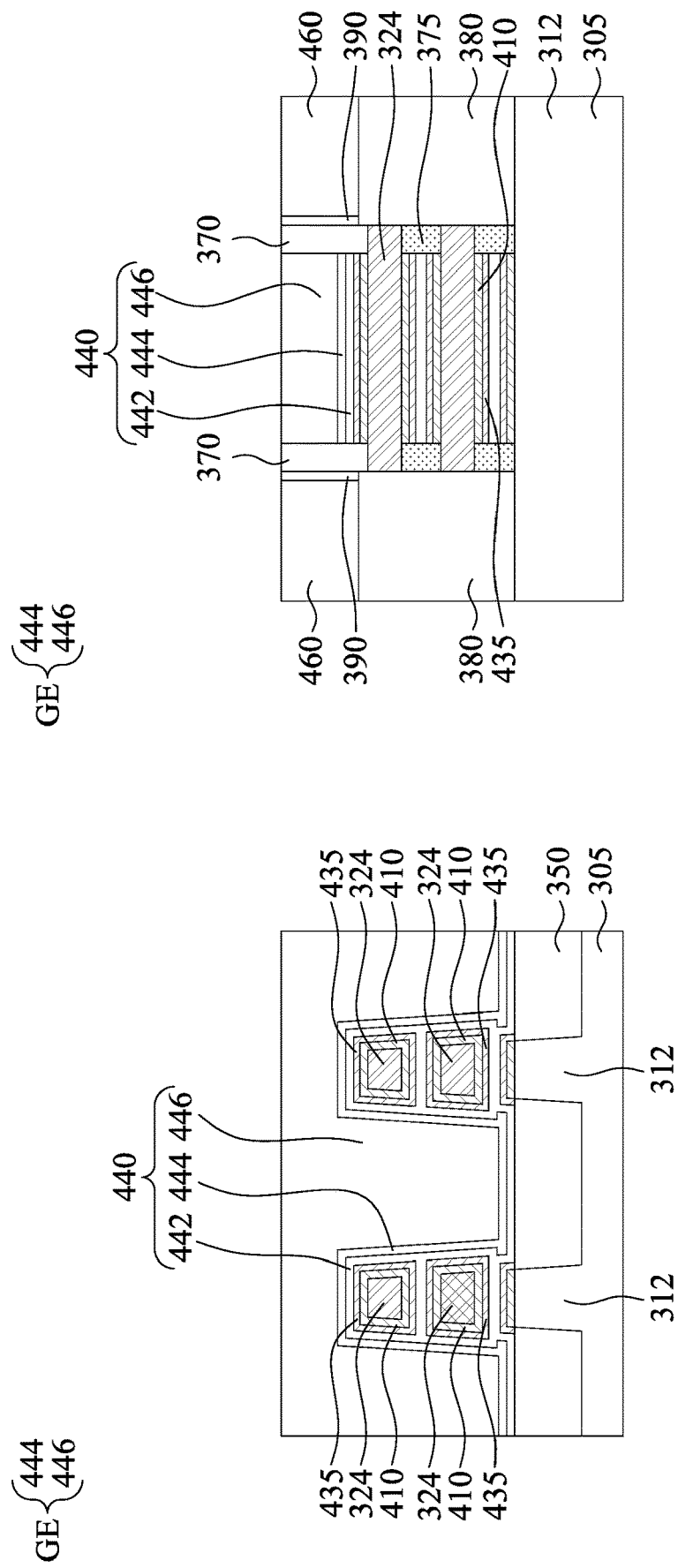

Reference is made to FIGS. 29A-29C, where FIG. 29B is a cross-sectional view taken along line B-B of FIG. 29A, and FIG. 29C is a cross-sectional view taken along line C-C of FIG. 29A. The ILD 395 is patterned to form trenches 397 on opposite sides of the gate structure 440, and then the CESL 390 is patterned to expose the epitaxial structures 380. In some embodiments, multiple etching processes are performed to pattern the ILD 395 and the CESL 390. The etching processes include dry etching process, wet etching process, or combinations thereof.

Contacts 460 are formed in the trenches 397. As such, the contacts 460 are respectively in contact with the epitaxial structures 380. The manufacturing processes and/or materials of the contacts 460 are similar to or the same as the contacts 260 shown in FIGS. 14A-14C, and, therefore, a description in this regard will not be repeated hereinafter.

In FIGS. 29A-29C, the semiconductor device includes the second semiconductor layers (or nanostructure channel layers) 324, the semiconductive protection layers 410, the oxidation layers 420, the gate structure 440, and the source/drain epitaxial structures 380. Each of the second semiconductor layers 324 includes germanium, and may be referred to as a Ge-containing channel layer. That is, the second semiconductor layer 324 is a germanium-containing layer. In some other embodiments, a germanium concentration of the second semiconductor layer 324 is higher than a germanium concentration of the base portion 312. In some embodiments, single germanium layer (more or less) is formed near the top surface of the second semiconductor layer 324. That is, the top surface of the second semiconductor layer 324 has the highest germanium concentration among the second semiconductor layer 324.

The semiconductive protection layers 410 is over a channel portion of the second semiconductor layer 324. The second semiconductor layer 324 is thicker than the semiconductive protection layers 410. The semiconductive protection layers 410 may be a germanium-free layer, such as a silicon layer. That is, a germanium concentration in the semiconductive protection layers 410 is lower than a germanium concentration in the second semiconductor layer 324. As mentioned above, the oxidation process is performed to remove germanium atoms in the semiconductive protection layers 410, such that the silicon components of the semiconductive protection layers 410 can be purified. Further, the annealing process is performed to remove germanium atoms in the oxidation layer 435, such that the oxidation layer 435 includes (mainly) SiOx, and may be germanium-free. In some embodiments, the semiconductive (Si) protection layer 410 has the thickness T2" (see FIG. 26B) in a range of about 1 angstrom to about 27 angstroms.

Figure 30B:
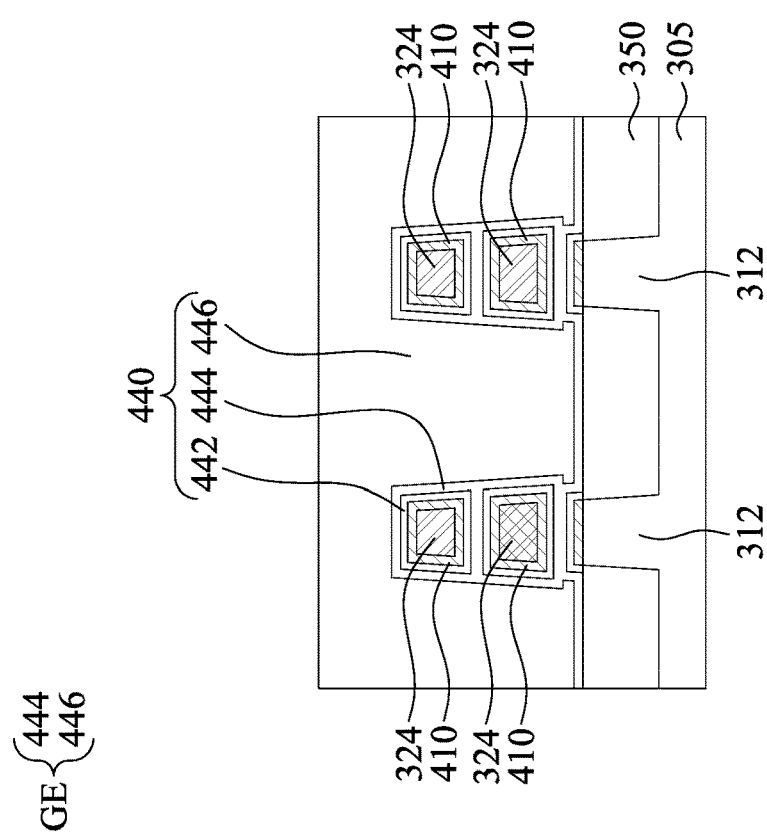
FIG. 30B is a cross-sectional view taken along a lengthwise direction of a channel of a semiconductor device in accordance with some embodiments of the present disclosure.
Figure 30A:
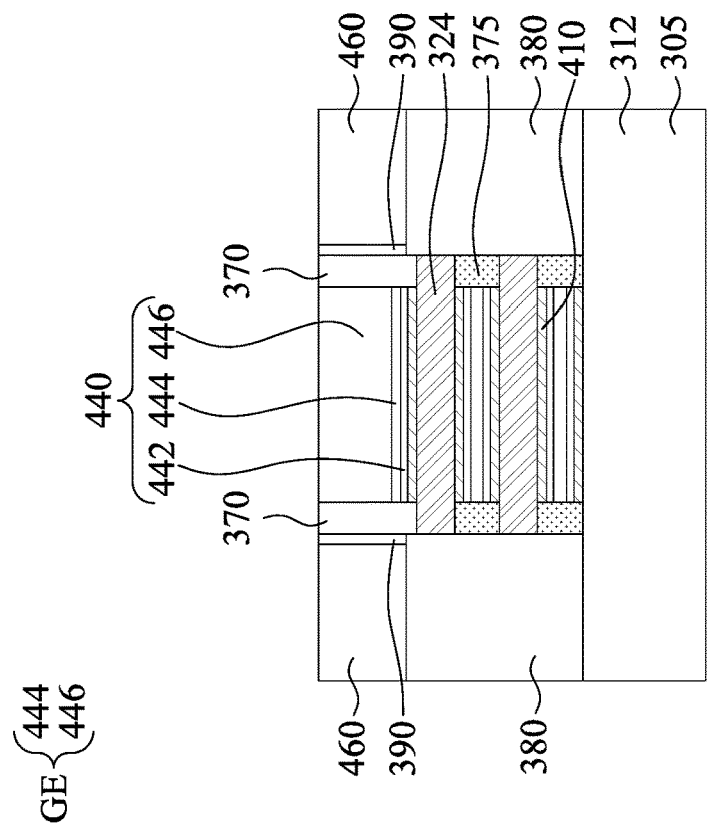
FIG. 30A is a cross-sectional view taken along a lengthwise direction of a gate structure of a semiconductor device in accordance with some embodiments of the present disclosure.

FIG. 30A is a cross-sectional view taken along a lengthwise direction of a gate structure of a semiconductor device in accordance with some embodiments of the present disclosure, and FIG. 30B is a cross-sectional view taken along a lengthwise direction of a channel (e.g., a nanowire) of a semiconductor device in accordance with some embodiments of the present disclosure. The difference between the semiconductor device of FIGS. 30A-30B and the semiconductor device of FIGS. 29A-29C pertains to the oxidation layer 435. In FIGS. 30A and 30B, the oxidation layer 435 (see FIGS. 29B and 29C) is removed prior to the formation of the gate structure 440. As such, the gate dielectric layer 442 of the gate structure 440 is in contact with the semiconductive protection layer 410. Other relevant structural/fabrication details of the semiconductor device of FIGS. 30A-30B are all the same as or similar to the semiconductor device of FIGS. 29A-29C, and, therefore, a description in this regard will not be repeated hereinafter.

FIGS. 31A-42 illustrate a method for manufacturing a semiconductor device at various stages in accordance with some embodiments of the present disclosure. In some embodiments, the semiconductor device shown in FIGS. 31A-42 may be intermediate devices fabricated during processing of an integrated circuit (IC), or a portion thereof, that may include static random access memory (SRAM), logic circuits, spintronic devices, passive components and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIGS. 31A and 31B, where FIG. 31B is an enlarged cross-sectional view of area R in FIG. 31A. A substrate 505 is provided. An epitaxial layer 510 is formed on the substrate 505. A pad layer 520 is formed on the epitaxial layer 510. A mask layer 530 is then formed on the pad layer 520. A dummy mask layer 540 is then formed on the mask layer 530. The manufacturing processes and/or materials of the substrate 505, the epitaxial layer 510, the pad layer 520, the mask layer 530, and the dummy mask layer 540 are similar to or the same as the substrate 105, the epitaxial layer 110, the pad layer 120, the mask layer 130, and the dummy mask layer 140 shown in FIG. 1A, respectively. Therefore, a description in this regard will not be repeated hereinafter.

As shown in FIG. 31B, in the epitaxial layer 510, some of the germanium atoms 910 may diffuse to the top surfaces 511 of the epitaxial layer 510 to form few layers (e.g., two layers) of germanium layers. That is, a germanium concentration near the top surface 511 of the epitaxial layer 510 is higher than a germanium concentration in the epitaxial layer 510. The germanium layers near the top surfaces 511 of the epitaxial layer 510 may be pure germanium layers.

Figure 32:
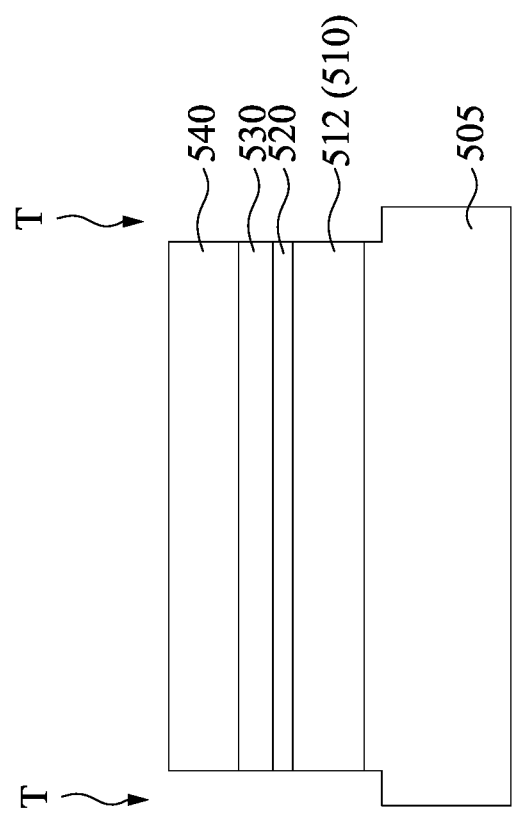

Reference is made to FIG. 32. The dummy mask layer 540 is patterned, and then a plurality of trenches T are formed in the epitaxial layer 510 and the substrate 505 by patterning the mask layer 530, the pad layer 520, the epitaxial layer 510, and the substrate 505 using the patterned dummy mask layer 540 as a mask. The trenches T define an active region 512 therebetween.

Figure 33:
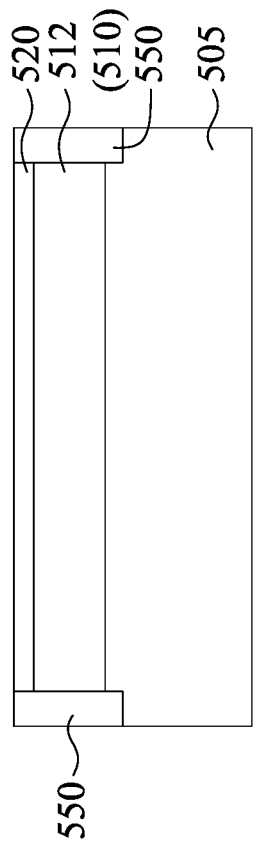

Reference is made to FIG. 33. Isolation structures 550, which may be shallow trench isolation (STI) regions, are formed in the trenches T. The formation may include filling the trenches T with a dielectric layer(s), for example, using flowable chemical vapor deposition (FCVD), and performing an etching process, e.g., a reactive ion etching process, to recess the dielectric material and remove the dummy mask layer 540 and the mask layer 530, such that a top surface of the resulting isolation structures 550 is substantially level with the top surface of the pad layer 520. The isolation structures 550 may be a dielectric material, such as silicon oxide, silicon nitride, silicon oxynitride, SiCN, $SiC_xO_yN_z$, or combinations thereof.

Figure 34:
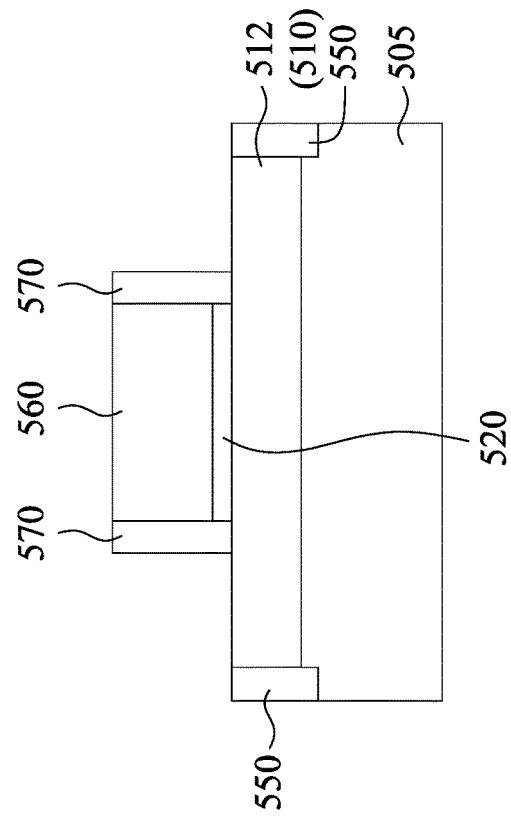

Reference is made to FIG. 34. At least one dummy gate layer 560 is formed above the active region 512. The pad layer 520 is patterned by using the dummy gate layer 560 as an etching mask. Subsequently, gate spacers 570 are respectively formed on sidewalls of the dummy gate layer 560. The manufacturing processes and/or materials of the dummy gate layer 560 and the gate spacers 570 are similar to or the same as the dummy gate layer 164 and the gate spacers 170 shown in FIGS. 4 and 5, respectively. Therefore, a description in this regard will not be repeated hereinafter.

Figure 35:
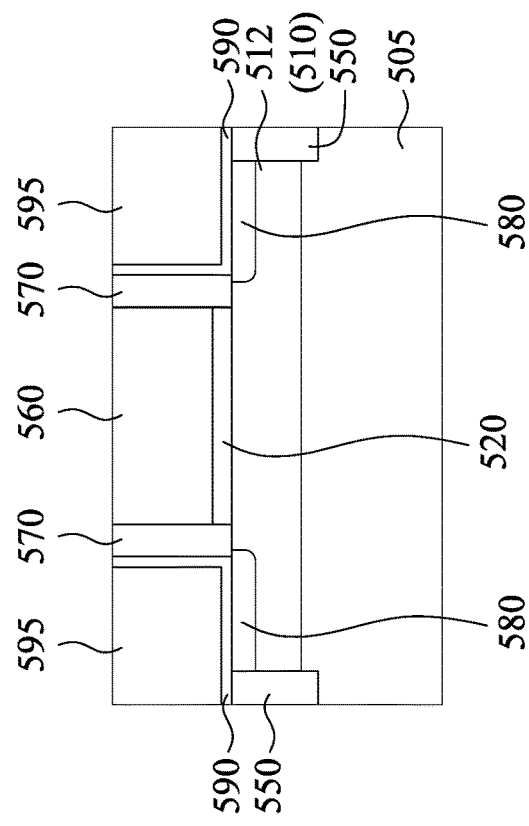

Reference is made to FIG. 35. An implantation process is performed to introduce impurities into the epitaxial layer 510 to form source/drain regions 580, and the dummy gate layer 560 and the gate spacers 570 may act as masks to substantially prevent the impurities from being implanted into other regions of the epitaxial layer 510. The impurities may be n-type impurities or p-type impurities. The n-type impurities may be phosphorus, arsenic, or the like, and the p-type impurities may be boron, $BF_2$, or the like. In some other embodiments, the source/drain regions 580 may be epitaxial structures, and manufacturing method and/or materials thereof may be the same as or similar to the epitaxial structures 180 shown in FIG. 6.

A contact etch stop layer (CESL) 590 is conformally formed over the source/drain regions 580, and an interlayer dielectric (ILD) 595 is then formed on the CESL 590. The manufacturing processes and/or materials of the CESL 590 and the ILD 595 are similar to or the same as the CESL 190 and the ILD 195 shown in FIG. 7, and, therefore, a description in this regard will not be repeated hereinafter.

Figure 36B:
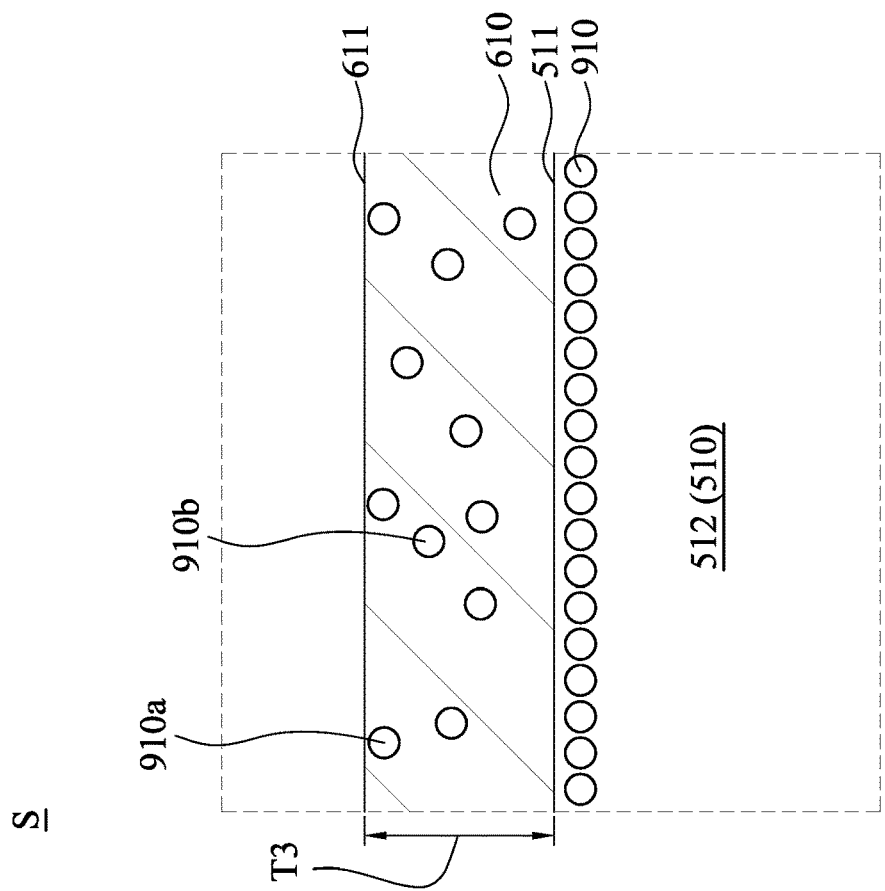
Figure 36A:
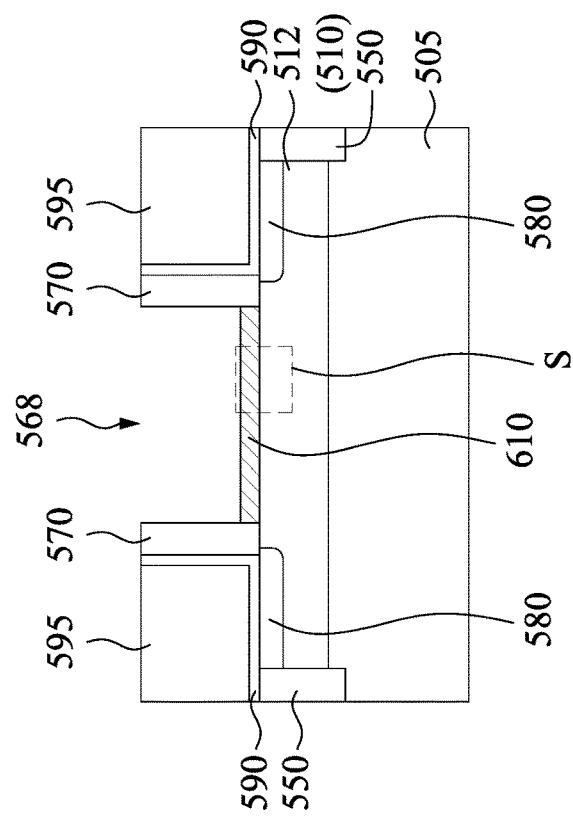

Reference is made to FIG. 36A. Subsequently, a replacement gate (RPG) process scheme is employed. The dummy gate layer 560 and the pad layer 520 (see FIG. 35) are replaced with a metal gate structure 640 (see FIG. 41). Specifically, the dummy gate layer 560 and the pad layer 520 are removed, thereby forming a gate trench 568 between the gate spacers 570 and exposing a channel portion of the substrate 510 (referred to as a semiconductive channel region).

A semiconductive protection layer (e.g., silicon-containing protection layer) 610 is formed above the channel portions of the active region 512. In some embodiments, the semiconductive protection layer 610 is formed by a suitable process such as molecular beam epitaxy (MBE) processes, atomic layer deposition (ALD) processes, plasma enhanced ALD (PEALD) processes, chemical vapor deposition (CVD) processes, physical vapor deposition (PVD) processes, or other suitable processes.

The semiconductive protection layer 610 includes semiconductive materials such as silicon, e.g., monocrystalline silicon. In some embodiments, the semiconductive protection layer 610 may be a pure silicon layer. The semiconductive protection layer 610 may also be a substantially pure silicon layer, for example, with a germanium atomic percentage lower than about 20 percent, such that the semiconductive protection layer 610 is substantially free of germanium. In some embodiments, the semiconductive protection layer 610 has a thickness T3 (see FIG. 36B) in a range of about 1 angstrom to about 30 angstrom.

In some embodiments, the structure in FIG. 35 may undergo a deposition process in the deposition apparatus 810 of the fabrication tool 800 shown in FIG. 44 to form the semiconductive protection layer 610. For example, a wafer including the structure of FIG. 35 is inserted into the load lock chamber 820. After a vacuum process is performed in the load lock chamber 820, the wafer including the structure of FIG. 35 is transferred from the load lock chamber 820 to the deposition apparatus 810 to form the semiconductive protection layer 610.

FIG. 36B is an enlarged view of area S in FIG. 36A. As shown in FIG. 36B, during the deposition of the semiconductive protection layer 610, germanium atoms 910 near the top surface 511 of the epitaxial layer 510 diffuse to the semiconductive protection layer 610. Some germanium atoms 910a diffuse to the top surface 611 of the semiconductive protection layer 610, and some germanium atoms 910b diffuse inside the semiconductive protection layer 610. In the meantime, the amount of the germanium atoms 910 in the epitaxial layer 510 is reduced. For example, single germanium layer or less remains in the epitaxial layer 510.

Reference is made to FIGS. 37A-37B, where FIG. 37B is an enlarge view of the area S in FIG. 37A. An oxidation process OX5 is performed on the semiconductive protection layer 610, such that a portion of the semiconductive protection layer 610 is oxidized to be an oxidation layer 620. In some embodiments, the structure in FIG. 36A may undergo an oxidation process OX5 in the oxidation apparatus 830 of the fabrication tool 800 shown in FIG. 44 to form the oxidation layer 620. The oxidation process OX5 may be similar to the oxidation process OX1 shown in FIG. 45, and, therefore, a description in this regard will not be repeated hereinafter.

Reference is made to FIGS. 36B and 37B. During the oxidation process OX5 shown in FIGS. 37A and 45, an oxidation layer 620 is formed on the top surface 611 of the semiconductive protection layer 610. Since portions of the semiconductive protection layer 610 are oxidized, the remaining semiconductive protection layer 610 has a thickness T3' smaller than the thickness T3 shown in FIG. 36B.

As mentioned above, the semiconductive protection layer 610 may include silicon, such that the oxidation layer 620 includes SiOx, where the silicon atoms of the SiOx may form 1+ to 4+ charge states, depending on the flow rate of the oxygen-containing gases. Furthermore, as shown in FIGS. 36B and 37B, the germanium atoms 910a are oxidized to be GeOx in the oxidation layer 620. That is, the oxidization layer 620 includes SiOx and GeOx.

As mentioned above, the processing temperature of the oxidation process OX5 can be adjusted/tuned such that the oxidation reacts mainly on the surface 611 of the semiconductive protection layer 610, or on the outmost single layer of the semiconductive protection layer 610. As such, almost all of the germanium atoms 910a on the surface 611 can be oxidized.

Reference is made to FIGS. 38A-38B, where FIG. 38B is an enlarge view of the area S in FIG. 38A. An annealing process AN5 is performed on the oxidation layer 620 to evaporate the germaniums in the oxidation layer 620, and the remaining oxidation layer is oxidation layer 625. In some embodiments, the structure in FIG. 37A may undergo an annealing process AN5 in the annealing apparatus 840 of the fabrication tool 800 shown in FIG. 44. The annealing process AN5 may be similar to the annealing process AN1 shown in FIG. 46, and, therefore, a description in this regard will not be repeated hereinafter.

Reference is made to FIGS. 37B and 38B. During the annealing process AN5 shown in FIGS. 38A and 46, Ge—O bonds are broken such that germanium atoms are escaped from the oxidation layer 620. The oxygens with the broken bonds may migrate to Si region and may be reconnected to Si or SiOx to form the oxidation layer 625. Therefore, an amount of GeOx in the oxidation layer 625 is reduced while an amount of SiOx in the oxidation layer 625 is increased. As mentioned above, since the processing temperature (or annealing temperature) of the annealing process AN5 is lower than a temperature that breaks Si—O bonds, none or rarely Si—O bonds is broken during the annealing process AN5. As such, the oxidation layer 625 includes mainly SiOx and is substantially free from GeOx.

Further, the annealing temperature triggers the diffusion of the germanium atoms 910b, such that the germanium atoms 910b in the semiconductive protection layer 610 diffuse to the top surface of the semiconductive protection layer 610 as shown in FIG. 38B.

Figure 39B:
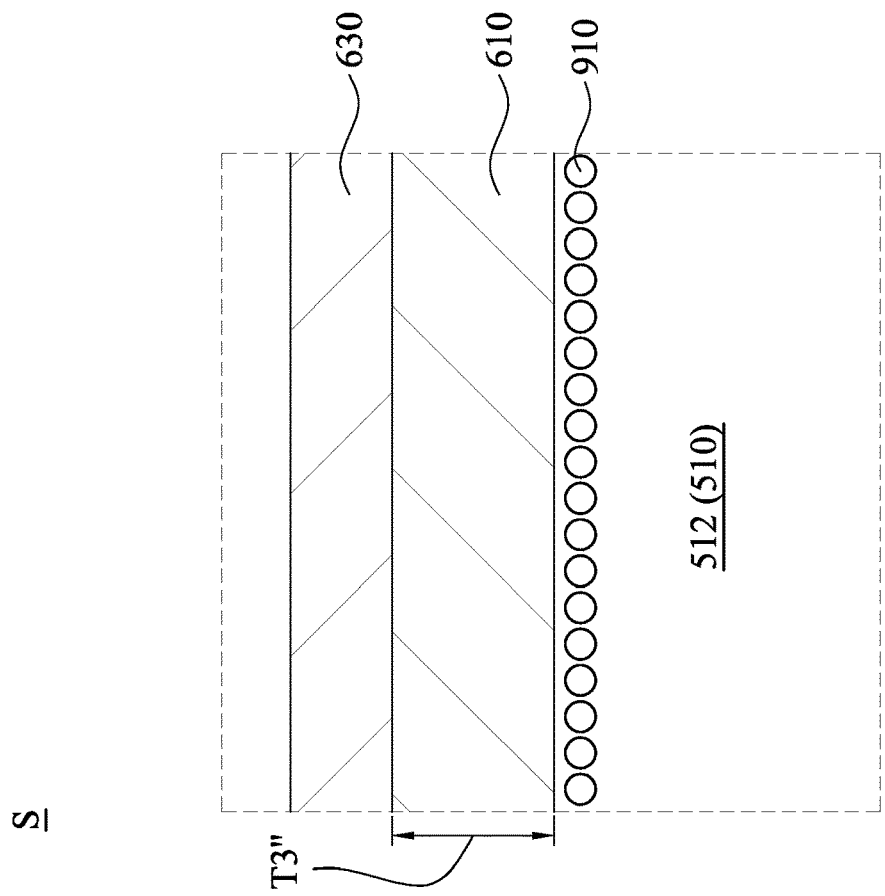
Figure 39A:
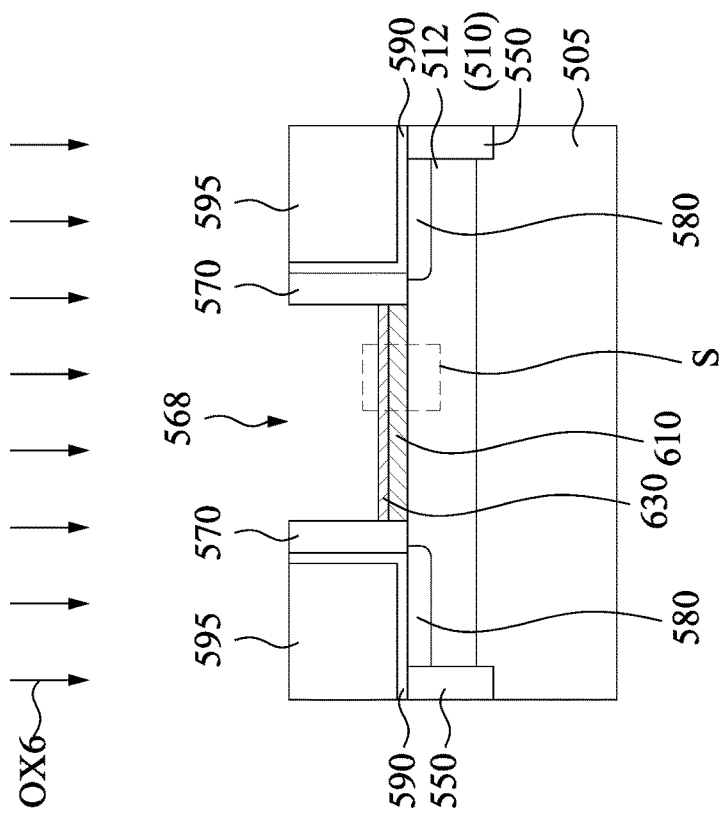

Reference is made to FIGS. 39A-39B, where FIG. 39B is an enlarge view of the area S in FIG. 39A. Another oxidation process OX6 is optionally performed on the semiconductive protection layers 610, such that the oxidation layer 625 is thicken to be an oxidation layer 630. In some embodiments, the structure in FIG. 38A may undergo an oxidation process OX6 in the oxidation apparatus 830 of the fabrication tool 800 shown in FIG. 44 to form the oxidation layer 630. The oxidation process OX6 may be similar to the oxidation process OX1 shown in FIG. 45, and, therefore, a description in this regard will not be repeated hereinafter.

Reference is made to FIGS. 38B and 39B. During the oxidation process OX6 shown in FIGS. 39A and 45, the oxidation layer 630 is formed on the outer surface of the semiconductive protection layer 610. Since portions of the semiconductive protection layer 610 are oxidized, the remaining semiconductive protection layer 610 has a thickness T3" smaller than the thickness T3' shown in FIG. 37B. The semiconductive protection layer 610 may also be a substantially pure silicon layer, for example, with a germanium atomic percentage lower than about 20 percent, such that the semiconductive protection layer 610 is substantially free of germanium.

As mentioned above, the oxidation layer 625 mainly includes SiOx. Further, the germanium atoms 910*b* diffuse to the top surface 611 of the semiconductive protection layer 610, such that the oxidation process OX6 oxidizes the germanium atoms 910*b* to be GeOx in the oxidation layer 630. That is, the oxidization layer 620 includes a large amount of SiOx and a small amount of GeOx.

The processing temperature of the oxidation process OX6 can be adjusted/tuned such that the oxidation reacts mainly on the surface 611 of the semiconductive protection layer 610, or on the outmost single layer of the semiconductive protection layer 610. As such, almost all of the germanium atoms 910*b* on the surface 611 can be oxidized. Also, the processing temperature of the oxidation process OX6 is lower than about 500° C. such that the diffusion of germanium atoms 910 can be suppressed.

Figure 40B:
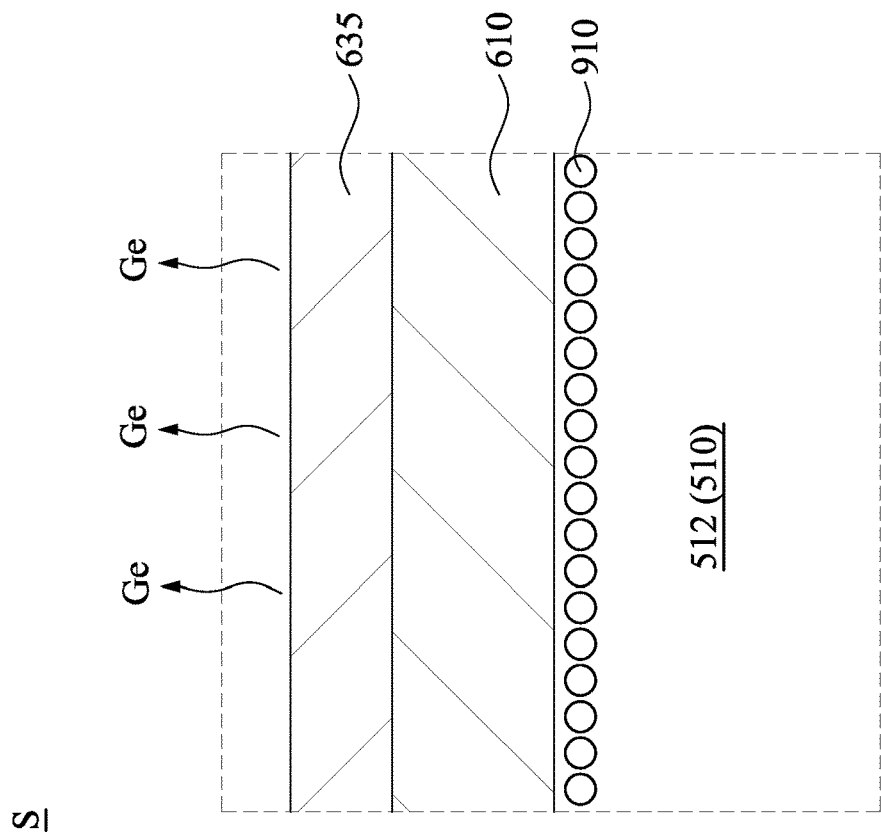
Figure 40A:
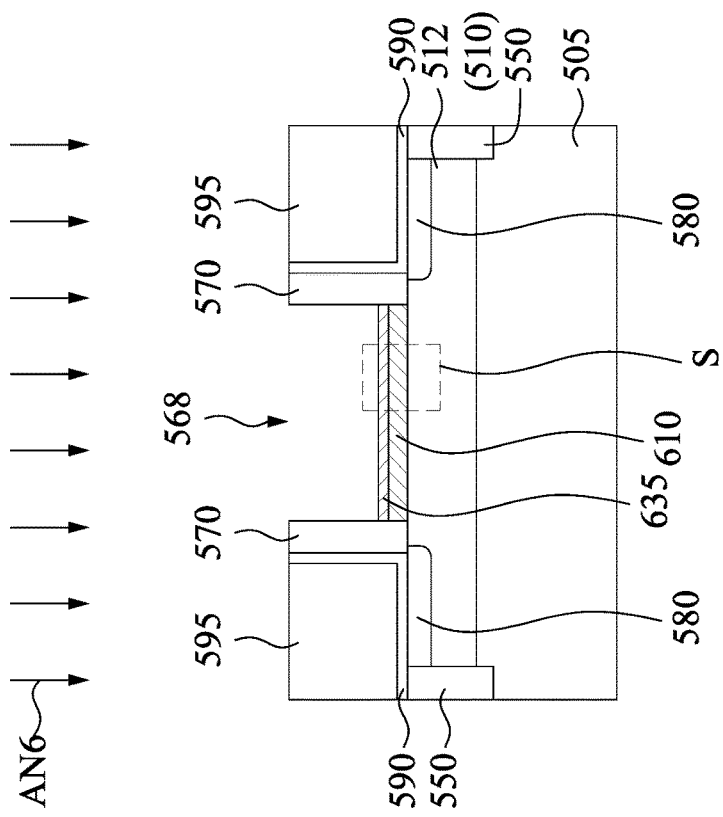

Reference is made to FIGS. 40A-40B, where FIG. 40B is an enlarge view of the area S in FIG. 40A. Another annealing process AN6 is optionally performed on the oxidation layer 630 to evaporate the germaniums in the oxidation layer 630, and the remaining oxidation layer is oxidation layer 635. In some embodiments, the structure in FIG. 40A may undergo the annealing process AN6 in the annealing apparatus 840 of the fabrication tool 800 shown in FIG. 44. The annealing process AN6 may be similar to the annealing process AN1 shown in FIG. 46, and, therefore, a description in this regard will not be repeated hereinafter.

During the annealing process AN6 shown in FIGS. 40A and 46, Ge—O bonds are broken such that germanium atoms are escaped from the oxidation layer 630. The oxygens with the broken bonds may migrate to Si region and may be reconnected to Si or SiOx to form the oxidation layer 635. Therefore, an amount of GeOx in the oxidation layer 635 is reduced while an amount of SiOx in the oxidation layer 635 is increased. As mentioned above, since the processing temperature (or annealing temperature) of the annealing process AN6 is lower than a temperature that breaks Si—O bonds, none or rarely Si—O bonds is broken during the annealing process AN6. As such, the oxidation layer 635 includes mainly SiOx and is substantially free from GeOx.

One of the oxidation processes (such as the oxidation processes OX5 and OX6) and one of the annealing processes (such as the annealing processes AN5 and AN6) can be referred to as a Ge-removal cycle, and this Ge-removal cycle can be repeated many times to remove the germanium atoms in the semiconductive protection layer 610. For example, the wafer including the structure of FIG. 36A undergoes two Ge-removal cycles (FIGS. 37A-40B). In some other embodiments, more than two Ge-removal cycles can be perform to purify the silicon components in the semiconductive protection layer 610.

Figure 41:
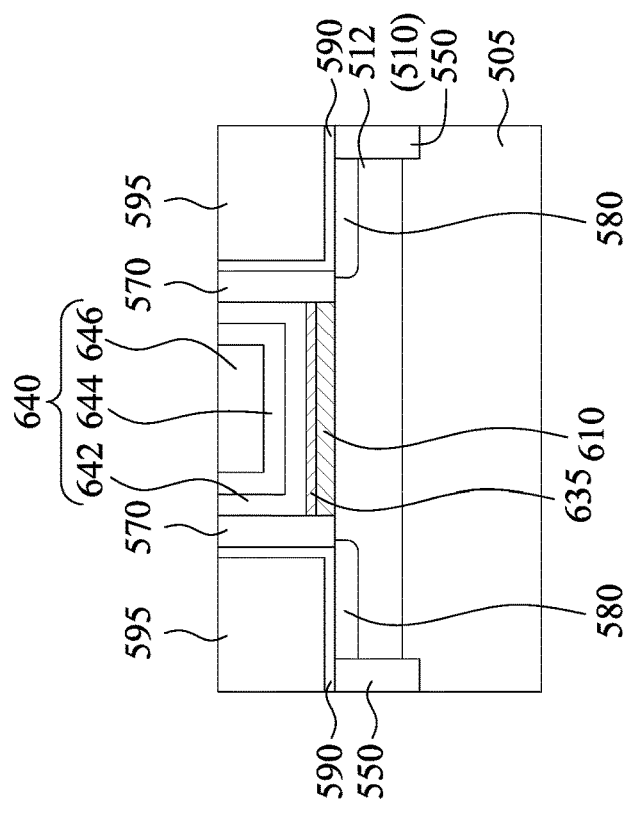

Reference is made to FIG. 41. A gate dielectric layer 642 is conformally formed in the gate trench 568 and above the oxidation layer 635. The manufacturing processes and/or materials of the gate dielectric layer 642 are similar to or the same as the gate dielectric layer 242 shown in FIG. 13. Therefore, a description in this regard will not be repeated hereinafter.

A gate electrode GE is formed above the gate dielectric layer 642 and fills the gate trench 568. In some embodiments, the gate electrode GE include at least one work function metal layer(s) 644, a fill layer 646, and/or other suitable layers that are desirable in a metal gate stack. The manufacturing processes and/or materials of the gate electrode GE are similar to or the same as the gate electrode GE shown in FIG. 13. Therefore, a description in this regard will not be repeated hereinafter.

Figure 42:
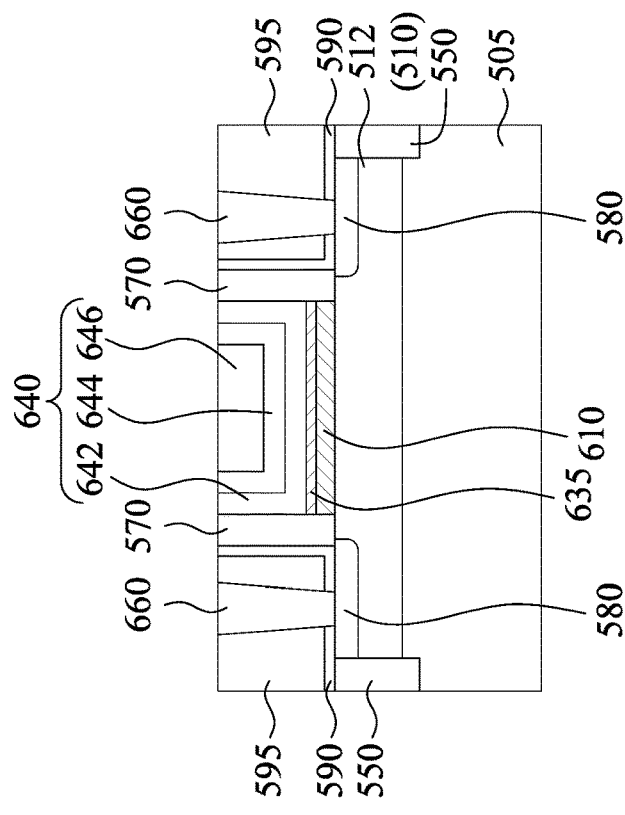

Reference is made to FIG. 42. The ILD 595 is patterned to form trenches 597 on opposite sides of the gate structure 600, and then the CESL 590 is patterned to expose the source/drain regions 580. Contacts 660 are formed in the trenches 597. As such, the contacts 660 are respectively in contact with the source/drain regions 680. The manufacturing processes and/or materials of the contacts 660 are similar to or the same as the contacts 260 shown in FIGS. 14A-14C, and, therefore, a description in this regard will not be repeated hereinafter.

In FIG. 42, the semiconductor device includes the active region 512, the semiconductive protection layers 610, the oxidation layers 620, the gate structure 640, and the source/drain structures 580. The active region 512 includes germanium. That is, the active region 512 is a germanium-containing layer. In some other embodiments, a germanium concentration of the active region 512 is higher than a germanium concentration of the substrate 505. In some embodiments, single germanium layer (more or less) is formed near the top surface of the active region 512. That is, the top surface of the active region 512 has the highest germanium concentration among the active region 512.

The semiconductive protection layer 610 is over a channel portion of the active region 512. The active region 512 is thicker than the semiconductive protection layers 610. The semiconductive protection layer 610 may be a germanium-free layer, such as a silicon layer. That is, a germanium concentration in the semiconductive protection layer 610 is lower than a germanium concentration in the active region 512. As mentioned above, the oxidation process is performed to remove germanium atoms in the semiconductive protection layer 610, such that the silicon components of the semiconductive protection layer 610 can be purified. Further, the annealing process is performed to remove germanium atoms in the oxidation layer 635, such that the oxidation layer 635 includes (mainly) SiOx, and may be germanium-free. In some embodiments, the semiconductive (Si) protection layer 610 has the thickness T3" (see FIG. 39B) in a range of about 1 angstrom to about 27 angstroms.

Figure 43:
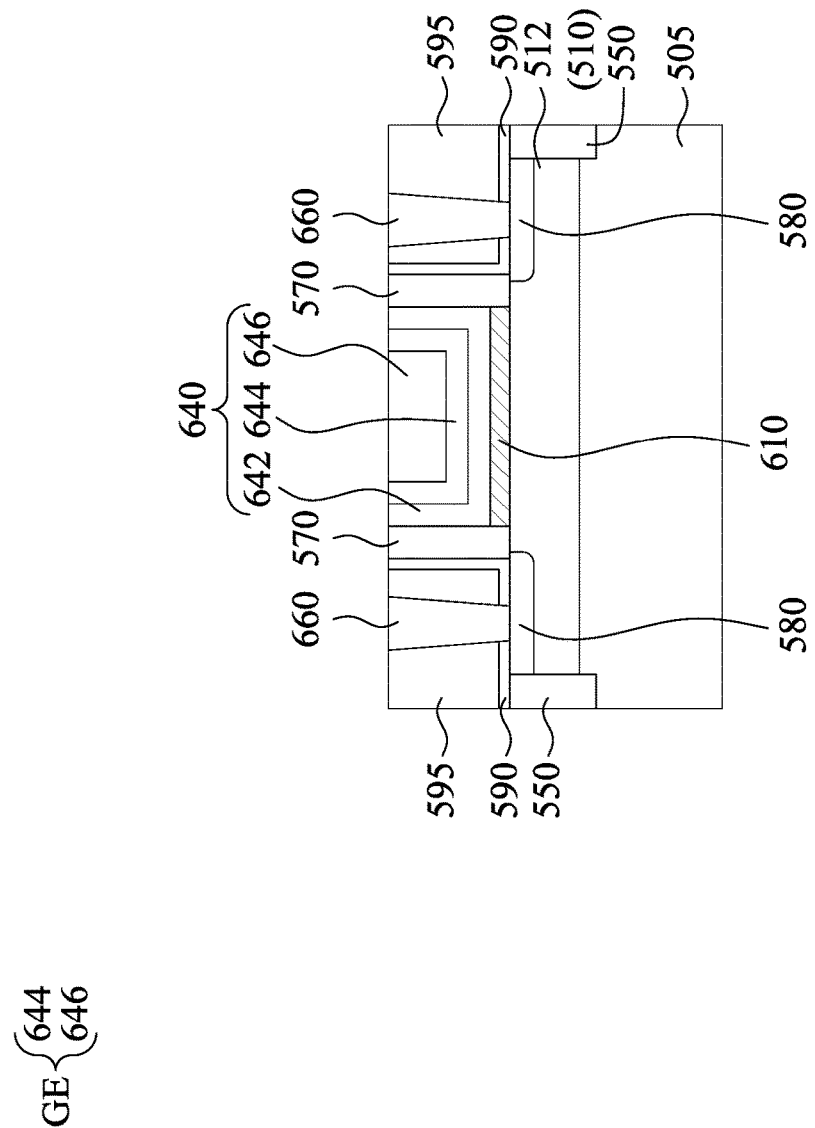
FIG. 43 is a cross-sectional view of a semiconductor device according to some embodiments.

FIG. 43 is a cross-sectional view of a semiconductor device according to some embodiments. The difference between the semiconductor device of FIG. 43 and the semiconductor device of FIG. 42 pertains to the oxidation layer 635. In FIG. 43, the oxidation layer 635 (see FIG. 42) is removed prior to the formation of the gate structure 640. As such, the gate dielectric layer 642 of the gate structure 640 is in contact with the semiconductive protection layer 610. Other relevant structural/fabrication details of the semiconductor device of FIG. 43 are all the same as or similar to the semiconductor device of FIG. 42, and, therefore, a description in this regard will not be repeated hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the formation of the semiconductive protection layer reduces the interface and bulk traps in the high-k gate dielectric layer and germanium-containing channel, thereby achieving high-speed and low-power devices. Another advantage is that the oxidation processes removes the germanium atoms in the semiconductive protection layer, purifying the silicon components in the semiconductive protection layer. In addition, the annealing process removes GeOx in the oxidation layer, improving device reliability. With such configuration, a thin and Ge-free semiconductive protection layer can be formed to obtain a high electron mobility of Ge-channel devices.

According to some embodiments, a method includes forming a semiconductive channel layer on a substrate. A dummy gate is formed on the semiconductive channel layer. Gate spacers are formed on opposite sides of the dummy gate. The dummy gate is removed to form a gate trench between the gate spacers, resulting in the semiconductive channel layer exposed in the gate trench. A semiconductive protection layer is deposited in the gate trench and on the exposed semiconductive channel layer. A top portion of the semiconductive protection layer is oxidized to form an oxidation layer over a remaining portion of the semiconductive protection layer. The oxidation layer is annealed after the top portion of the semiconductive protection layer is oxidized. A gate structure is formed over the semiconductive protection layer and in the gate trench after the oxidation layer is annealed.

According to some embodiments, a method includes depositing a Ge-containing channel layer over a substrate. A semiconductive protection layer is deposited over the Ge-containing channel layer. A germanium atomic percentage of the semiconductive protection layer is lower than a germanium atomic percentage of the Ge-containing channel layer. An oxidation process is performed on the semiconductive protection layer at a first temperature to form germanium oxide in a top portion of the semiconductive protection layer. The germanium oxide is removed at a second temperature higher than the first temperature. A gate structure is formed over the semiconductive protection layer after removing the germanium oxide.

According to some embodiments, a method includes depositing a channel layer over a substrate. A semiconductive protection layer is deposited over the channel layer. A germanium atomic percentage of the channel layer is higher than a germanium atomic percentage of the semiconductive protection layer. An oxidation process is performed to the semiconductive protection layer in an oxygen-containing environment. An annealing process is performed to the semiconductive protection layer after performing the oxidation process in an oxygen-free environment. The oxidation process and the annealing process are repeatedly performed. A gate structure is formed over the semiconductive protection layer after repeatedly performing the oxidation process and performing the annealing process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a semiconductive channel layer on a substrate;
   forming a dummy gate on the semiconductive channel layer;
   forming gate spacers on opposite sides of the dummy gate;
   removing the dummy gate to form a gate trench between the gate spacers, resulting in the semiconductive channel layer exposed in the gate trench;
   depositing a semiconductive protection layer in the gate trench and on the semiconductive channel layer;
   oxidizing a top portion of the semiconductive protection layer to form an oxidation layer over a remaining portion of the semiconductive protection layer;
   after oxidizing the top portion of the semiconductive protection layer, annealing the oxidation layer; and
   after annealing the oxidation layer, forming a gate structure over the semiconductive protection layer and in the gate trench.

2. The method of claim 1, further comprising removing the oxidation layer after annealing the oxidation layer and prior to forming the gate structure.

3. The method of claim 1, wherein the semiconductive protection layer is substantially free of germanium.

4. The method of claim 1, wherein the semiconductive channel layer comprises germanium.

5. The method of claim 1, wherein oxidizing the top portion of the semiconductive protection layer and annealing the oxidation layer are performed with no vacuum break therebetween.

6. The method of claim 1, wherein oxidizing the top portion of the semiconductive protection layer comprises:
   providing oxygen-containing gases onto the semiconductive protection layer; and
   adjusting a flow rate of the oxygen-containing gases.

7. The method of claim 1, wherein annealing the oxidation layer is such that an amount of GeOx in the oxidation layer is reduced while an amount of SiOx in the oxidation layer is increased.

8. The method of claim 1, wherein annealing the oxidation layer is performed in a vacuum environment.

9. A method comprising:
   depositing a Ge-containing channel layer over a substrate;
   depositing a semiconductive protection layer over the Ge-containing channel layer, wherein a germanium atomic percentage of the semiconductive protection layer is lower than a germanium atomic percentage of the Ge-containing channel layer;
   performing an oxidation process on the semiconductive protection layer at a first temperature to form germanium oxide in a top portion of the semiconductive protection layer;
   removing the germanium oxide at a second temperature higher than the first temperature; and
   forming a gate structure over the semiconductive protection layer after removing the germanium oxide.

10. The method of claim 9, wherein the second temperature is lower than a temperature that breaks Si—O bonds.

11. The method of claim 9, wherein the semiconductive protection layer has a thickness in a range of about 1 angstrom to about 30 angstrom.

12. The method of claim 9, wherein the first temperature is room temperature.

13. The method of claim 9, wherein a germanium atomic percentage of the semiconductive protection layer is lower than about 20 percent.

14. The method of claim 9, wherein the Ge-containing channel layer is thicker than the semiconductive protection layer.

15. A method comprising:
depositing a channel layer over a substrate;
depositing a semiconductive protection layer over the channel layer, wherein a germanium atomic percentage of the channel layer is higher than a germanium atomic percentage of the semiconductive protection layer;
performing an oxidation process to the semiconductive protection layer in an oxygen-containing environment;
performing an annealing process to the semiconductive protection layer after performing the oxidation process in an oxygen-free environment;
repeatedly performing the oxidation process and performing the annealing process; and
forming a gate structure over the semiconductive protection layer after repeatedly performing the oxidation process and performing the annealing process.

16. The method of claim 15, wherein the annealing process is performed in a vacuum environment.

17. The method of claim 15, wherein an annealing temperature of the annealing process is in a range of about 100° C. to about 1000° C.

18. The method of claim 15, wherein the oxygen-containing environment comprises pure oxygen gases.

19. The method of claim 18, wherein a flow rate of the pure oxygen gases is in a range of about 1 langmuir to about 1000 langmuir.

20. The method of claim 15, further comprising:
removing an oxidation layer on the semiconductive protection layer prior the forming the gate structure, wherein the oxidation layer is formed during the oxidation process.

* * * * *